(12) United States Patent
Ito et al.

(10) Patent No.: US 11,557,671 B2
(45) Date of Patent: Jan. 17, 2023

(54) SEMICONDUCTOR DEVICE HAVING TRENCH GATE ELECTRODES FORMED IN FIRST PILLARS INCLUDING SOURCE LAYERS FORMED IN THE FIRST PILLARS BEING DEEPER INTO THE SUBSTRATE THAN FIRST SOURCE LAYERS IN SECOND PILLARS

(71) Applicant: Mitsubishi Electric Corporation, Tokyo (JP)

(72) Inventors: Masanao Ito, Tokyo (JP); Masayuki Furuhashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 129 days.

(21) Appl. No.: 17/269,254

(22) PCT Filed: Oct. 25, 2018

(86) PCT No.: PCT/JP2018/039701
§ 371 (c)(1),
(2) Date: Feb. 18, 2021

(87) PCT Pub. No.: WO2020/084736
PCT Pub. Date: Apr. 30, 2020

(65) Prior Publication Data
US 2021/0167204 A1    Jun. 3, 2021

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0634* (2013.01); *H01L 29/1608* (2013.01); *H01L 29/66734* (2013.01); *H02M 3/158* (2013.01)

(58) Field of Classification Search
CPC ............ H01L 29/0634; H01L 29/1608; H01L 29/6674; H01L 29/7813
See application file for complete search history.

(56) References Cited

U.S. PATENT DOCUMENTS

| 2012/0012929 A1 | 1/2012 | Saito et al. |
| 2019/0057873 A1 | 2/2019 | Sugahara et al. |
| 2020/0235203 A1 | 7/2020 | Furuhashi et al. |

FOREIGN PATENT DOCUMENTS

| JP | 2006-313892 A | 11/2006 |
| JP | 2012-23272 A | 2/2012 |

(Continued)

OTHER PUBLICATIONS

International Search Report and Written Opinion dated Jan. 22, 2019, received for PCT Application PCT/JP2018/039701, Filed on Oct. 25, 2018, 11 pages including English Translation.

*Primary Examiner* — Anh D Mai
(74) *Attorney, Agent, or Firm* — Xsensus LLP

(57) ABSTRACT

A semiconductor device of the present invention includes a semiconductor region having a first main surface, wherein the semiconductor region includes: alternating n-type pillar layers and p-type pillar layers along the first main surface; a p-type first well layer located within each of the n-type pillar layers at a top surface of the n-type pillar layer; an n-type first source layer located within the first well layer at a top surface of the first well layer; a first side surface dielectric layer located on a side surface in a first trench located at each of boundaries between the n-type pillar layers and the p-type pillar layers, and being in contact with the first well layer and the first source layer; a first bottom surface dielectric layer located on a bottom surface in the first trench, and being at least partially in contact with one of the p-type pillar layers.

19 Claims, 35 Drawing Sheets

(51) Int. Cl.
*H01L 29/16* (2006.01)
*H01L 29/66* (2006.01)
*H02M 3/158* (2006.01)

(56) References Cited

FOREIGN PATENT DOCUMENTS

JP 6377302 B1 8/2018
WO 2017/169086 A1 10/2017

F I G. 3 0
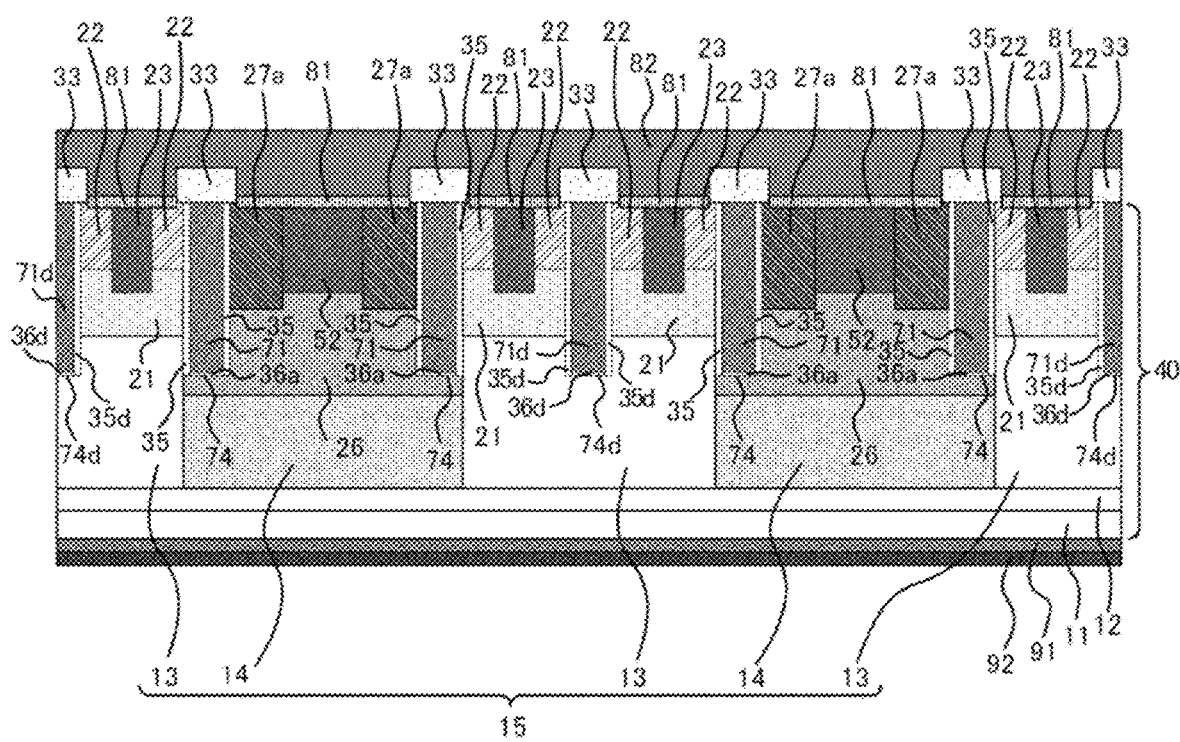

F I G. 3 8
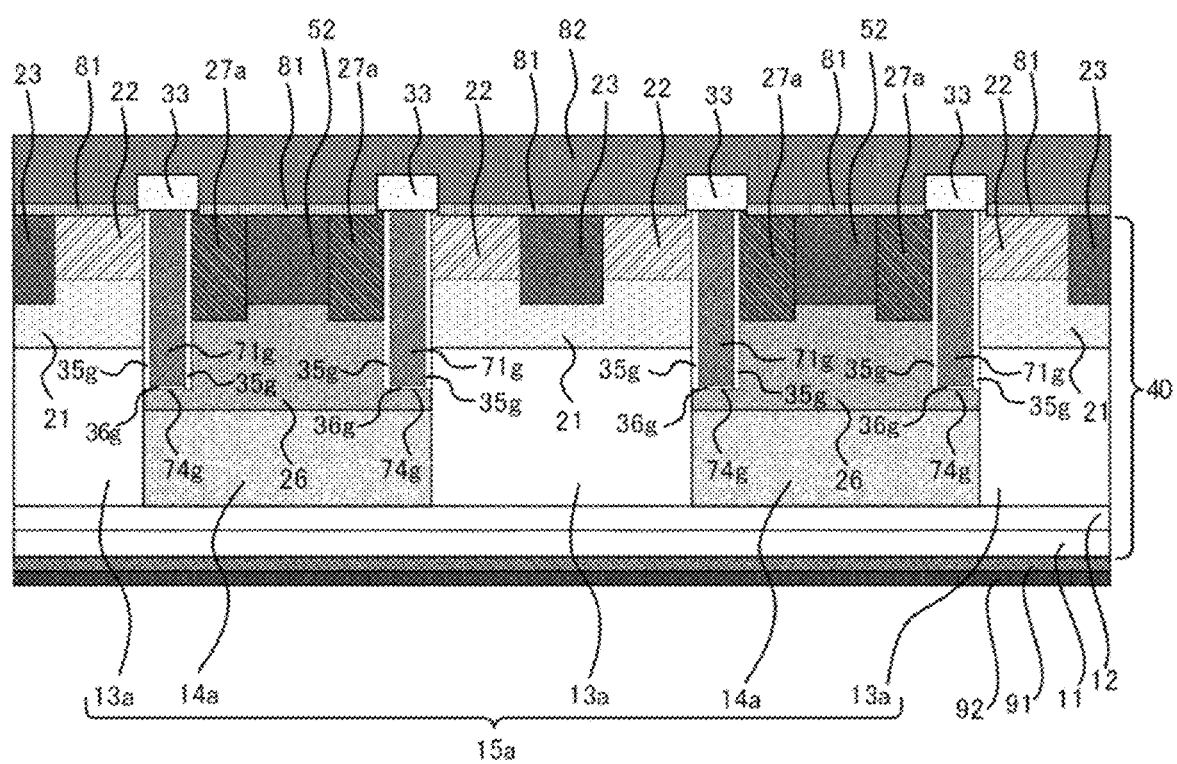

SEMICONDUCTOR DEVICE HAVING TRENCH GATE ELECTRODES FORMED IN FIRST PILLARS INCLUDING SOURCE LAYERS FORMED IN THE FIRST PILLARS BEING DEEPER INTO THE SUBSTRATE THAN FIRST SOURCE LAYERS IN SECOND PILLARS

CROSS-REFERENCE TO RELATED APPLICATION

The present application is based on PCT filing PCT/JP2018/039701, filed Oct. 25, 2018, the entire contents of which are incorporated herein by reference.

TECHNICAL FIELD

The present invention relates to semiconductor devices and power converters.

BACKGROUND ART

In the field of power electronics, a switching element such as a metal-oxide-semiconductor field-effect transistor (MOSFET) and an insulated-gate bipolar transistor (IGBT) is used to drive a load of a motor. Such a switching element is operated by being switched between a low resistance on state and a high resistance off state through input of a control signal. It is important for the switching element to have a high breakdown voltage in the off state as high voltage input is handled in a power electronics application. The high breakdown voltage is typically maintained by the spread of a depletion layer to a drift layer. A higher breakdown voltage can be obtained as the drift layer has a greater thickness, and a higher breakdown voltage can be obtained as the drift layer has a lower impurity concentration because the depletion layer becomes wider.

On the other hand, the switching element is required to have a low resistance in the on state to reduce conduction losses. The resistance of the drift layer is a resistive component of an on-resistance, and is desirably as low as possible. The resistance of the drift layer can be reduced by a decrease in thickness of the drift layer or an increase in impurity concentration of the drift layer. As described above, however, the high breakdown voltage cannot be obtained when the drift layer has a small thickness and a high impurity concentration. Thus, there is a trade-off between the breakdown voltage in the off state and the on-resistance in the on state.

As a structure to improve the trade-off between the breakdown voltage in the off state and the on-resistance in the on state, a super junction structure as disclosed in Patent Document 1 has been proposed. The super junction structure includes strip-shaped n-type pillar layers and strip-shaped p-type pillar layers alternating in a direction perpendicular to a direction of flow of a current while keeping a charge balance so that effective impurity amounts in the respective pillar layers are equal to each other. An effective impurity amount herein is the amount of impurity effectively acting as an acceptor in a p-type semiconductor, and is the amount of impurity effectively acting as a donor in an n-type semiconductor.

By using the super junction structure, the trade-off between the breakdown voltage in the off state and the on-resistance in the on state, which is a problem of a conventional switching element, can be improved. That is to say, a semiconductor device having the super junction structure can reduce the on-resistance while maintaining the breakdown voltage, and can improve the breakdown voltage while maintaining the on-resistance, for example, compared with the conventional switching element.

PRIOR ART DOCUMENT

Patent Document

Patent Document 1: Japanese Patent Application Laid-Open No. 2006-313892

SUMMARY

Problem to be Solved by the Invention

A bottom surface in a trench of a semiconductor element in Patent Document 1 is in contact with an n-type pillar layer. As a result, electrical breakdown might occur due to electric field concentration at the bottom of the trench.

It is an object of the present invention to ease electric field concentration at the bottom of a trench to solve the above-mentioned problem, and to thereby yield a highly reliable semiconductor device.

Means to Solve the Problem

A semiconductor device of the present invention is a semiconductor device including a semiconductor region having a first main surface and a second main surface opposite the first main surface, wherein the semiconductor region includes: alternating first pillar layers of a first conductivity type and second pillar layers of a second conductivity type along the first main surface; a first well layer of the second conductivity type located within each of the first pillar layers at a top surface of the first pillar layer; a first source layer of the first conductivity type located within the first well layer at a top surface of the first well layer; a first side surface dielectric layer located on a side surface in a first trench located at each of boundaries between the first pillar layers and the second pillar layers, the first side surface dielectric layer being in contact with the first well layer and the first source layer; a first bottom surface dielectric layer located on a bottom surface in the first trench, the first bottom surface dielectric layer being at least partially in contact with one of the second pillar layers; and a first gate electrode located in the first trench, facing the first well layer and the first source layer through the first side surface dielectric layer, and facing the second pillar layer through the first bottom surface dielectric layer, each of the second pillar layers includes a second source layer of the first conductivity type located within the second pillar layer at a top surface of the second pillar layer, the first side surface dielectric layer is located on opposite side surfaces in the first trench, and is in contact with a second-conductivity type region within the second pillar layer and the second source layer, the first bottom surface dielectric layer is in contact with the second-conductivity type region within the second pillar layer, and a bottom surface of the second source layer is closer to the second main surface than a bottom surface of the first source layer is.

Effects of the Invention

The semiconductor device of the present invention includes the first bottom surface dielectric layer located on the bottom surface in the first trench and the first gate electrode located in the first trench, facing the first well layer and the first source layer through the first side surface dielectric layer, and facing the second pillar layer through the first bottom surface dielectric layer. As a result, an electric field applied to the first bottom surface dielectric layer by the second pillar layer depleted in the off state of the semiconductor device is reduced. As a result, an effect of yielding a highly reliable semiconductor device can be produced.

BRIEF DESCRIPTION OF DRAWINGS

FIG. 30 is a cross-sectional view along the line J-J' of a semiconductor device in Embodiment 9 of the present invention.

FIG. 38 is a cross-sectional view along the line N-N' of a semiconductor device in Embodiment 12 of the present invention.

DESCRIPTION OF EMBODIMENTS

Embodiment 1

A configuration in the present embodiment will be described below with use of FIGS. 1 and 2. The present description is based on the assumption that a semiconductor device is a silicon carbide MOSFET, a first conductivity type is an n-type, and a second conductivity type is a p-type. The use of silicon carbide as a material for the semiconductor device allows for lower losses and a higher operational temperature.

Figure 1:
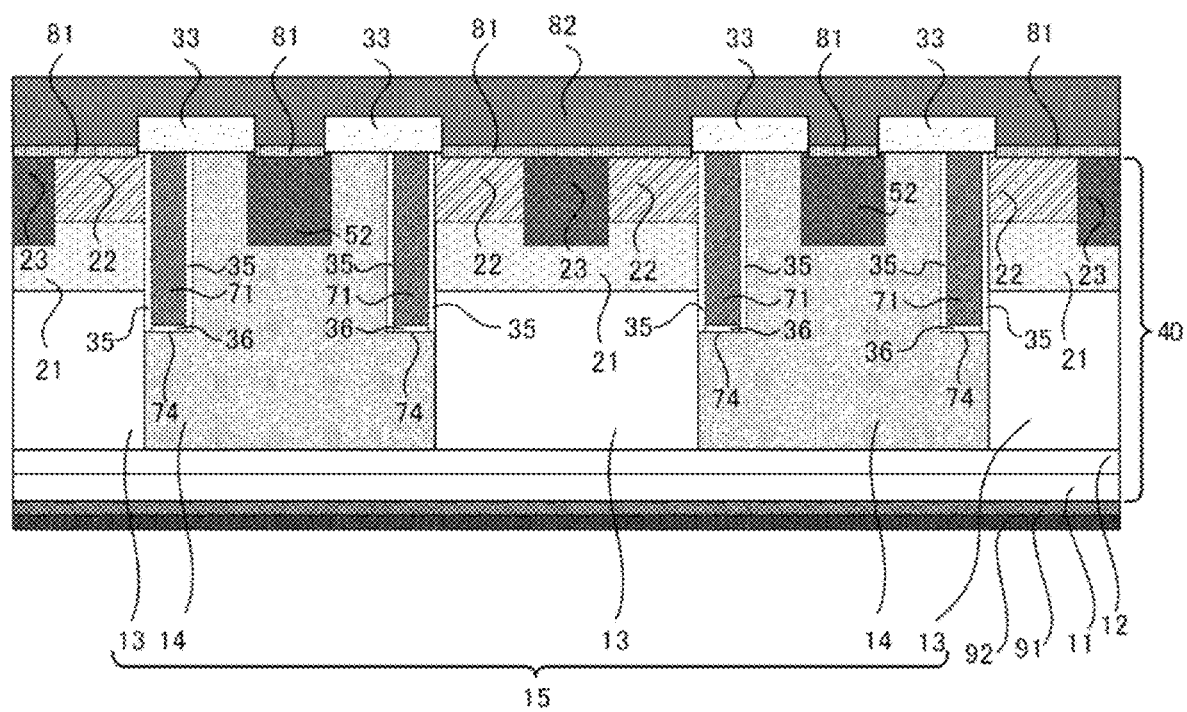
FIG. 1 is a cross-sectional view along the line A-A' of a semiconductor device in Embodiment 1 of the present invention.
Figure 2:
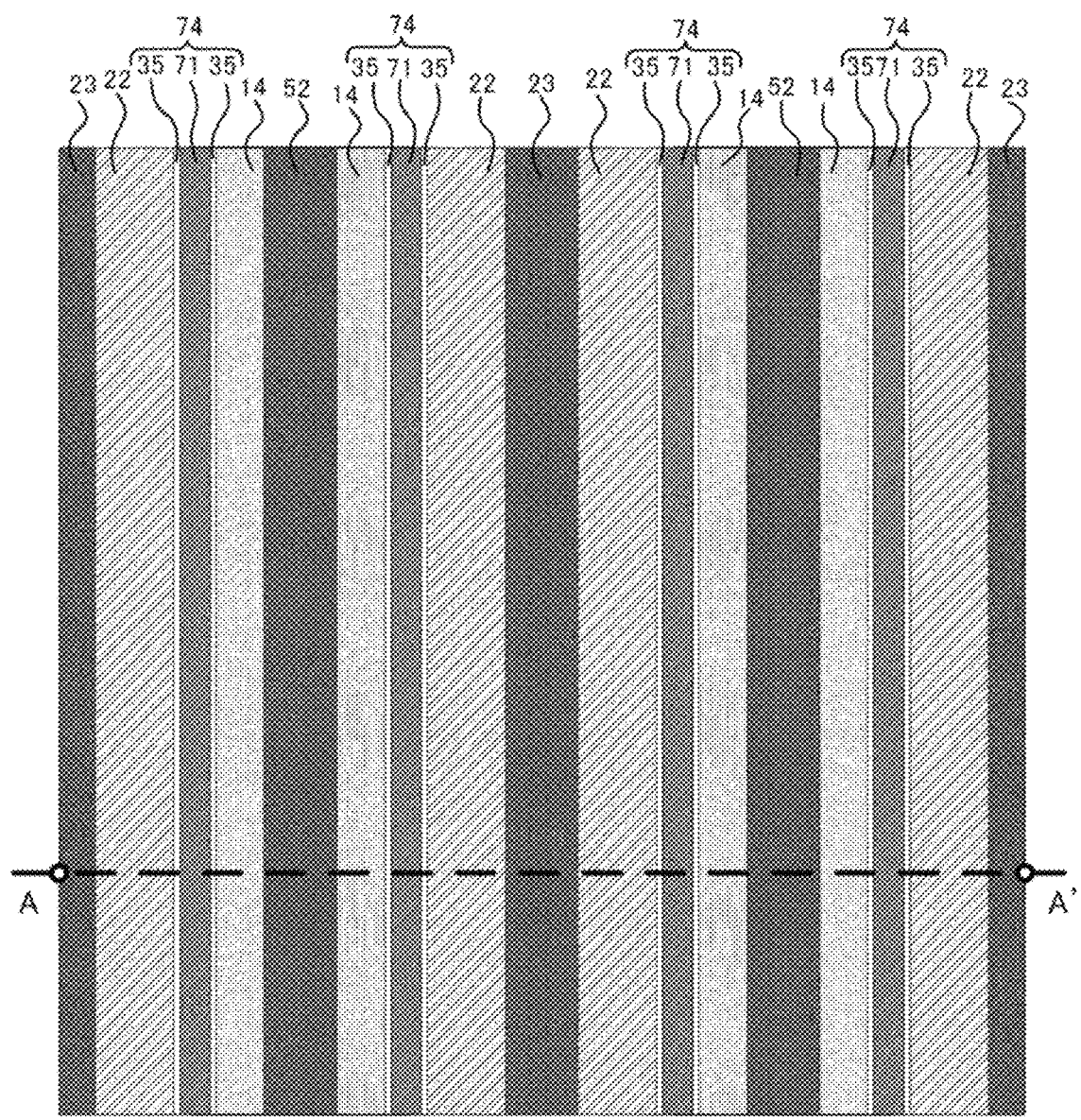
FIG. 2 is a plan view illustrating a top surface of a semiconductor region of the semiconductor device in Embodiment 1 of the present invention.

FIG. 1 is a cross-sectional view of a semiconductor device in the present embodiment along an auxiliary line A-A' of FIG. 2. FIG. 2 is a plan view illustrating a top surface of a semiconductor region of the semiconductor device in the present embodiment.

As illustrated in FIG. 1, the semiconductor device in the present embodiment includes a semiconductor region 40, interlayer dielectric layers 33, front surface ohmic electrodes 81, a source electrode 82, a back surface ohmic electrode 91, and a drain electrode 92. The semiconductor region 40 includes an n-type low resistance silicon carbide substrate 11 as a semiconductor substrate, an n-type epitaxial crystalline layer 12, and a super junction layer 15 including n-type pillar layers 13 as first pillar layers and p-type pillar layers 14 as second pillar layers. Each of the n-type pillar layers 13 includes a p-type first well layer 21, an n+-type first source layer 22, and a first p+-type layer 23. Each of the p-type pillar layers 14 includes a second p+-type layer 52.

The semiconductor region 40 has a first main surface and a second main surface. The first main surface is a surface of the semiconductor region 40 on a top side in the page of FIG. 1. The second main surface is a surface of the semiconductor region 40 on a bottom side in the page of FIG. 1. That is to say, the second main surface is located opposite the first main surface. The silicon carbide substrate 11 is of an n+-type. The silicon carbide substrate 11 is located within the semiconductor region 40 on the second main surface. A surface of the silicon carbide substrate 11 on a side of the first main surface is inclined at an off angle of 4° with respect to a (0001) plane in a [11-20] direction, for example. The polytype of the silicon carbide substrate 11 is 4H, for example. The n+-type means a higher impurity concentration than the n-type.

The n-type epitaxial crystalline layer 12 is formed on the top surface of the silicon carbide substrate 11. The epitaxial crystalline layer 12 is made of silicon carbide having an n-type impurity concentration of $1\times10^{13}$ cm$^{-3}$ to $1\times10^{18}$ cm$^{-3}$ and a thickness of 5 μm to 150 μm, for example.

The super junction layer 15 is located on a top surface of the epitaxial crystalline layer 12. The super junction layer 15 includes alternating strip-shaped n-type pillar layers 13 and strip-shaped p-type pillar layers 14 along the first main surface of the semiconductor region 40. A charge balance is kept so that an n-type effective impurity amount in a region of each of the n-type pillar layers 13 other than the first well layer 21, which will be described below, and a p-type effective amount in each of the p-type pillar layers 14 are equal to each other. As illustrated in FIG. 2, the n-type pillar layers 13 and the p-type pillar layers 14 are formed in stripes in plan view. That is to say, the super junction layer 15 has a striped shape in plan view.

The p-type first well layer 21 is selectively located within each of the n-type pillar layers 13 at a top surface of the n-type pillar layer 13. First well layers 21 are formed in stripes in plan view. Aluminum (Al) is used as a p-type impurity. The n+-type first source layer 22 is selectively located within the first well layer 21 at a top surface of the first well layer 21. As illustrated in FIG. 2, first source layers 22 are formed in stripes in plan view in the present embodiment. Nitrogen (N) is used as an n-type impurity.

The first well layer 21 has a depth of approximately 0.5 μm to 3 μm, for example. The first well layer 21 has a higher impurity concentration than the epitaxial crystalline layer 12, and has an impurity concentration in a range of $1\times10^{17}$ cm$^{-3}$ to $1\times10^{19}$ cm$^{-3}$, for example. The first source layer 22 has an impurity concentration in a range of $1\times10^{18}$ cm$^{-3}$ to $1\times10^{21}$ cm$^{-3}$, for example, and the ion-implanted n-type impurity has a concentration exceeding the concentration of the p-type impurity of the first well layer 21.

First trenches 74 are located at boundaries between the n-type pillar layers 13 and the p-type pillar layers 14. Each of the first trenches 74 has a side surface and a bottom surface. The first trench 74 as a whole is within the p-type pillar layer 14. The bottom surface of the first trench 74 is at a deeper location than the first well layer 21. As illustrated in FIG. 2, the first trenches 74 are formed in stripes in plan view. As illustrated in FIG. 1, the side surface of each of the first trenches 74 is perpendicular to the silicon carbide substrate 11, and the bottom surface of the first trench 74 is parallel to the silicon carbide substrate 11. However, the side surface of the first trench 74 may not necessarily be perpendicular to the silicon carbide substrate 11. The bottom surface of the first trench 74 may not necessarily be parallel to the silicon carbide substrate 11.

A first side surface dielectric layer 35 made of silicon dioxide is formed on the side surface of the first trench 74 as a whole. A first bottom surface dielectric layer 36 made of silicon dioxide is formed on the bottom surface of the first trench 74 as a whole. The first side surface dielectric layer 35 is located to be in contact with the first well layer 21 and the first source layer 22. The first bottom surface dielectric layer 36 is located to be in contact with the p-type pillar layer 14. First gate electrodes 71 are located in the first trenches 74. Each of the first gate electrodes 71 faces the first well layer 21 and the first source layer 22 through the first side surface dielectric layer 35. The first gate electrode 71 faces the p-type pillar layer 14 through the first bottom surface dielectric layer 36. Doped polysilicon is used as a material for the first gate electrodes 71, for example.

As illustrated in FIG. 1, the first p+-type layer 23 is formed in a region of a top portion of the first well layer 21 not being in contact with the first side surface dielectric layer 35. The first p+-type layer 23 is in contact with the first well layer 21. The p+-type means a higher impurity concentration than the p-type. As illustrated in FIG. 2, first p+-type layers 23 are formed in stripes in plan view.

As illustrated in FIG. 1, the second p+-type layer 52 is formed in a region of a top portion of the p-type pillar layer 14 not being in contact with the first side surface dielectric layer 35. As illustrated in FIG. 2, second p+-type layers 52 are formed in stripes in plan view.

The first p+-type layers 23 are located for better electrical contact between the first well layers 21 and the front surface ohmic electrodes 81, which will be described below. The second p+-type layers 52 are located for better electrical contact between the p-type pillar layers 14 and the front surface ohmic electrodes 81, which will be described below. Each of the first p+-type layers 23 and the second p+-type layers 52 desirably has a higher impurity concentration than the first well layer 21, and have an impurity concentration in a range of $1\times10^{19}$ cm$^{-3}$ to $1\times10^{21}$ cm$^{-3}$, for example. This is because each of the first p+-type layers 23 and the second p+-type layers 52 desirably has a low resistance.

As illustrated in FIG. 1, the front surface ohmic electrodes 81 are located on the first source layer 22, the first p+-type layer 23, and the second p+-type layer 52. Furthermore, the source electrode 82 is located on the front surface ohmic electrodes 81. The source electrode 82 is electrically connected to the first source layer 22, the first p+-type layer 23, and the second p+-type layer 52 through the front surface ohmic electrodes 81. The front surface ohmic electrodes 81 reduce a contact resistance between the source electrode 82 and the first source layer 22, the first p+-type layer 23, and the second p+-type layer 52.

As illustrated in FIG. 1, the interlayer dielectric layers 33 are located between the source electrode 82 and the first gate electrodes 71 and between the source electrode 82 and the p-type pillar layers 14. The first gate electrodes 71 and the source electrode 82 are electrically insulated from each other by the interlayer dielectric layers 33.

According to FIG. 1, a region of each of the interlayer dielectric layers 33 is located on a top surface of the first source layer 22. The region of each of the interlayer dielectric layers 33, however, may not be located on the top surface of the first source layer 22. A portion of each of the interlayer dielectric layers 33 may be or may not be located on a top surface of the second p+-type layer 52.

As illustrated in FIG. 1, the drain electrode 92 is formed on a side of the second main surface of the semiconductor region 40 through the back surface ohmic electrode 91. Gold or other metals or a stack thereof is used for the drain electrode 92.

Figure 3:
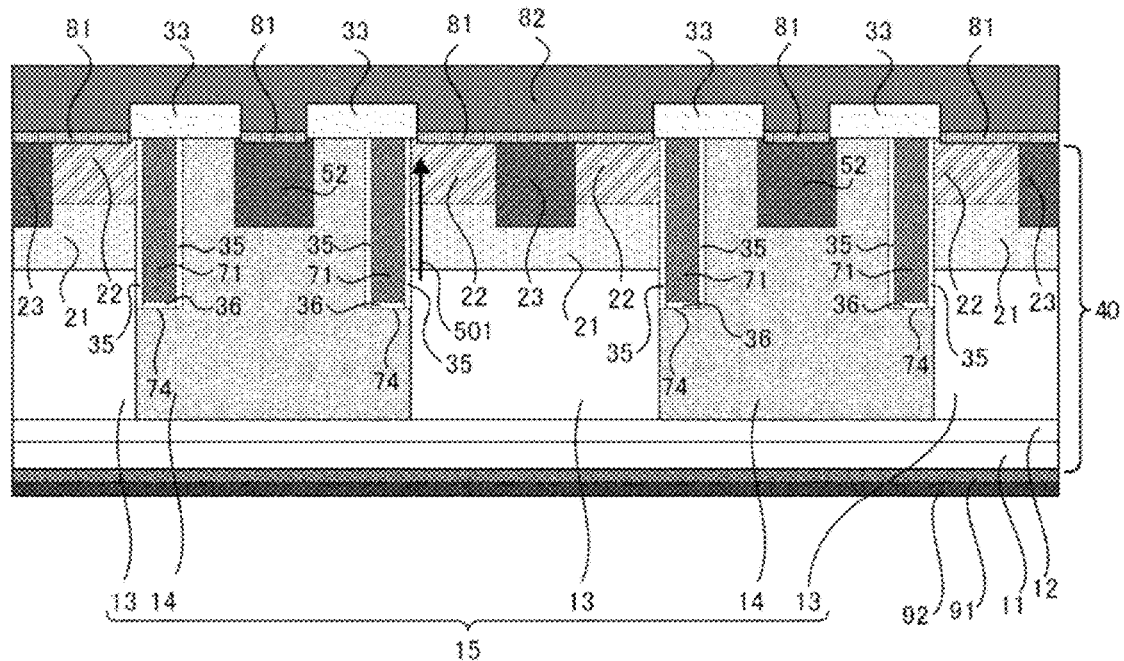
FIG. 3 is a cross-sectional view along the line A-A' showing operation of the semiconductor device in Embodiment 1 of the present invention.

Operation of the semiconductor device in the present embodiment will be described next. FIG. 3 is a cross-sectional view along the line A-A' showing operation of the semiconductor device in the present embodiment. When a voltage higher than a particular voltage value (first threshold voltage) is applied to each of the first gate electrodes 71, a channel is formed in a region within the first well layer 21 being in contact with the first side surface dielectric layer 35. As a result, the resistance between the drain electrode 92 and the source electrode 82 has a lower value, and, through application of a positive voltage to the drain electrode 92, a current flows between the drain electrode 92 and the source electrode 82 in a direction of an arrow 501 (an on state).

On the other hand, the above-mentioned channel disappears when a voltage lower than the first threshold voltage is applied to each of the first gate electrodes 71. As a result, the resistance between the drain electrode 92 and the source electrode 82 of the semiconductor device has a higher value, and very little current flows (an off state).

A method of manufacturing the semiconductor device in the present embodiment will be described next. FIGS. 4 to 12 illustrate the method of manufacturing the semiconductor device in the present embodiment. Herein, there are mainly two types of a method of forming a super junction structure, a multi-epitaxial scheme and a trench fill scheme. The multi-epitaxial scheme is a scheme of repeating epitaxial growth of an n-type semiconductor layer and ion implantation of the p-type impurity. In the super junction structure, an increase in depth of the p-type pillar layers is effective in improvement of a breakdown voltage. In the multi-epitaxial scheme, the number of repetitions is determined by the depth into which ions can be implanted. In a case where a super junction layer having a depth of 10 μm is formed when ions can be implanted into a depth of 1 μm, for example, it is required to repeat epitaxial growth and ion implantation ten times.

On the other hand, the trench fill scheme is a scheme of, after a semiconductor layer of n-type conductivity is epitaxially grown to have a required thickness of the super junction layer, forming trenches by anisotropic etching, and then embedding semiconductor layers of p-type conductivity in the trenches through epitaxial growth. The trench fill scheme has fewer process steps than the above-mentioned multi-epitaxial scheme. The semiconductor device manufacturing method described in the present embodiment is the manufacturing method using the trench fill scheme.

Figure 4:
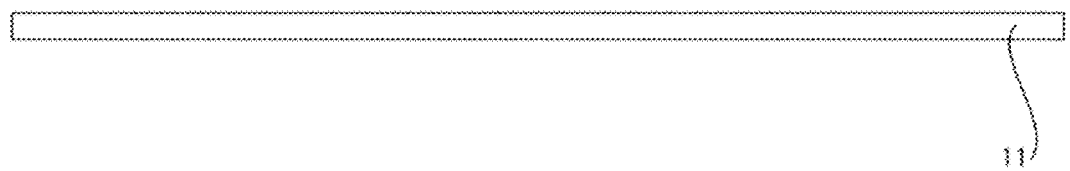
FIG. 4 illustrates a method of manufacturing the semiconductor device in Embodiment 1 of the present invention.
Figure 5:
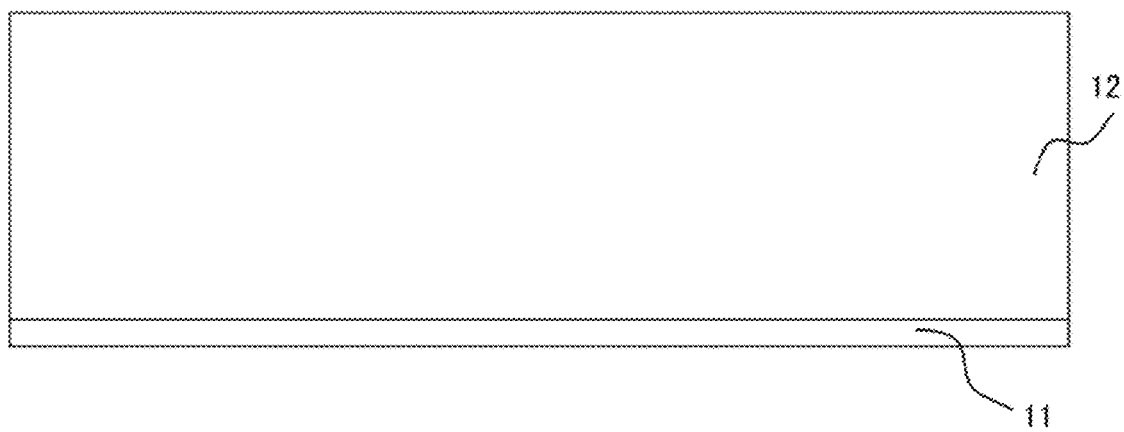
FIG. 5 illustrates the method of manufacturing the semiconductor device in Embodiment 1 of the present invention.

First, as illustrated in FIG. 4, the n+-type silicon carbide substrate 11 is prepared. Next, as illustrated in FIG. 5, the n-type epitaxial crystalline layer 12 is epitaxially grown on the silicon carbide substrate 11 by chemical vapor deposition (CVD). As will be described below, the n-type pillar layers 13 are formed from the epitaxial crystalline layer 12. The thickness of the epitaxial crystalline layer 12 is set as appropriate in accordance with the thickness of the n-type pillar layers 13.

Next, an oxide film 17 is deposited on the surface of the epitaxial crystalline layer 12. The oxide film 17 is deposited to be used as a mask when etching is performed to form the p-type pillar layers 14 in a subsequent process. The thickness of the oxide film 17 is set as appropriate in accordance with the thickness of the p-type pillar layers 14.

Figure 6:
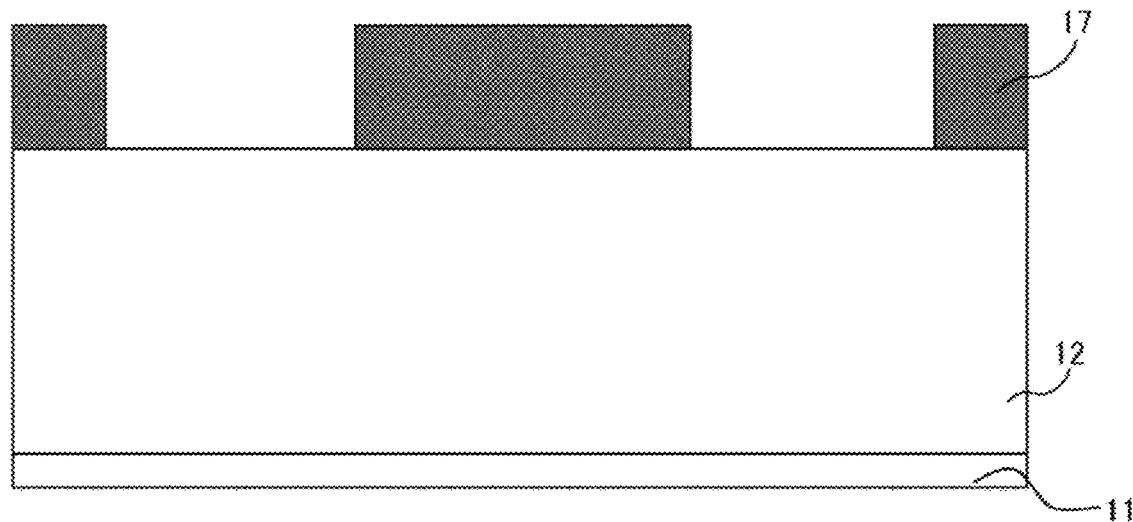
FIG. 6 illustrates the method of manufacturing the semiconductor device in Embodiment 1 of the present invention.

After deposition of the oxide film 17, as illustrated in FIG. 6, mask patterns for forming the p-type pillar layers 14 and formed of the oxide film 17 are formed using a photoresist.

Figure 7:
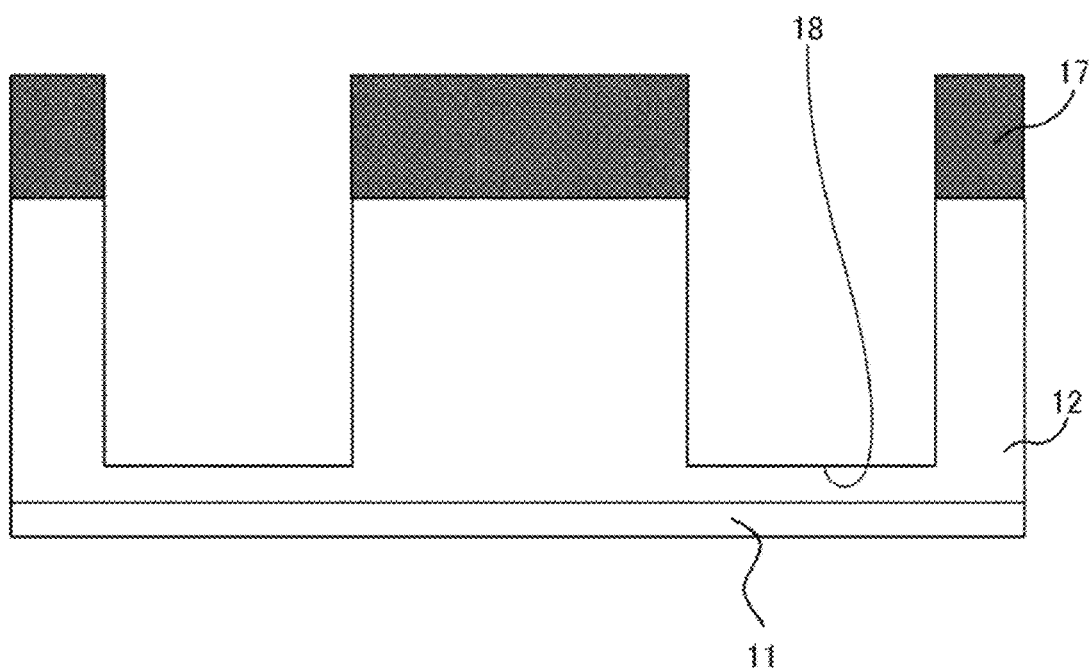
FIG. 7 illustrates the method of manufacturing the semiconductor device in Embodiment 1 of the present invention.

Next, the epitaxial crystalline layer 12 is etched (a first etching process). As illustrated in FIG. 7, mask patterns formed of the oxide film 17 are deposited on the surface of the epitaxial crystalline layer 12 with spacing therebetween. A plurality of pillar forming trenches 18 are thus formed in the epitaxial crystalline layer 12 with spacing therebetween. The p-type pillar layers 14 formed in a subsequent process have the shapes of the pillar forming trenches 18, so that it is desirable to etch the epitaxial crystalline layer 12 by dry etching in which control of the shapes of the pillar forming trenches 18 is easier.

Figure 8:
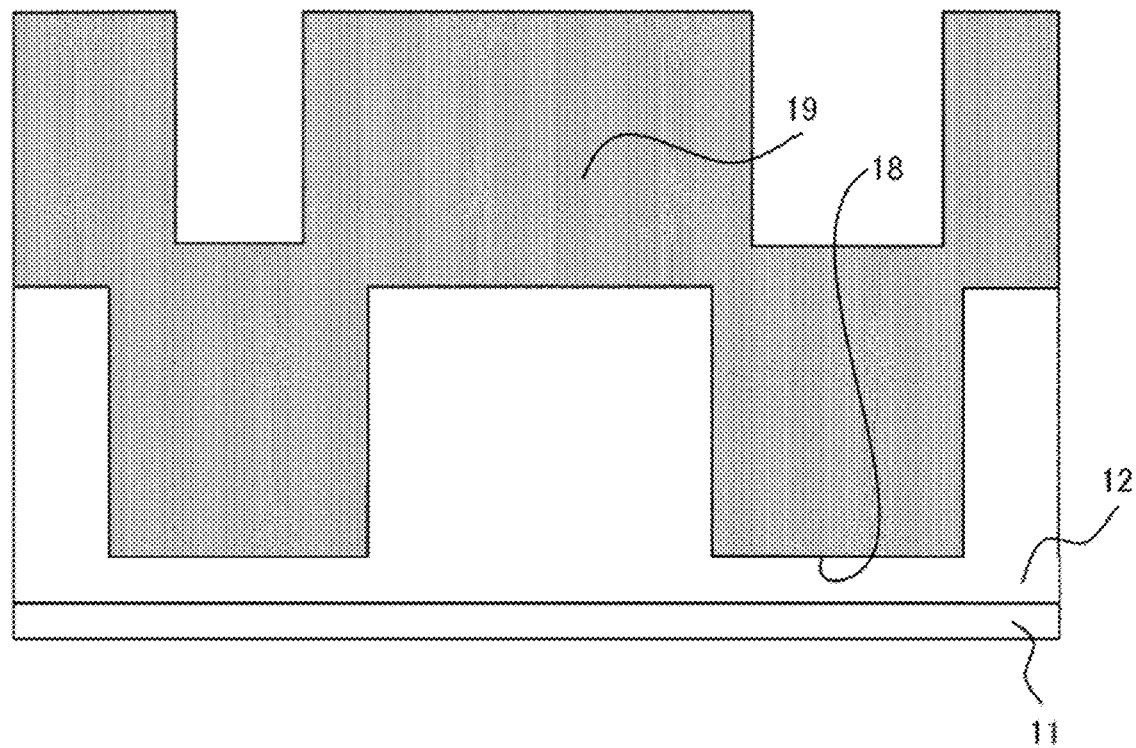
FIG. 8 illustrates the method of manufacturing the semiconductor device in Embodiment 1 of the present invention.

Next, as illustrated in FIG. 8, a p-type silicon carbide epitaxial crystalline layer 19 is grown in the pillar forming trenches 18 through epitaxial growth (a crystal growth process). The impurity concentration of the p-type silicon carbide epitaxial crystalline layer 19 is set so that the effective impurity amount in the region of each of the n-type pillar layers 13 other than the first well layer 21 and the effective impurity amount in each of the p-type pillar layers 14 are equal to each other, that is, the charge balance is kept.

Figure 9:
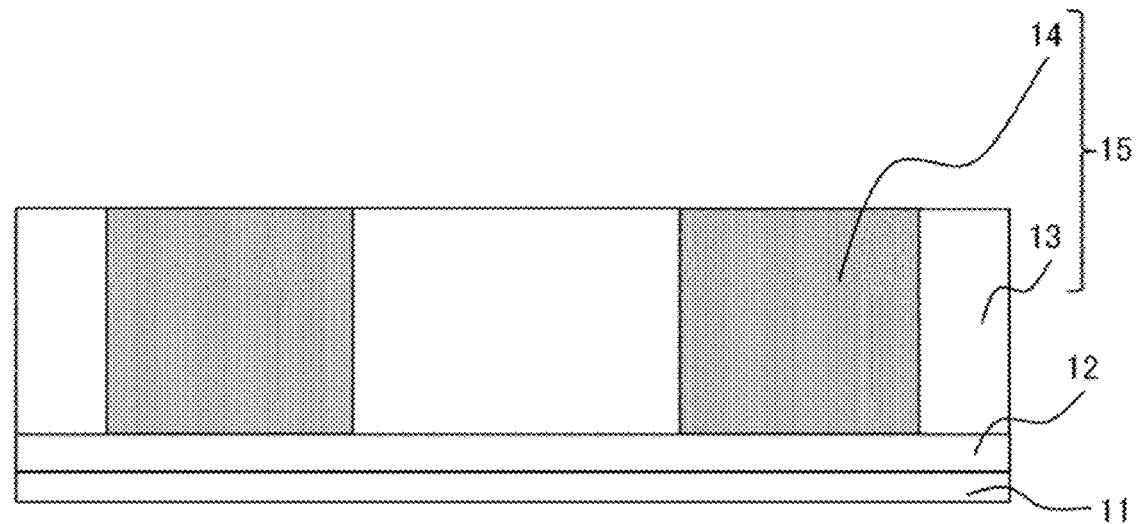
FIG. 9 illustrates the method of manufacturing the semiconductor device in Embodiment 1 of the present invention.

Next, as illustrated in FIG. 9, a portion of the p-type epitaxial crystalline layer 19 and a portion of the n-type epitaxial crystalline layer 12 are removed by chemical mechanical polishing (CMP) to expose the n-type epitaxial crystalline layer 12 on a side of the top surface of the silicon carbide substrate 11. The n-type pillar layers 13 are formed from portions of the n-type epitaxial crystalline layer 12 exposed on the side of the top surface of the silicon carbide substrate 11. The p-type pillar layers 14 are formed from the p-type epitaxial crystalline layer 19. The super junction layer 15 is formed from the n-type pillar layers 13 and the p-type pillar layers 14.

Figure 10:
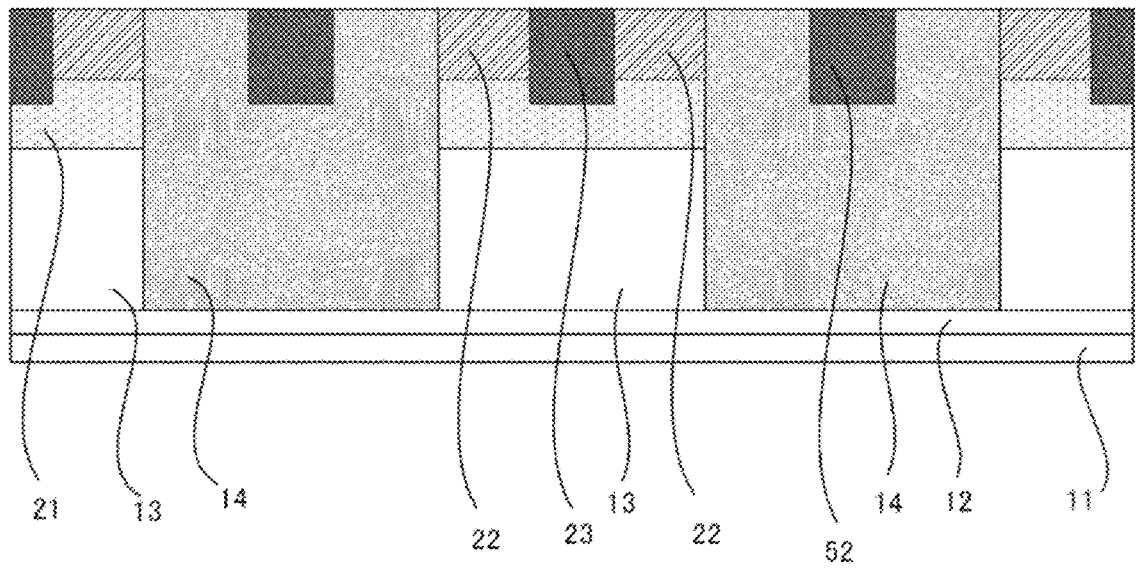
FIG. 10 illustrates the method of manufacturing the semiconductor device in Embodiment 1 of the present invention.

Next, an implantation mask is formed using a photoresist and the like, and ions of Al as the p-type impurity are implanted into a top portion of each of the n-type pillar layers 13 to form the first well layer 21 of the second conductivity type within the n-type pillar layer 13 at the top surface of the n-type pillar layer 13 as illustrated in FIG. 10 (a first ion implantation process). The implantation mask is removed after completion of ion implantation.

Next, an implantation mask is formed using a photoresist and the like, and ions of N as the n-type impurity are implanted into a top portion of the first well layer 21 to form the first source layer 22 of the first conductivity type within the first well layer 21 at the top surface of the first well layer 21 as illustrated in FIG. 10 (a second ion implantation process). The implantation mask is removed after completion of ion implantation.

The first source layer 22 has a smaller depth than the first well layer 21. The length of the channel is determined by a difference in depth between the first source layer 22 and the first well layer 21, so that the depth of the first source layer 22 is only required to be set to obtain desired electrical properties.

Next, an implantation mask is formed using a photoresist and the like, and ions of Al as the p-type impurity are implanted into a top portion of each of the p-type pillar layers 14 and a top portion of the first source layer 22 to simultaneously form the first p+-type layer 23 and the second p+-type layer 52 as illustrated in FIG. 10. The implantation mask is removed after completion of ion implantation.

The first well layer 21, the first source layer 22, the first p+-type layer 23, and the second p+-type layer 52 may be formed in any order, and may not necessarily be formed in the above-mentioned process order.

Next, annealing is performed in an inert gas atmosphere, such as an argon (Ar) gas atmosphere, or in a vacuum at 1500° C. to 2100° C. for 30 seconds to one hour, for example. The implanted ions of Al and N are electrically activated by annealing.

Figure 11:
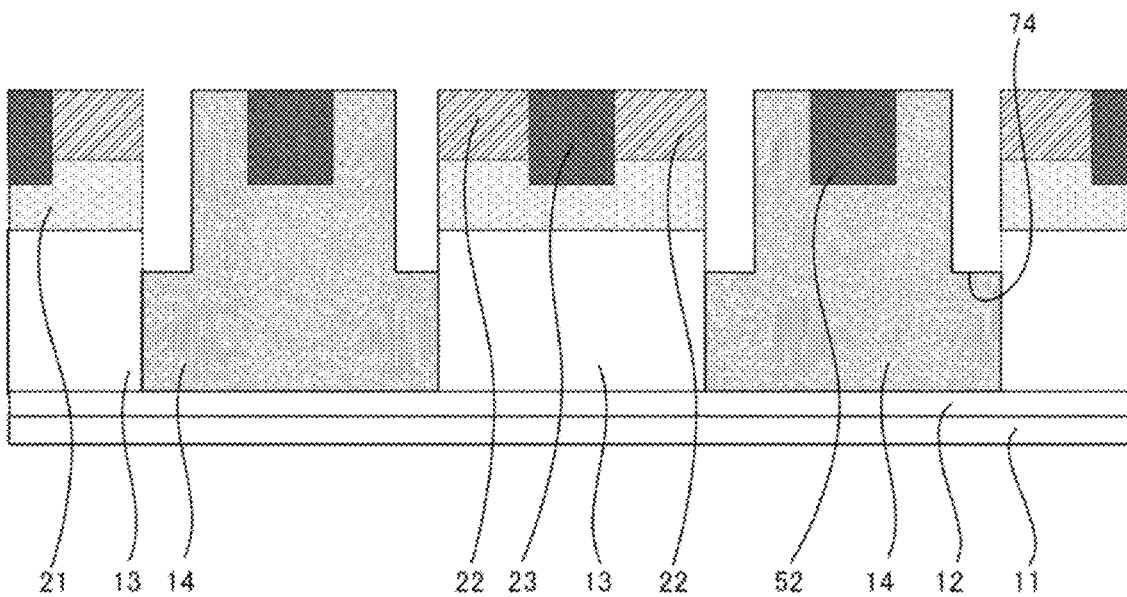
FIG. 11 illustrates the method of manufacturing the semiconductor device in Embodiment 1 of the present invention.

Next, as illustrated in FIG. 11, the first trenches 74 are formed (a second etching process). Specifically, an etching mask is first formed using a resist and the like so that regions at least including the p-type pillar layers 14 at the boundaries between the n-type pillar layers 13 and the p-type pillar layers 14 are etched. The first trenches 74 are then formed by etching, and the etching mask is eventually removed.

It is not necessarily required to use the oxide film 17 as the mask patterns, and a resist mask and the like may be used. The annealing process and the process of forming the first trenches 74 may be performed in any order, and annealing may be performed after formation of the first trenches 74.

Figure 12:
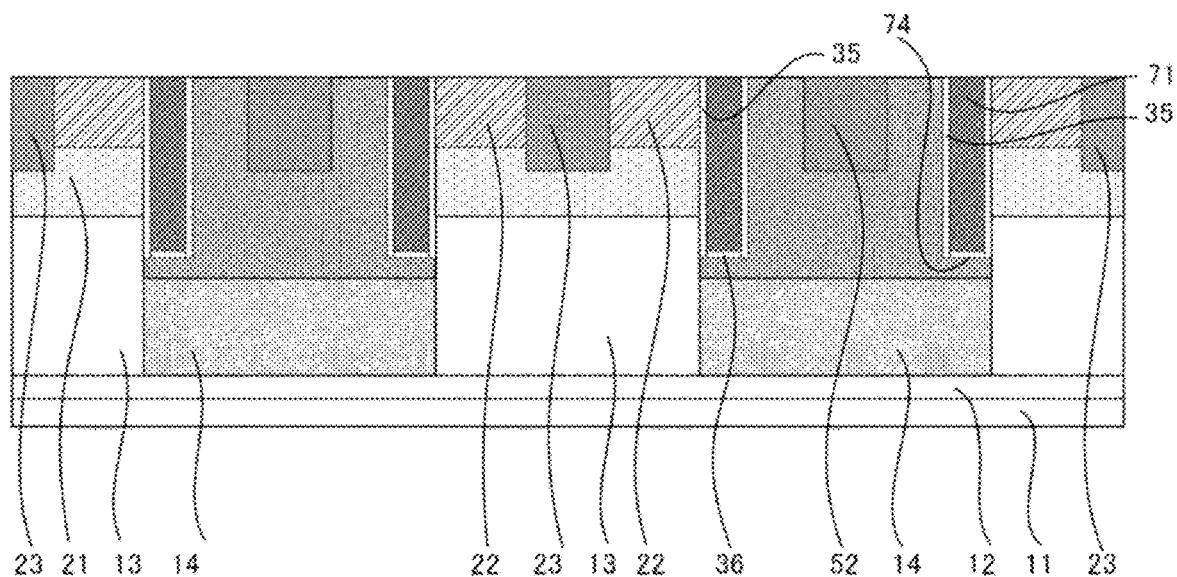
FIG. 12 illustrates the method of manufacturing the semiconductor device in Embodiment 1 of the present invention.

Next, silicon oxide layers are formed on the side surface and the bottom surface of each of the first trenches 74 by thermal oxidation or CVD (a dielectric layer formation process). The first side surface dielectric layer 35 and the first bottom surface dielectric layer 36 are thereby formed respectively on the side surface and the bottom surface of the first trench 74 as illustrated in FIG. 12. The first side surface dielectric layer 35 and the first bottom surface dielectric layer 36 each have a thickness of 30 nm to 150 nm, for example.

Next, doped polysilicon is formed in a region surrounded by the first side surface dielectric layer 35 and the first bottom surface dielectric layer 36 by CVD (a gate formation process). In this case, it is desirable to sufficiently embed doped polysilicon in the first trench 74.

Next, doped polysilicon deposited on a top surface of the super junction layer 15 is removed by etching back. In this case, doped polysilicon in the first trench 74 is left. The first gate electrode 71 is formed from doped polysilicon left in the first trench 74 as illustrated in FIG. 12. There is no problem if a top surface of doped polysilicon in the first trench 74 is located below the top surface of the super junction layer 15. The top surface of doped polysilicon in the first trench 74, however, is required to be located above a bottom surface of the first source layer 22. The semiconductor region 40 is completed by the process.

Next, a dielectric layer is deposited on the first main surface of the semiconductor region 40 by CVD and the like. The dielectric layer is then removed using a resist mask and the like in an active region to form source contact holes reaching the first source layer 22, the first p+-type layer 23, and the second p+-type layer 52. The interlayer dielectric layers 33 are formed from portions of the dielectric layer left in this case. The active region is herein a semiconductor region in which a current flows when a voltage is applied to the semiconductor device. A semiconductor region formed around the periphery of the active region is referred to as a termination region.

Next, after a metal film containing nickel (Ni) as a main component is formed on the first main surface of the semiconductor region 40 by sputter deposition and the like, heat treatment is performed at 600° C. to 1100° C. to react the metal film containing Ni as the main component with the top surfaces of the first source layer 22, the first p+-type layer 23, and the second p+-type layer 52 to thereby form silicide layers therebetween. A metal film, other than the silicide layers formed by reaction, remaining on the interlayer dielectric layers 33 is then removed. The front surface ohmic electrodes 81 are thereby formed.

Next, after a metal film containing Ni as a main component is formed on the second main surface of the semiconductor region 40 by sputter deposition and the like, heat treatment is performed on the second main surface of the semiconductor region 40 to form the back surface ohmic electrode 91 on the second main surface of the semiconductor region 40.

Next, a metal film containing Al is formed over the first main surface of the semiconductor region 40 by sputter deposition, vacuum deposition, or the like. In this case, it is desirable to completely embed metal in each of the contact holes. An unnecessary portion of the metal film is then removed by wet etching using a resist mask and the like to form the source electrode 82.

Next, a metal film containing gold is formed on the surface of the back surface ohmic electrode 91 by sputter deposition and the like to form the drain electrode 92. The semiconductor device in the present embodiment as illustrated in FIG. 1 is completed by the above-mentioned series of processes.

A process of forming a semiconductor layer of the second conductivity type typically referred to as a guard ring in the termination region, a process of forming a dielectric layer typically referred to as a field dielectric layer in the termination region, for example, below gate wiring, a gate pad, and the like, and other processes may be added as appropriate to the above-mentioned series of processes.

In each of the processes of manufacturing the semiconductor device, a local shape of the semiconductor device typically affects the finish in the process. Thus, in a case where the shape is not periodic, for example, the finish of the local shape might not be constant to cause local variation in properties. The local variation in properties can deteriorate element reliability. In the present embodiment, spacing between the n-type pillar layers 13 and spacing between the p-type pillar layers 14 are each made to be constant to suppress local variation in properties to thereby prevent deterioration in reliability of the semiconductor device.

Regions formed of a semiconductor, such as the first well layer 21 and the first source layer 22, and regions formed of a material other than the semiconductor, such as the first trenches 74, are desirably formed in stripes as in the present embodiment. In a case where the crystal growth process is performed using the silicon carbide substrate 11 having the off angle, an alignment mark for use in an exposure process for resist patterning can be shifted in a direction corresponding to the off angle. In this case, the regions formed of the semiconductor, such as the first well layer 21 and the first source layer 22, and the regions formed of the material other than the semiconductor, such as the first trenches 74, are formed at locations shifted in the direction corresponding to the off angle with respect to the n-type pillar layers 13.

In a case where the regions formed of the semiconductor, such as the first well layer 21 and the first source layer 22, and the regions formed of the material other than the semiconductor, such as the first trenches 74, are formed in a grid, for example, a shift of the alignment mark in any direction can cause a change in properties. In a case where the regions formed of the semiconductor, such as the first well layer 21 and the first source layer 22, and the regions formed of the material other than the semiconductor, such as the first trenches 74, are formed in stripes, however, the change in properties can be suppressed by matching a direction of the shift of the alignment mark to a direction of extension of the stripes. The amount of shift increases with increasing depth of the p-type pillar layers 14.

As described above, the semiconductor device of the present invention includes the first bottom surface dielectric layer 36 located on the bottom surface of each of the first trenches 74 and the first gate electrode located in the first trench 74, facing the first well layer 21 and the first source layer 22 through the first side surface dielectric layer 35, and facing the p-type pillar layer 14 through the first bottom surface dielectric layer 36. As a result, an electric field applied to the first bottom surface dielectric layer 36 by the p-type pillar layer 14 depleted in the off state of the semiconductor device in the present embodiment is reduced. As a result, an effect of yielding a highly reliable semiconductor device is produced.

Furthermore, addition of a process such as a process of forming a p-type semiconductor layer for electric field reduction is not necessary in the existing semiconductor device having the super junction structure.

In particular, if the first bottom surface dielectric layer 36 as a whole is in contact with the p-type pillar layer 14, the effect of reducing the electric field further increases, and an effect of improving reliability of the silicon carbide MOSFET is further produced.

As illustrated in FIGS. 1 and 2, first trenches 74 are located within each of the p-type pillar layers 14 formed in stripes at boundaries between the p-type pillar layer 14 and n-type pillar layers 13 located on both sides of the p-type pillar layer 14, but a first trench 74 may be located at a boundary on only one side. In a case where the first trenches 74 are located within each of the p-type pillar layers 14 formed in stripes at the boundaries between the p-type pillar layer 14 and the n-type pillar layers 13 located on both sides of the p-type pillar layer 14, however, the channel width density is higher than that in a case where the first trench 74 is located at the boundary on only one side, and, as a result, the on-resistance can be reduced.

Embodiment 2

Figure 13:
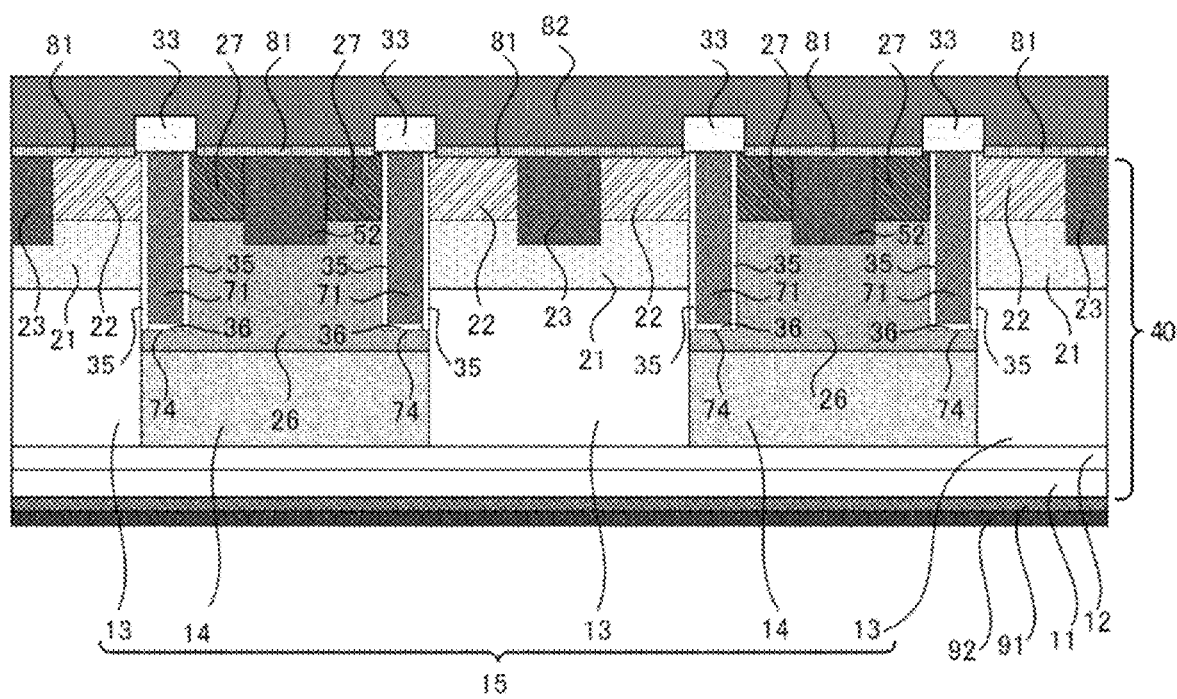
FIG. 13 is a cross-sectional view along the line B-B' of a semiconductor device in Embodiment 2 of the present invention.
Figure 14:
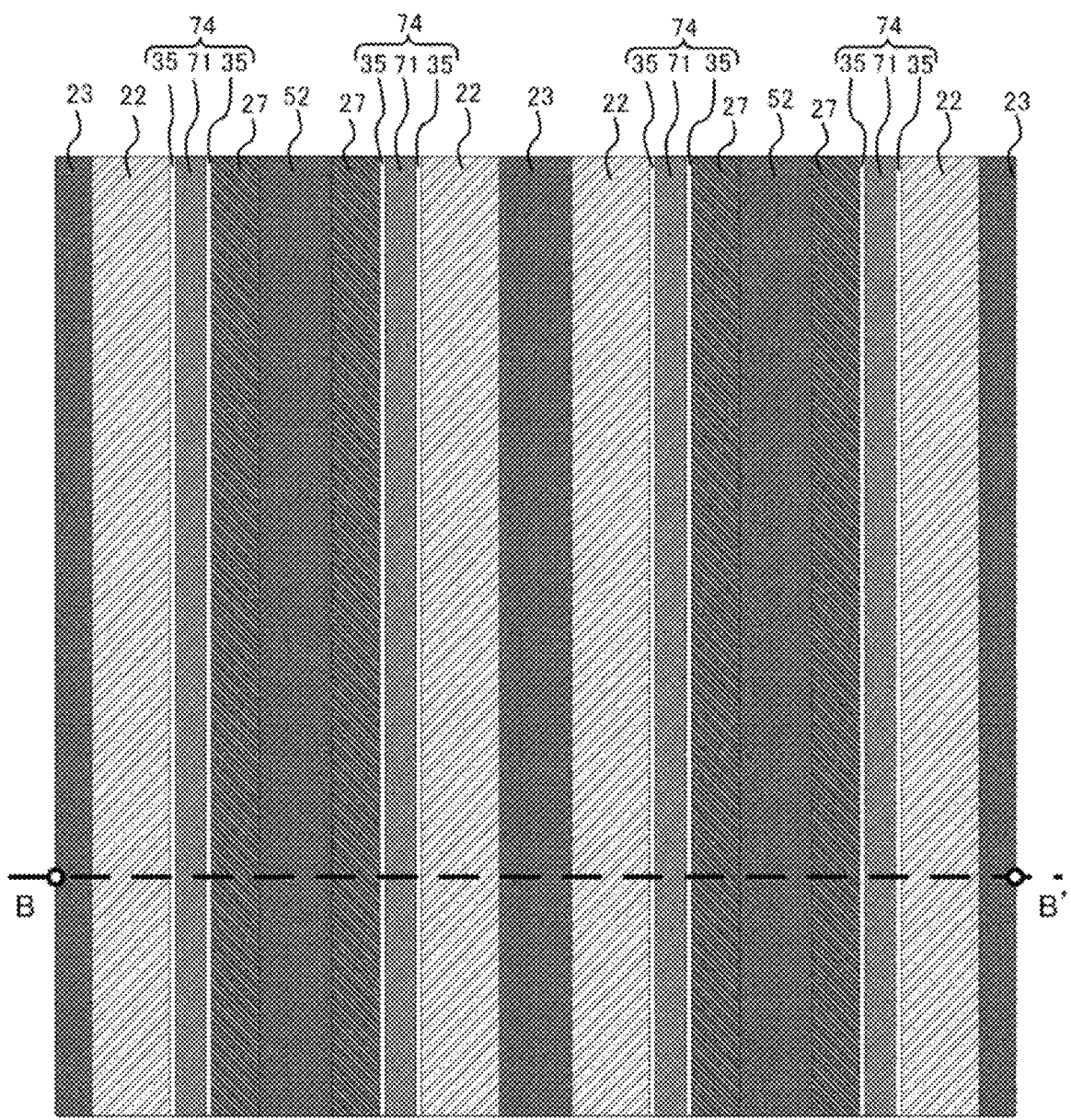
FIG. 14 is a plan view of the semiconductor device in Embodiment 2 of the present invention.
Figure 15:
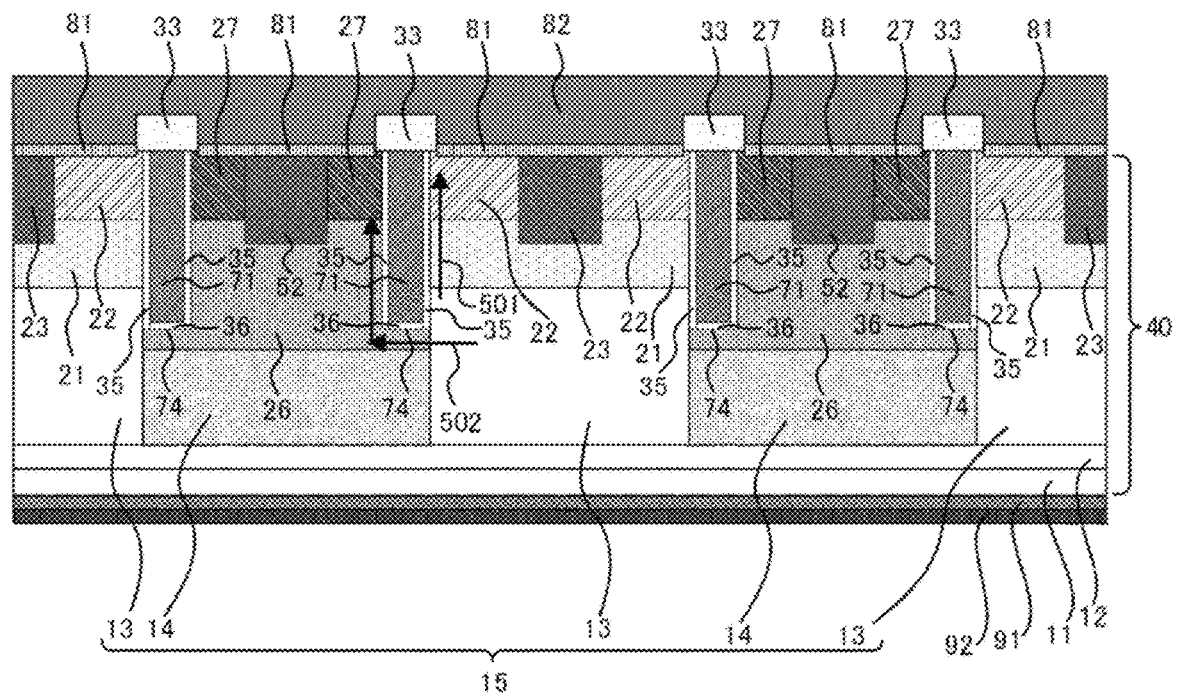
FIG. 15 is a cross-sectional view along the line B-B' showing operation of the semiconductor device in Embodiment 2 of the present invention.

A configuration in the present embodiment will be described below with use of FIGS. 13 to 15. FIG. 13 is a cross-sectional view of a semiconductor device in the present embodiment along an auxiliary line B-B' of FIG. 14. FIG. 14 is a plan view illustrating a top surface of a semiconductor region of the semiconductor device in the present embodiment. The semiconductor device in the present embodiment has much in common with the semiconductor device in Embodiment 1, and only a difference from the semiconductor device in Embodiment 1 will be described.

As illustrated in FIG. 13, the semiconductor device in the present embodiment includes, in additional to the configuration of the semiconductor device in Embodiment 1, a p-type second well layer 26 located within each of the p-type pillar layers 14 at a top surface of the p-type pillar layer 14. Furthermore, an n+-type second source layer 27 is located within the second well layer 26 at a top surface of the second well layer 26. Each of the p-type pillar layers 14 in the present embodiment includes the second well layer 26 and the second source layer 27.

As illustrated in FIG. 13, the first side surface dielectric layer 35 is located on opposite side surfaces in each of the first trenches 74. The first side surface dielectric layer 35 is in contact with the second well layer 26 and the second source layer 27. The first bottom surface dielectric layer 36 is in contact with the second well layer 26. That is to say, the first bottom surface dielectric layer 36 is in contact with a p-type region of each of the p-type pillar layers 14. Second well layers 26 are formed in stripes in plan view.

The second well layer 26 may have the same impurity concentration as or may have a different impurity concentration from a region of the p-type pillar layer 14 other than the second well layer 26. The second well layer 26 may have distribution in which the impurity concentration varies in a direction perpendicular to the silicon carbide substrate 11. The second well layer 26 may have distribution in which a portion of the second well layer 26 being in contact with the first bottom surface dielectric layer 36 has the same impurity concentration as the region of the p-type pillar layer 14 other than the second well layer 26. A threshold voltage of a MOSFET typically depends on the impurity concentration in a well region, and thus the second well layer 26 is only required to have an appropriate impurity concentration to achieve a target threshold voltage. In the present embodiment, description is made on the assumption that the second well layer 26 has a higher impurity concentration than the region of the p-type pillar layer 14 other than the second well layer 26, and has a constant impurity concentration.

As illustrated in FIG. 13, the n+-type second source layer 27 is formed within the second well layer 26 at the top surface of the second well layer 26. As illustrated in FIG. 14, second source layers 27 are formed in stripes in plan view. The front surface ohmic electrodes 81 in the present embodiment are in contact not only with the first source layer 22, the first p+-type layer 23, and the second p+-type layer 52 but also with the second source layer 27.

Operation of the semiconductor device in the present embodiment will be described next. FIG. 15 is a cross-sectional view along the auxiliary line B-B' of FIG. 14 showing operation of the semiconductor device in the present embodiment. When a voltage higher than a particular voltage value (first threshold voltage) is applied to each of the first gate electrodes 71, a channel is formed in a region within the first well layer 21 being in contact with the first side surface dielectric layer 35. As a result, through application of a positive voltage to the drain electrode 92, a current flows between the drain electrode 92 and the source electrode 82 in a direction of an arrow 501 as in Embodiment 1.

The semiconductor device in the present embodiment further includes the second source layer 27 electrically connected to the source electrode 82 in the top portion of the p-type pillar layer 14. Thus, when a voltage higher than a particular voltage value (second threshold voltage) is applied to each of the first gate electrodes 71, a channel is formed also in a region within the second well layer 26 being in contact with the first side surface dielectric layer 35. As a result, through application of a positive voltage to the drain electrode 92, a current flows between the drain electrode 92 and the source electrode 82 in the direction of the arrow 501 and also in a direction of an arrow 502. The first threshold voltage and the second threshold voltage may be the same or may be different.

A method of manufacturing the semiconductor device in the present embodiment will be described next. The method of manufacturing the semiconductor device in the present embodiment has much in common with the method of manufacturing the semiconductor device in Embodiment 1, and only a difference from the method of manufacturing the semiconductor device in Embodiment 1 will be described.

The method of manufacturing the semiconductor device in the present embodiment includes a process of forming the second well layer 26 at the top surface of the p-type pillar layer 14. In the above-mentioned process, ions of Al (aluminum) as the p-type impurity are implanted into the top surface of the p-type pillar layer 14 illustrated in FIG. 9 using an implantation mask, such as a photoresist, to form the second well layer 26 as illustrated in FIG. 13. The second well layer 26 has a depth of approximately 0.5 µm to 4 µm, for example. The second well layer 26 has a smaller depth than the p-type pillar layer 14. The second well layer 26 has the same impurity concentration as or a higher impurity concentration than the region of the p-type pillar layer 14 other than the second well layer 26, and has an impurity concentration in a range of $1 \times 10^{17}$ cm$^{-3}$ to $1 \times 10^{19}$ cm$^{-3}$, for example. The implantation mask is removed after completion of ion implantation.

The method of manufacturing the semiconductor device in the present embodiment further includes a process of forming the second source layer 27 at the top surface of the second well layer 26 formed as described above. In the above-mentioned process, ions of N (nitrogen) as the n-type impurity are implanted into the top surface of the second well layer 26 formed as described above using an implantation mask, such as a photoresist, to form the second source layer 27 as illustrated in FIG. 13.

The second source layer 27 has a smaller depth than the second well layer 26. The second source layer 27 is required to have a smaller depth than the p-type pillar layer 14. The second source layer 27 may have a higher impurity concentration or a lower impurity concentration than the first source layer 22. The second source layer 27 may have impurity concentration distribution in the direction perpendicular to the silicon carbide substrate 11. The second source layer 27 has an impurity concentration in a range of $1 \times 10^{18}$ cm$^{-3}$ to $1 \times 10^{21}$ cm$^{-3}$, for example, and the n-type impurity ion-implanted in the process has a concentration exceeding the concentration of the p-type impurity of the second well layer 26. The implantation mask is removed after completion of ion implantation.

The process of forming the second well layer 26 at the top surface of the p-type pillar layer 14 and the process of forming the second source layer 27 at the top surface of the second well layer 26 described above may be added during or before or after the processes of forming the first well layer 21, the first source layer 22, the first p+-type layer 23, and the second p+-type layer 52, and these processes may be performed in any order and may not necessarily be performed in the above-mentioned process order.

As described above, the semiconductor device in the present embodiment includes the p-type second well layer 26 located within the p-type pillar layer 14 at the top surface of the p-type pillar layer 14. As illustrated in FIG. 13, the first side surface dielectric layer 35 is in contact with the second well layer 26 and the second source layer 27, and the first bottom surface dielectric layer 36 is in contact with the second well layer 26. As a result, the channel is formed also in the region within the second well layer 26 being in contact with the first side surface dielectric layer 35 in the on state of the semiconductor device. On the other hand, the semiconductor element described in Patent Document 1 includes a single trench gate-type gate structure within each of the n-type pillar layers. The semiconductor device in the present embodiment thus has a higher channel width density than the semiconductor element described in Patent Document 1. The semiconductor device in the present embodiment thus further produces an effect of reducing the on-resistance compared with the semiconductor element described in Patent Document 1.

In the trench fill scheme, the width of the p-type pillar layer increases with increasing depth of the trench to be formed due to process constraints. In a case where silicon carbide is used as a semiconductor material, for example, the p-type pillar layer is required to have a depth of approximately 40 µm to achieve a breakdown voltage of 6.5 kV. In the trench fill scheme, trenches are typically formed by dry etching using a pattern of a deposited oxide film as a mask. The pattern of the deposited oxide film is formed, after deposition of an oxide film over the whole surface of a wafer, by dry etching using a patterned resist mask. That is to say, a dry etching process is performed twice to form the trenches in the wafer.

At dry etching, the oxide film mask or the resist mask is gradually etched not only from a top surface thereof but also from an end surface thereof, and thus, in a case where a positive resist is used, finished trench regions have greater widths and areas than photolithographically exposed regions of the resist mask. In a case where trenches each having a depth of approximately 40 µm are formed to achieve a breakdown voltage of 6.5 kV, trenches to be formed each have a width of approximately 7 µm or more due to the influence of etching of the end surface of the mask even if the photolithographically exposed regions each have a sufficiently smaller width.

On the other hand, the width of the mask cannot excessively be reduced in regions in which trenches are not formed, that is, regions in which there is the mask. This is because, in a case where the resist has a small width, an intended pattern cannot be formed due to a fall of the resist, separation of the mask from the wafer, and the like. In particular, in a case where the super junction structure is formed, the mask pattern has an extremely high aspect ratio in plan view, and thus such pattern formation failure is more likely to occur. The n-type pillar layer is required to have a width of approximately 5 µm or more to form a trench structure with stability. A pillar pitch is thus approximately 12 µm or more to form the p-type pillar layer 14 having a depth of approximately 40 µm.

The p-type pillar layer 14 has an extremely large width in a case where the semiconductor device in the present embodiment is manufactured using the trench fill scheme more suitable for mass production than the multi-epitaxial scheme. In a case of the semiconductor element described in Patent Document 1, no trenches are formed within the p-type pillar layer, and thus the influence of reduction in channel width density is large. In the semiconductor device in the present embodiment, the effect of reducing the on-resistance of the semiconductor device compared with that of the semiconductor element described in Patent Document 1 has great significance.

Furthermore, it is typically more difficult to epitaxially grow silicon carbide in trenches formed within silicon carbide than to embed silicon in trenches formed within silicon. In a case where the p-type pillar layer 14 is formed using the trench fill scheme, the first trenches 74 can each be required to have a greater width than those formed within silicon. The effect of reducing the on-resistance of the semiconductor device thus has great significance for silicon carbide.

In a case where the second well layer 26 has a smaller depth than the first trench 74, and the second well layer 26 has the same impurity concentration profile as the first well layer 21, the second well layer 26 and the first well layer 21 may be formed simultaneously. In this case, a single implantation mask can be used, and thus an effect of reducing the number of times patterning and implantation are performed to simplify the manufacturing processes is further produced.

In a case where the second source layer 27 has the same impurity concentration profile as the first source layer 22, the second source layer 27 and the first source layer 22 may be formed simultaneously. In this case, a single implantation mask can be used, and thus the effect of reducing the number of times patterning and implantation are performed to simplify the manufacturing processes is further produced.

Embodiment 3

Figure 16:
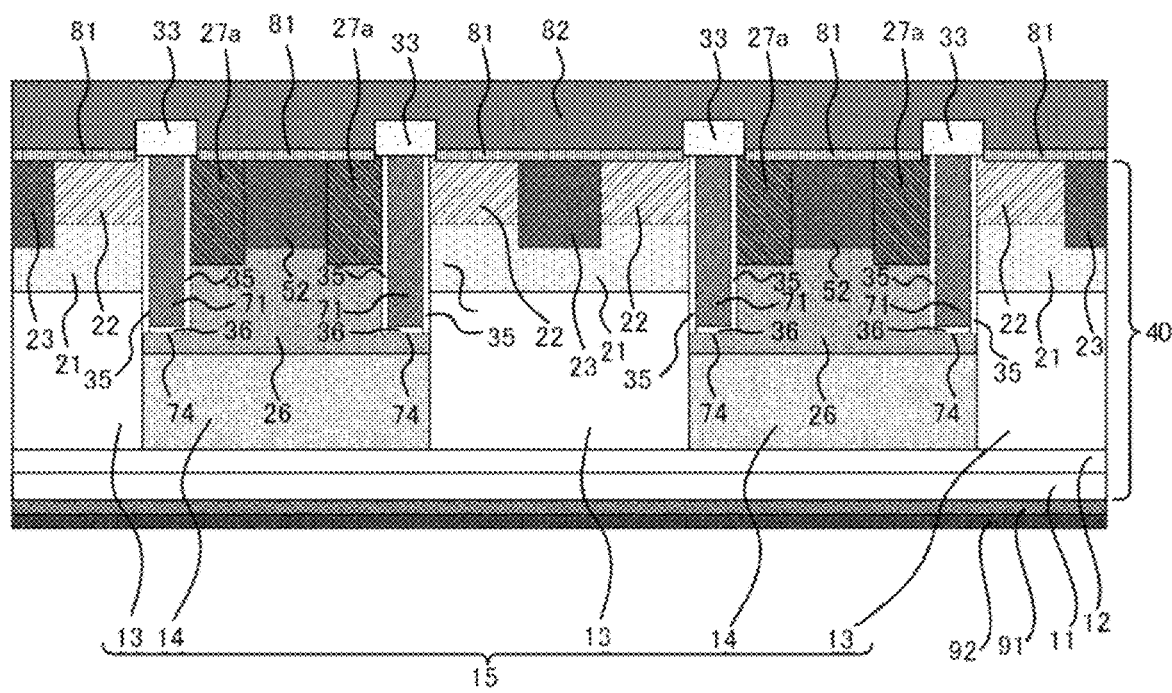
FIG. 16 is a cross-sectional view along the line C-C' of a semiconductor device in Embodiment 3 of the present invention.
Figure 17:
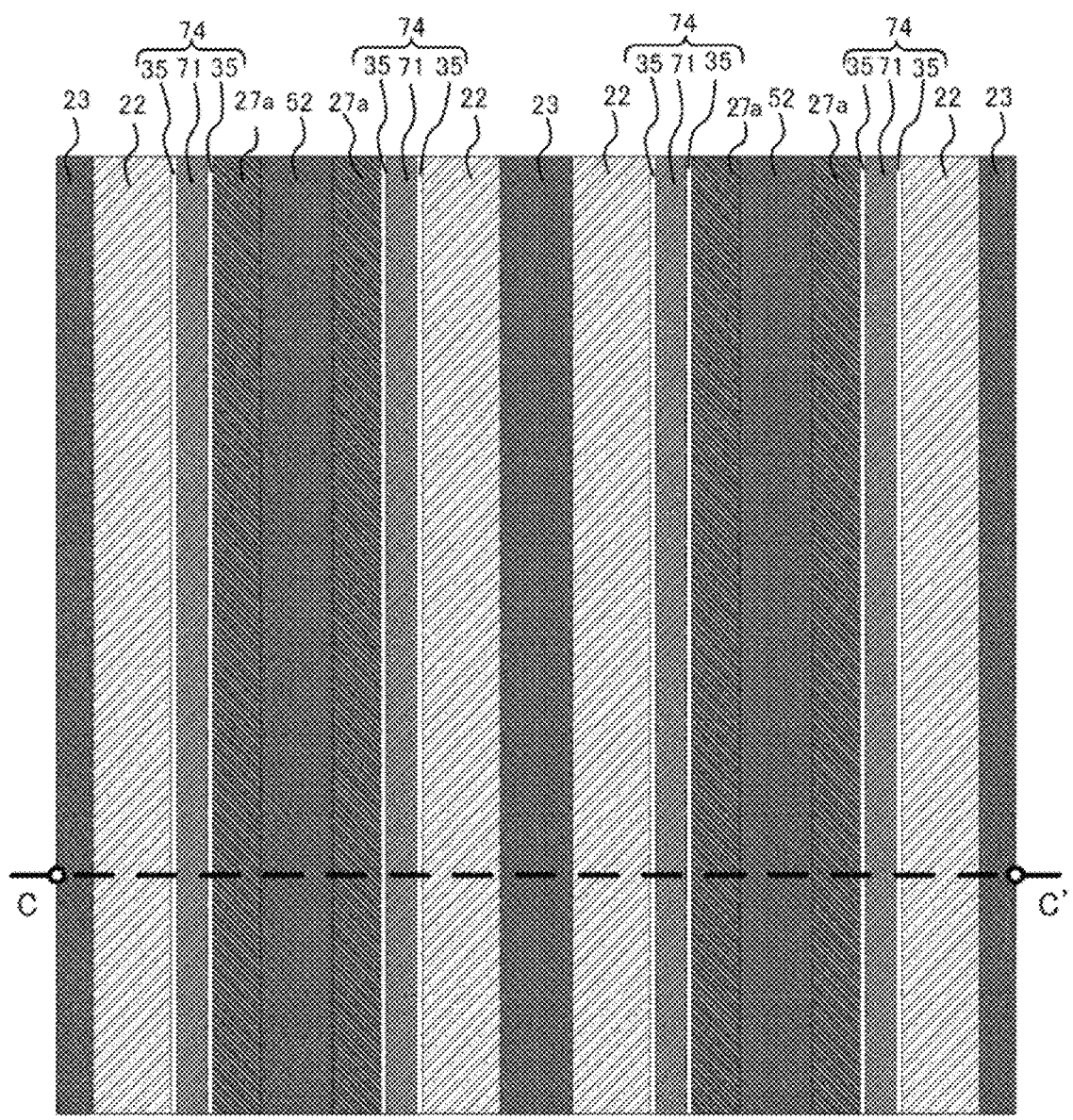
FIG. 17 is a plan view illustrating a top surface of a semiconductor region of the semiconductor device in Embodiment 3 of the present invention.

A configuration in the present embodiment will be described below with use of FIGS. 16 and 17. FIG. 16 is a cross-sectional view of a semiconductor device in the present embodiment along an auxiliary line C-C' of FIG. 17. FIG. 17 is a plan view illustrating a top surface of a semiconductor region of the semiconductor device in the present embodiment. The semiconductor device in the present embodiment has much in common with the semiconductor device in Embodiment 2, and only a difference from the semiconductor device in Embodiment 2 will be described.

As illustrated in FIG. 16, the semiconductor device in the present embodiment includes a second source layer 27*a* in place of the second source layer 27 in the configuration of the semiconductor device in Embodiment 2. The second source layer 27*a* is formed to have a greater depth than the first source layer 22. That is to say, a bottom surface of the second source layer 27*a* is closer to the second main surface of the semiconductor region 40 than the bottom surface of the first source layer 22 is.

A method of manufacturing the semiconductor device in the present embodiment will be described next. In the method of manufacturing the semiconductor device in the present embodiment, ion implantation is only required to be performed so that the second source layer 27*a* has a greater depth than the first source layer 22 in the process of forming the second source layer 27 in Embodiment 2.

As described above, in the semiconductor device in the present embodiment, the bottom surface of the second source layer 27*a* is closer to the silicon carbide substrate 11 than the bottom surface of the first source layer 22 is. As a result, the channel formed on a side of the second well layer 26 has a shorter length, and a channel resistance on the side of the second well layer 26 is lower than those in the semiconductor device in Embodiment 2. As a result, the effect of reducing the on-resistance of the semiconductor device compared with the semiconductor device in Embodiment 2 is further produced.

Embodiment 4

Figure 18:
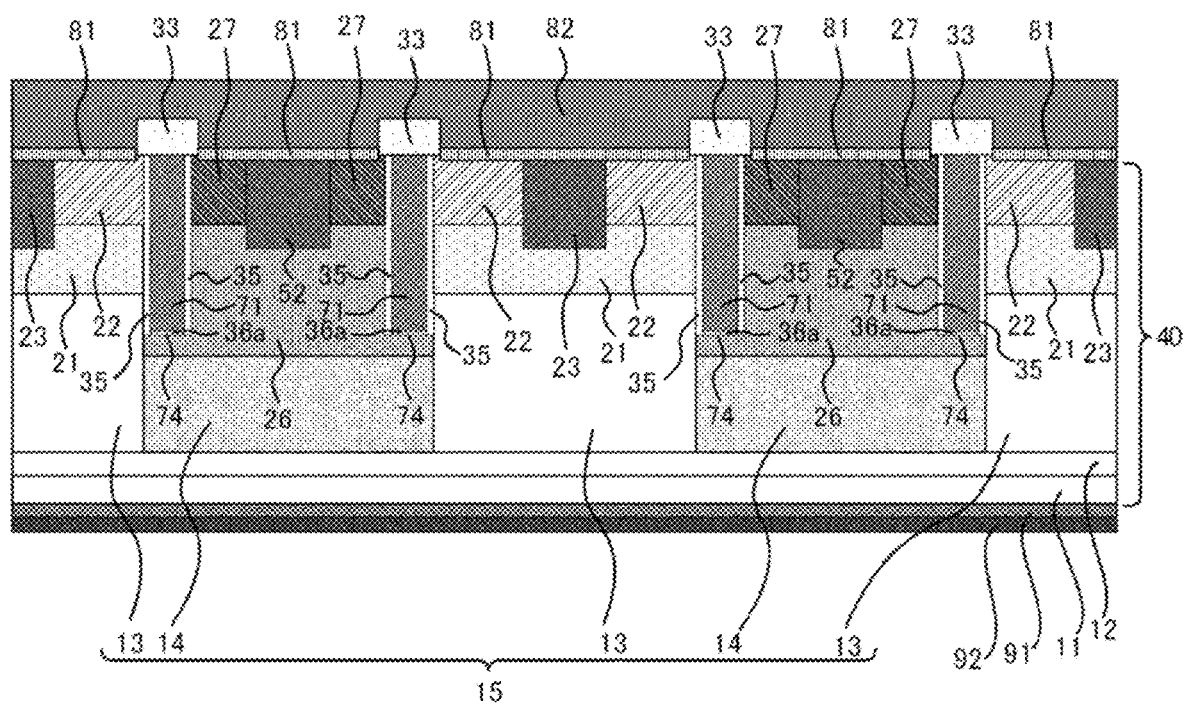
FIG. 18 is a cross-sectional view along the line D-D' of a semiconductor device in Embodiment 4 of the present invention.
Figure 19:
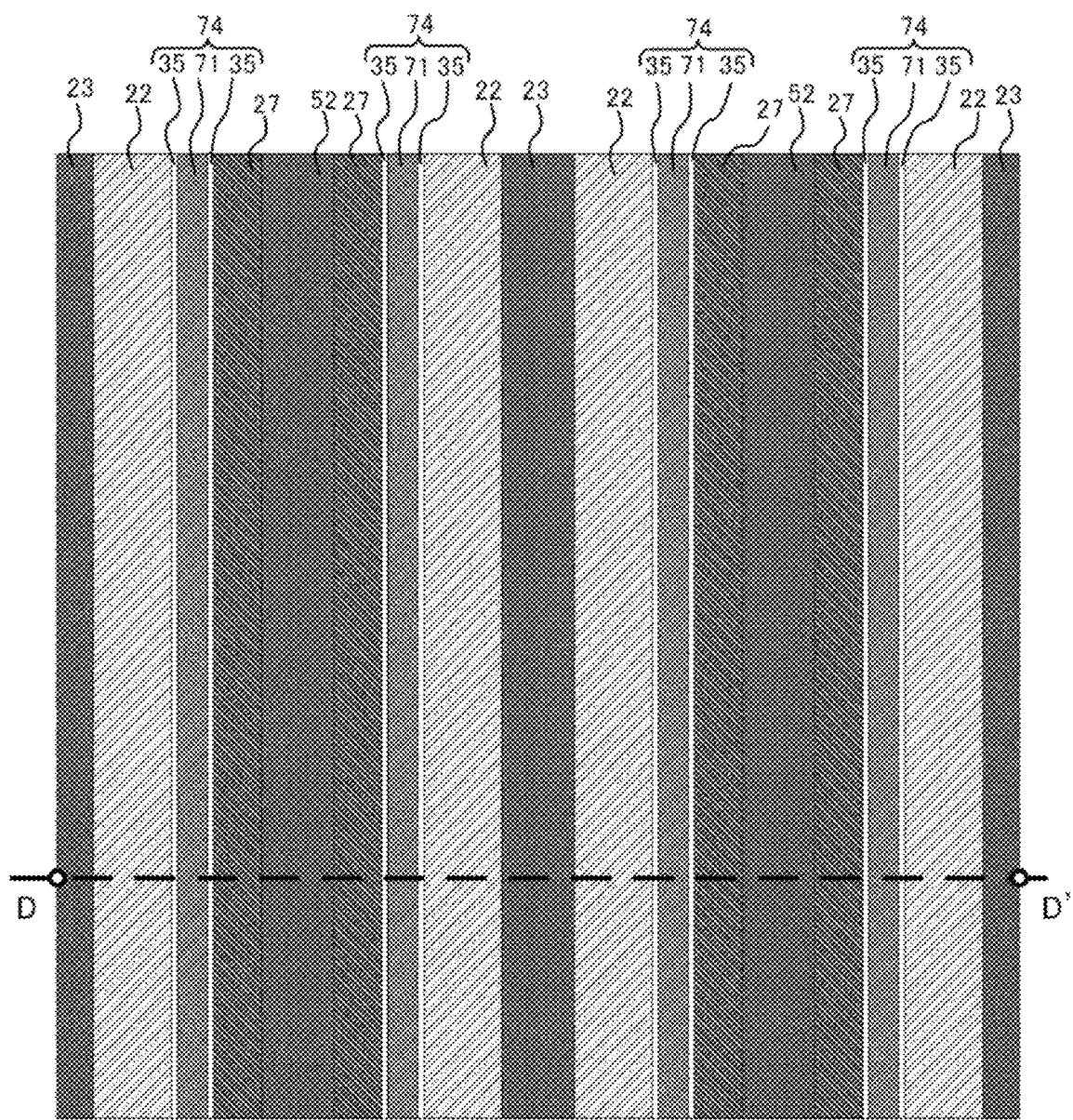
FIG. 19 is a plan view illustrating a top surface of a semiconductor region of the semiconductor device in Embodiment 4 of the present invention.

A configuration in the present embodiment will be described below with use of FIGS. 18 and 19. FIG. 18 is a cross-sectional view of a semiconductor device in the present embodiment along an auxiliary line D-D' of FIG. 19. FIG. 19 is a plan view illustrating a top surface of a semiconductor region of the semiconductor device in the present embodiment. The semiconductor device in the present embodiment has much in common with the semiconductor device in Embodiment 2, and only a difference from the semiconductor device in Embodiment 2 will be described.

As illustrated in FIG. 18, the semiconductor device in the present embodiment includes a first bottom surface dielectric layer 36*a* in place of the first bottom surface dielectric layer 36. The first bottom surface dielectric layer 36*a* is formed to have a smaller thickness than the first side surface dielectric layer 35.

A method of manufacturing the semiconductor device in the present embodiment will be described next. In the method of manufacturing the semiconductor device in the present embodiment, the first bottom surface dielectric layer 36*a* is only required to be formed to have a smaller thickness than the first side surface dielectric layer 35 in the process of forming the first bottom surface dielectric layer 36 in Embodiment 2.

In the present embodiment, the (0001) plane is used as the surface of the silicon carbide substrate 11 to the side of the first main surface. The (0001) plane is a plane having the lowest oxidation rate among crystalline planes of silicon carbide. The first bottom surface dielectric layer 36*a* thus naturally has a smaller thickness than the first side surface dielectric layer 35 by forming the first side surface dielectric layer 35 and the first bottom surface dielectric layer 36*a* through thermal oxidation.

As described above, in the semiconductor device in the present embodiment, the first bottom surface dielectric layer 36*a* has a smaller thickness than the first side surface dielectric layer 35. An electric field higher than that applied in the semiconductor device in Embodiment 2 is thus applied in the vicinity of the first bottom surface dielectric layer 36*a* in the on state of the semiconductor device in the present embodiment. That is to say, many inversion carriers are generated in the vicinity of the first bottom surface dielectric layer 36*a* in the on state of the semiconductor device, so that the channel resistance is reduced. As a result, the effect of reducing the on-resistance of the semiconductor device compared with the semiconductor device in Embodiment 2 is further produced.

Embodiment 5

Figure 20:
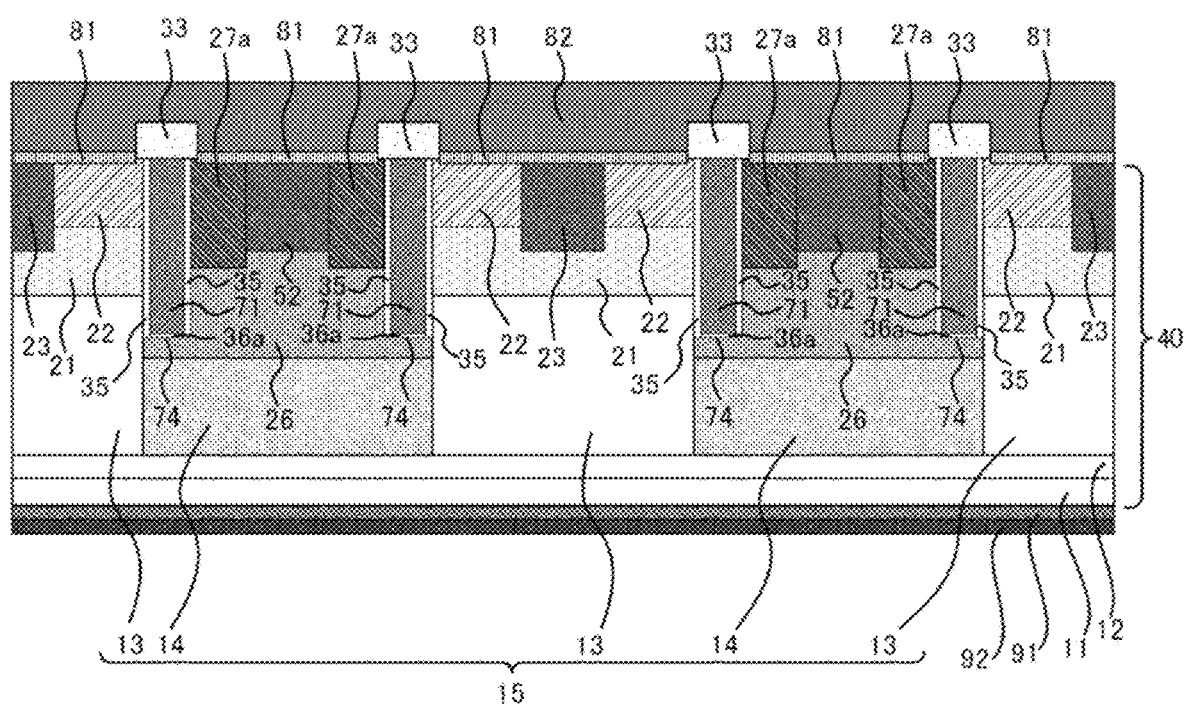
FIG. 20 is a cross-sectional view along the line E-E' of a semiconductor device in Embodiment 5 of the present invention.
Figure 21:
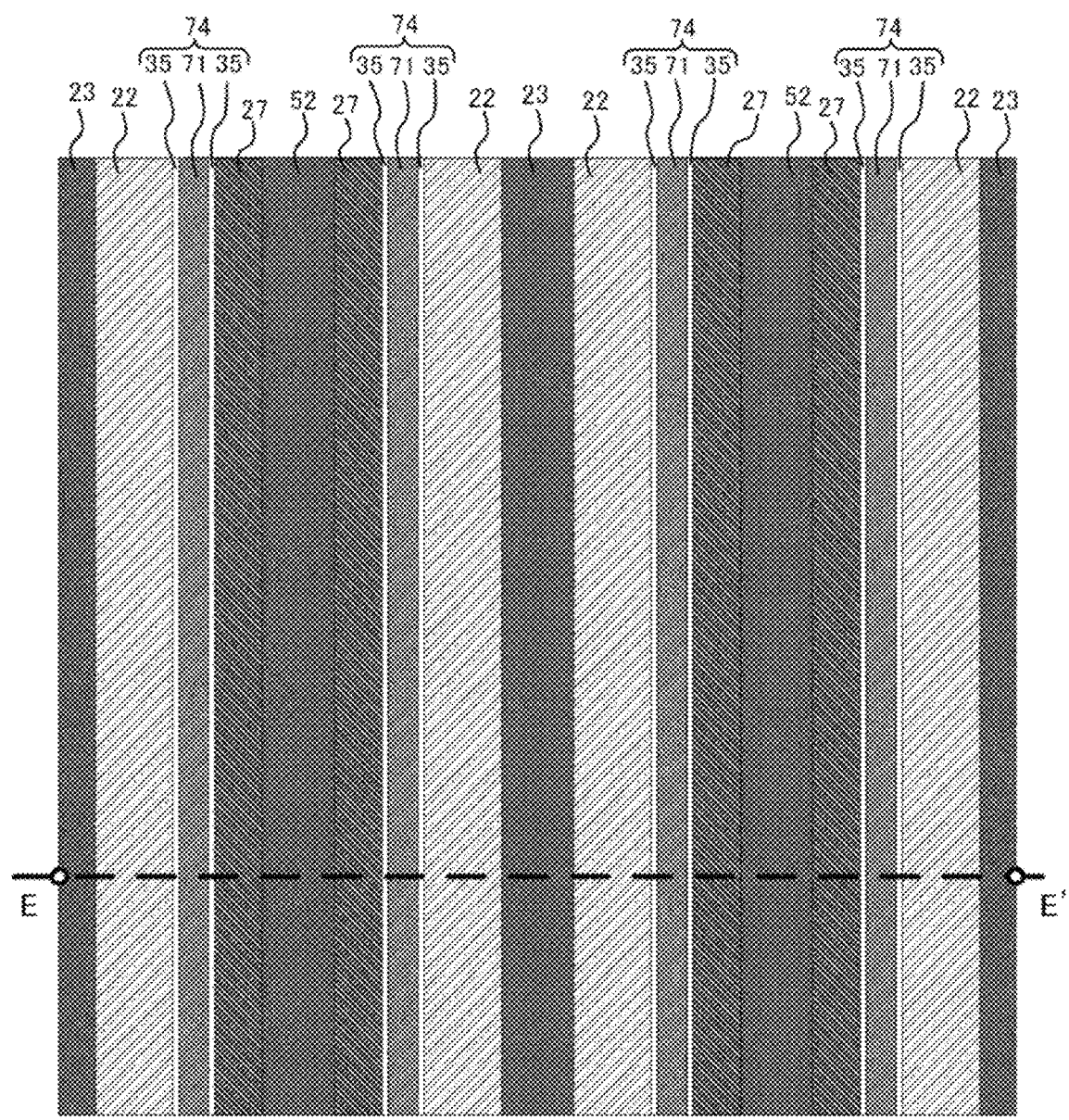
FIG. 21 is a plan view illustrating a top surface of a semiconductor region of the semiconductor device in Embodiment 5 of the present invention.

A configuration in the present embodiment will be described below with use of FIGS. 20 and 21. FIG. 20 is a cross-sectional view of a semiconductor device in the present embodiment along an auxiliary line E-E' of FIG. 21. FIG.

21 is a plan view illustrating a top surface of a semiconductor region of the semiconductor device in the present embodiment.

The semiconductor device in the present embodiment includes both the second source layer 27a in Embodiment 3 and the first bottom surface dielectric layer 36a in Embodiment 4. A method of manufacturing the semiconductor device in the present embodiment is a combination of a method of manufacturing the second source layer 27a in Embodiment 3 and a method of manufacturing the first bottom surface dielectric layer 36a in Embodiment 4, and thus detailed description thereof is omitted.

As described above, since both the second source layer 27a in Embodiment 3 and the first bottom surface dielectric layer 36a in Embodiment 4 are included, effects similar to the effects produced by the semiconductor device in Embodiment 3 and the semiconductor device in Embodiment 4 are produced.

Embodiment 6

Figure 22:
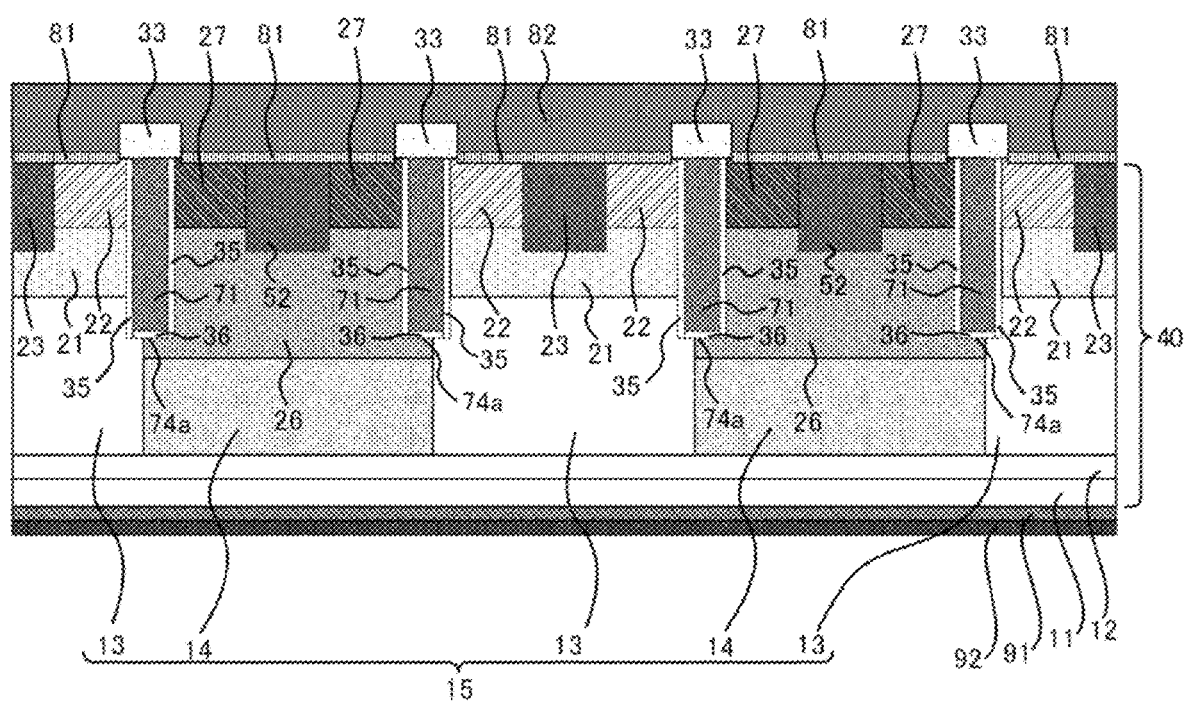
FIG. 22 is a cross-sectional view along the line F-F' of a semiconductor device in Embodiment 6 of the present invention.
Figure 23:
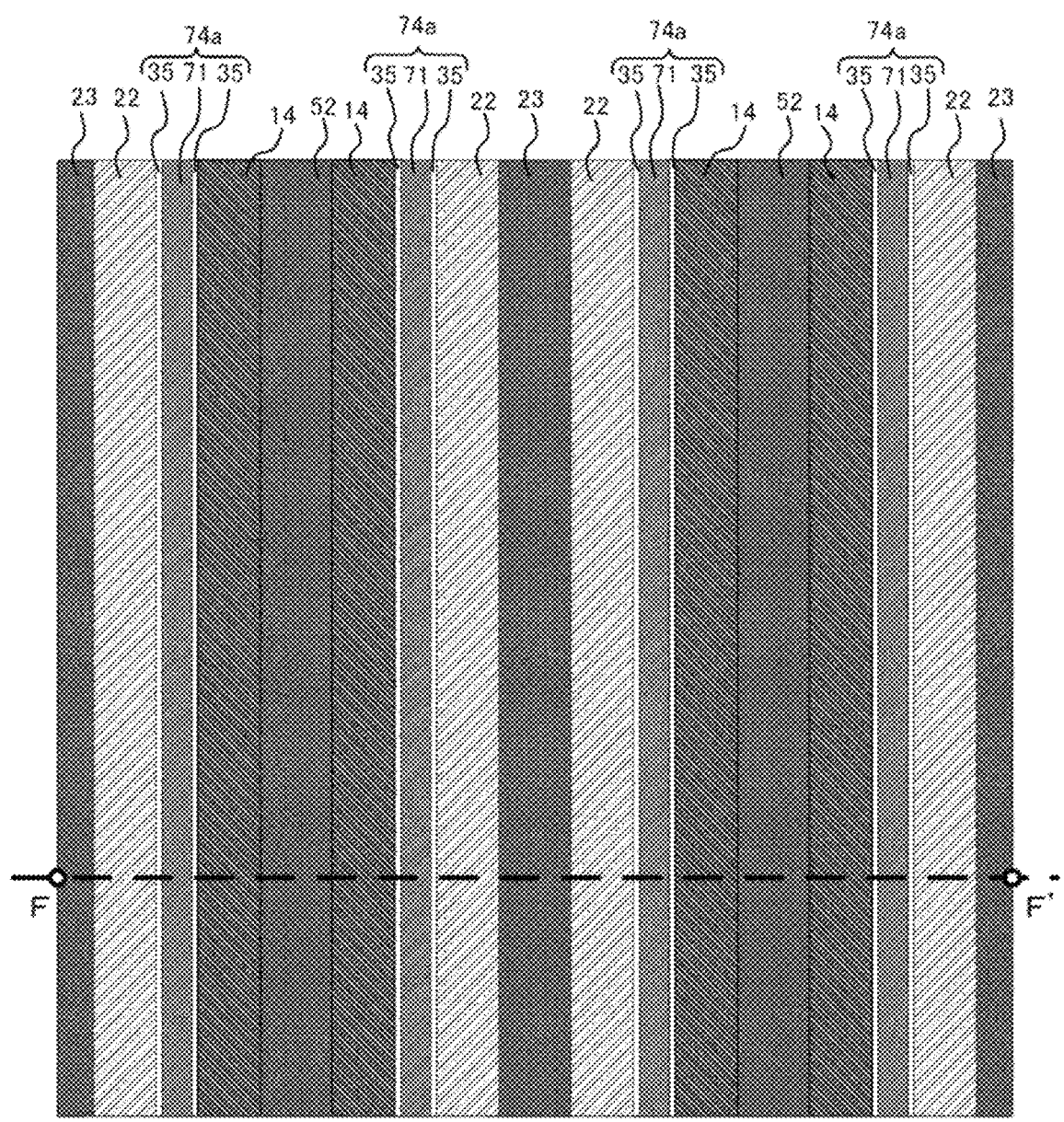
FIG. 23 is a plan view illustrating a top surface of a semiconductor region of the semiconductor device in Embodiment 6 of the present invention.

A configuration in the present embodiment will be described below with use of FIGS. 22 and 23. FIG. 22 is a cross-sectional view of a semiconductor device in the present embodiment along an auxiliary line F-F' of FIG. 23. FIG. 23 is a plan view illustrating a top surface of a semiconductor region of the semiconductor device in the present embodiment. The semiconductor device in the present embodiment has much in common with the semiconductor device in Embodiment 2, and only a difference from the semiconductor device in Embodiment 2 will be described.

As illustrated in FIG. 22, the semiconductor device in the present embodiment has first trenches 74a in place of the first trenches 74. Each of the first trenches 74a is formed to span a boundary between the n-type pillar layer 13 and the p-type pillar layer 14. That is to say, the first bottom surface dielectric layer 36 in the present embodiment is located to be in contact with the n-type pillar layer 13 and the second well layer 26 within the p-type pillar layer 14. Electric field concentration on the first bottom surface dielectric layer 36 in the present embodiment is eased by a depletion layer generated at an interface between the n-type pillar layer 13 and the second well layer 26 and an interface between the n-type pillar layer 13 and the p-type pillar layer 14 in the vicinity of the bottom of the first trench 74a.

A method of manufacturing the semiconductor device in the present embodiment will be described next. In the method of manufacturing the semiconductor device in the present embodiment, etching is only required to be performed so that the first trenches 74a are each formed to span the boundary between the n-type pillar layer 13 and the p-type pillar layer 14 in the process of forming the first trenches 74 illustrated in FIG. 11. That is to say, each of patterns of openings of the mask when the first trenches 74a are formed is only required to be located to span the boundary between the n-type pillar layer 13 and the p-type pillar layer 14.

As described above, in the semiconductor device in the present embodiment, the first bottom surface dielectric layer 36 is located to be in contact with the n-type pillar layer 13 and the second well layer 26 within the p-type pillar layer 14. A lateral channel generated within the second well layer 26 in the on state of the semiconductor device has a shorter length than that in the semiconductor device in Embodiment 2. As a result, an effect of reducing the channel resistance of the semiconductor device is further produced.

The semiconductor device in the present embodiment may include the second source layer 27a having a greater depth than the first source layer 22 in place of the second source layer 27 as in Embodiment 3. In this case, an effect similar to the effect produced by the semiconductor device in Embodiment 3 is produced.

Embodiment 7

Figure 24:
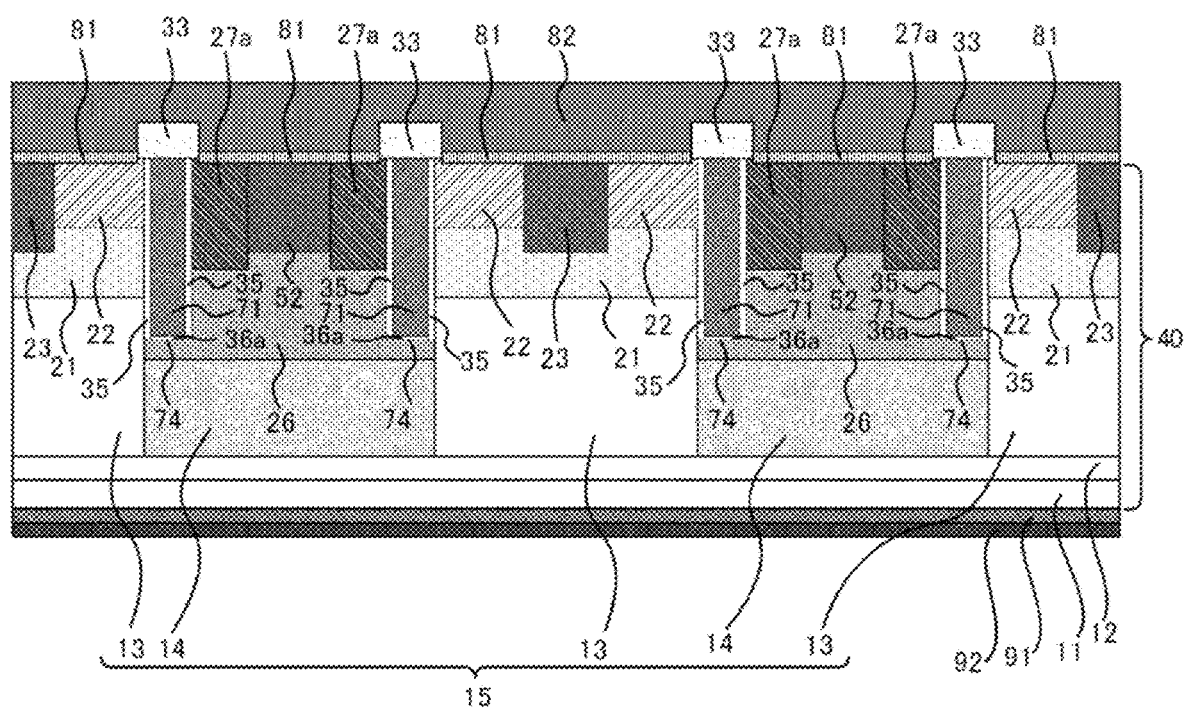
FIG. 24 is a cross-sectional view along the line G-G' of a semiconductor device in Embodiment 7 of the present invention.
Figure 25:
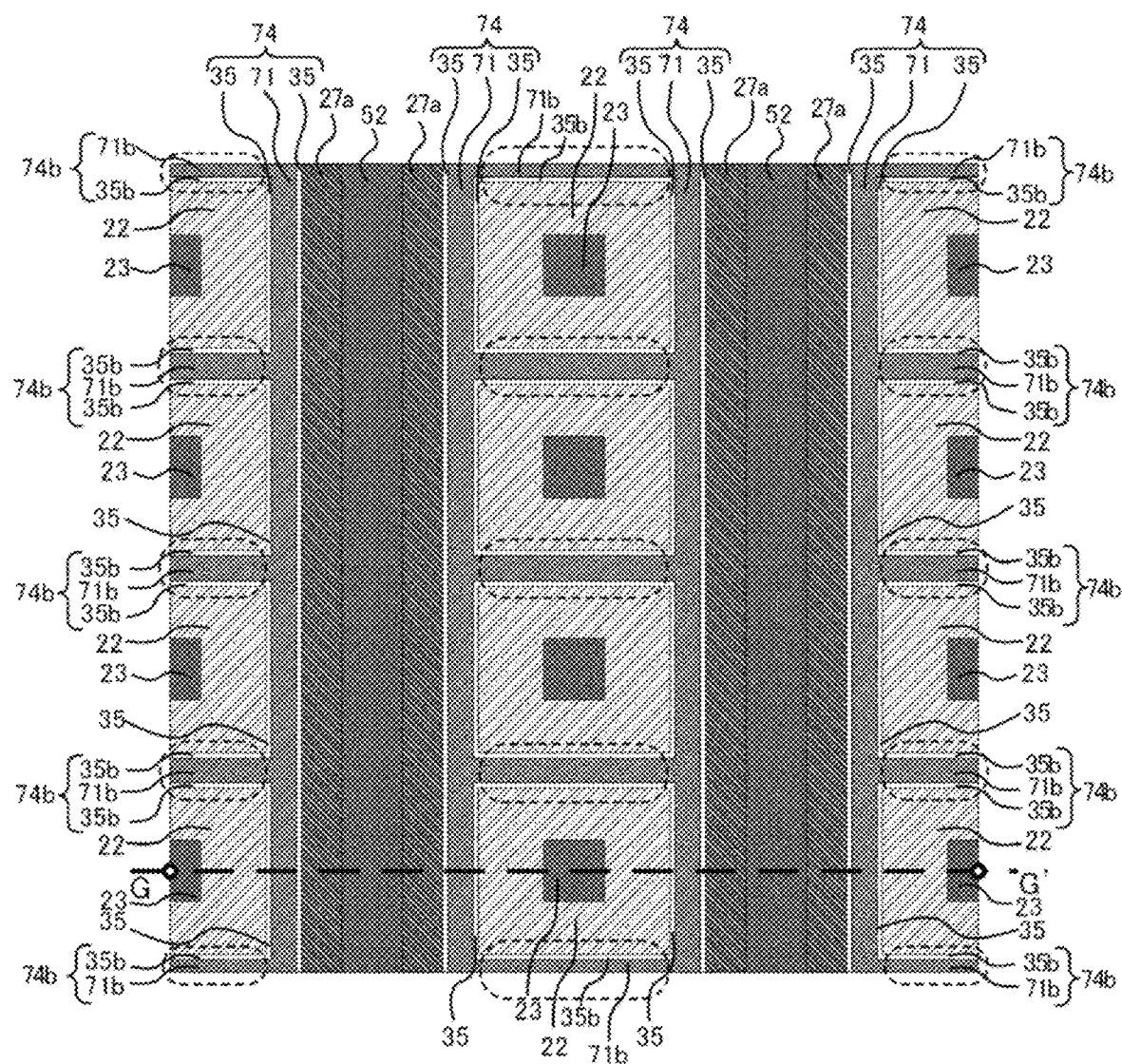
FIG. 25 is a plan view illustrating a top surface of a semiconductor region of the semiconductor device in Embodiment 7 of the present invention.

A configuration in the present embodiment will be described below with use of FIGS. 24 and 25. FIG. 24 is a cross-sectional view of a semiconductor device in the present embodiment along an auxiliary line G-G' of FIG. 25. FIG. 25 is a plan view illustrating a top surface of a semiconductor region of the semiconductor device in the present embodiment. The cross-sectional view of the semiconductor device in the present embodiment along the line G-G' of FIG. 25 has a similar configuration to the cross-sectional view of the semiconductor device in Embodiment 5 along the line E-E' illustrated in FIG. 20. The semiconductor device in the present embodiment has much in common with the semiconductor device in Embodiment 5, and only a difference from the semiconductor device in Embodiment 5 will be described.

As illustrated in FIG. 25, the semiconductor device in the present embodiment has, in addition to the first trenches 74 formed in stripes in plan view, second trenches 74b (portions enclosed by dotted lines in FIG. 25) located within the n-type pillar layers 13 in a direction perpendicular to the first trenches 74 in plan view. A second side surface dielectric layer 35b is located on a side surface in each of the second trenches 74b. A second bottom surface dielectric layer, which is not illustrated, is located on a bottom surface of each of the second trenches 74b. A second gate electrode 71b is located in each of the second trenches 74b to face the first well layer 21 and the first source layer 22 through the second side surface dielectric layer 35b. As illustrated in FIG. 25, the second trenches 74b are connected to the first trenches 74 in plan view.

A method of manufacturing the semiconductor device in the present embodiment will be described next. The method of manufacturing the semiconductor device in the present embodiment is similar to the method of manufacturing the semiconductor device in Embodiment 5 except that the second trenches 74b are formed. The second trenches 74b can be manufactured by a similar manufacturing method to the first trenches 74.

As described above, the semiconductor device in the present embodiment has the second trenches 74b located within the n-type pillar layers 13 in the direction, in plan view, perpendicular to the first trenches 74 formed in stripes in plan view. Due to the presence of the second trenches 74b, the channel width density is higher than that of the semiconductor device in Embodiment 5. As a result, the effect of reducing the channel resistance of the semiconductor device is further produced.

In the semiconductor device in the present embodiment, an electric field applied to the first bottom surface dielectric layer 36a by the p-type pillar layer 14 depleted in the off state of the semiconductor device in the present embodiment is reduced as in Embodiment 1. As a result, the effect of yielding a highly reliable semiconductor device is produced.

The second well layer 26 and the second source layer 27 may not be located within the p-type pillar layer 14 in the present embodiment. In this case, addition of the process such as the process of forming the p-type semiconductor layer for electric field reduction is not necessary in the existing semiconductor device having the super junction structure.

The first gate electrode 71 and the second gate electrode 71b may not directly be connected. The first gate electrode 71 and the second gate electrode 71b are only required to be electrically connected. A similar effect is produced in this case.

Embodiment 8

Figure 26:
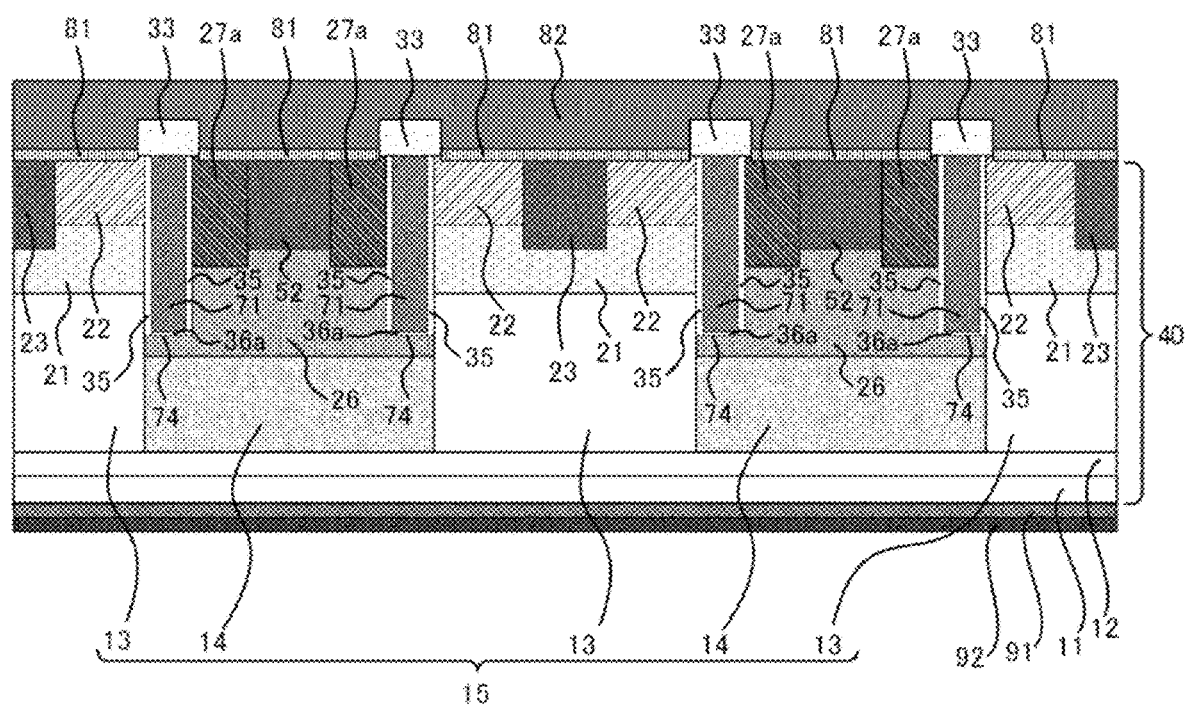
FIG. 26 is a cross-sectional view along the line H-H' of a semiconductor device in Embodiment 8 of the present invention.
Figure 27:
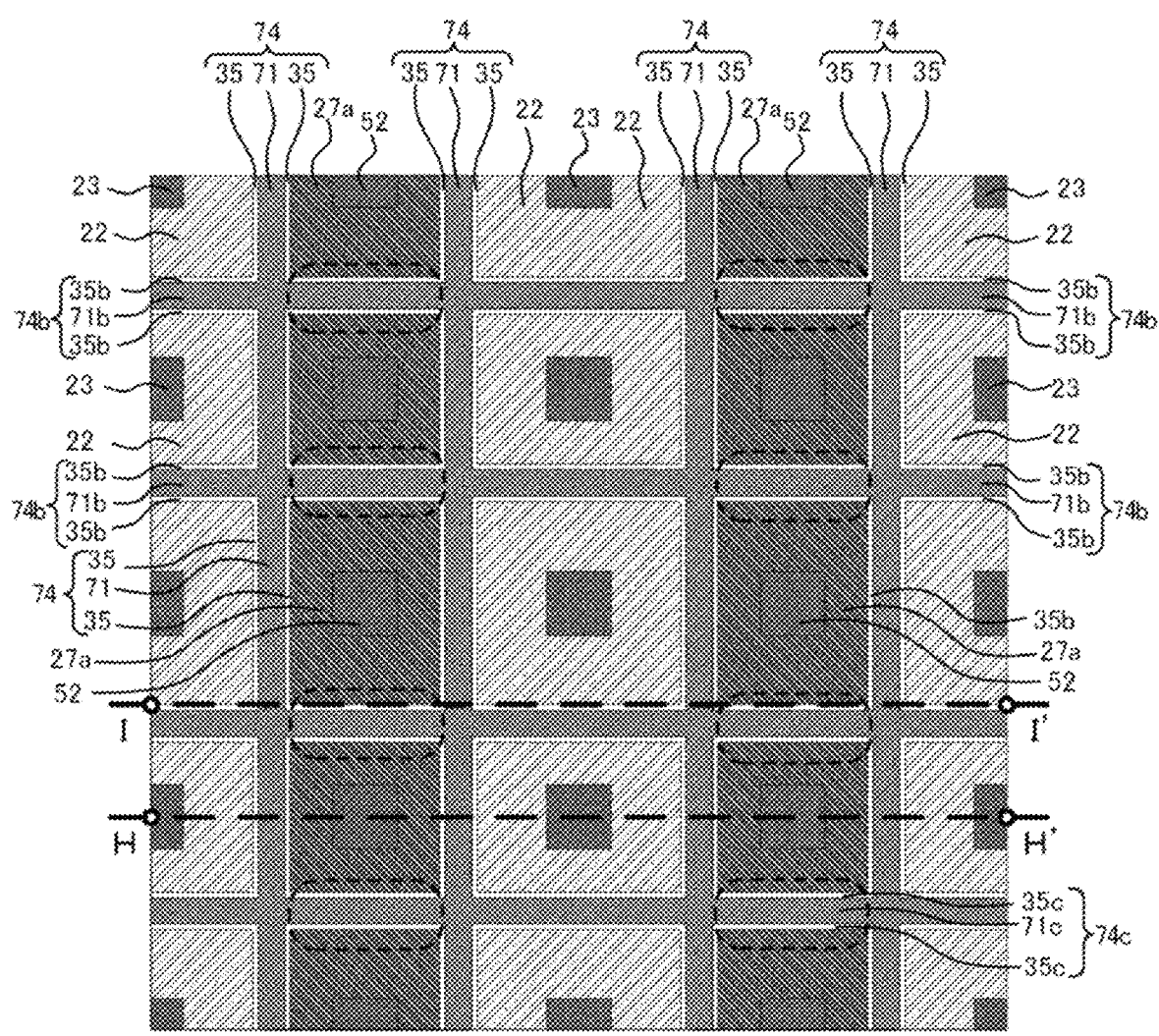
FIG. 27 is a plan view illustrating a top surface of a semiconductor region of the semiconductor device in Embodiment 8 of the present invention.

A configuration in the present embodiment will be described below with use of FIGS. 26 to 29. FIG. 26 is a cross-sectional view of a semiconductor device in the present embodiment along an auxiliary line H-H' of FIG. 27. FIG. 27 is a plan view of the semiconductor device in the present embodiment. The cross-sectional view of the semiconductor device in the present embodiment along the line H-H' of FIG. 27 has a similar configuration to the cross-sectional view of the semiconductor device in Embodiment 5 along the line E-E' illustrated in FIG. 20.

As illustrated in FIG. 27, the semiconductor device in the present embodiment has, in addition to the first trenches 74 formed in stripes in plan view, the second trenches 74b formed within the n-type pillar layers 13 in the perpendicular direction in plan view as in Embodiment 7. Furthermore, third trenches 74c (portions enclosed by dotted lines in FIG. 27) are located within the p-type pillar layers 14 on extensions of the second trenches 74b. The third trenches 74c are located in the direction perpendicular to the first trenches 74 in plan view. A third side surface dielectric layer 35c is located on a side surface in each of the third trenches 74c. A third bottom surface dielectric layer, which is not illustrated, is located on a bottom surface of each of the third trenches 74c. A third gate electrode 71c is located in each of the third trenches 74c to face the second well layer 26 and the second source layer 27a through the third side surface dielectric layer 35c. The first trenches 74 are connected to the second trenches 74b in plan view. The third trenches 74c are connected to the second trenches 74b in plan view.

Figure 28:
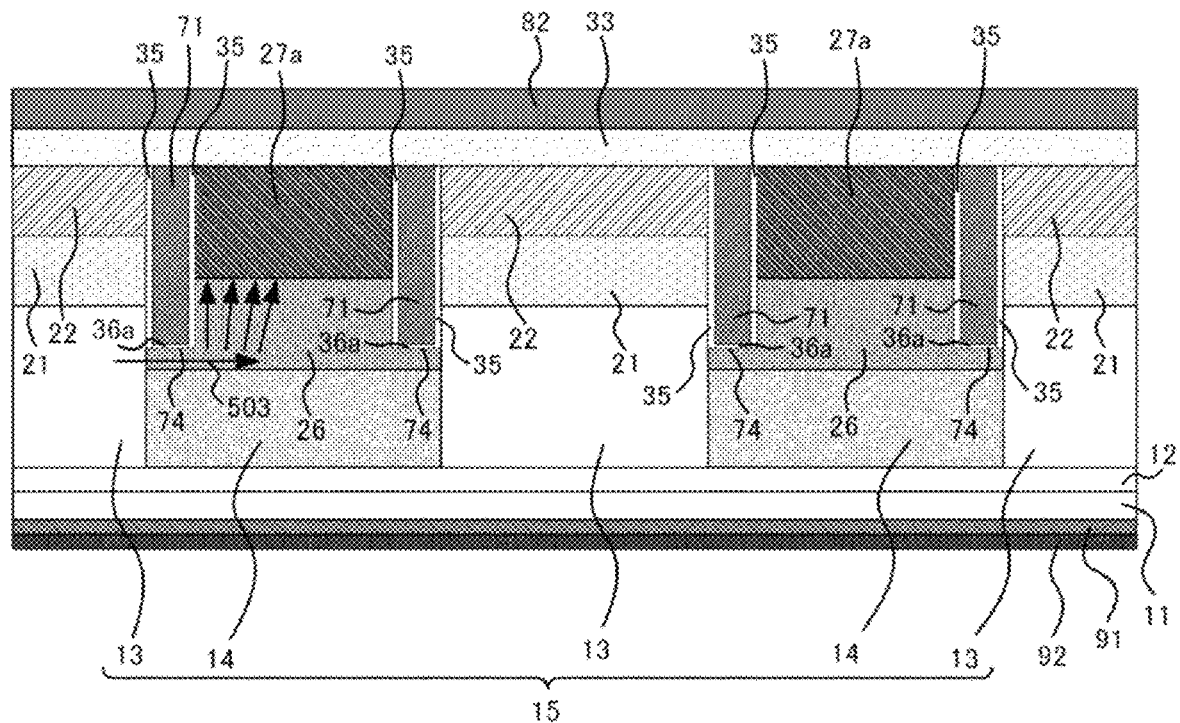
FIG. 28 is a cross-sectional view along the line I-I' of the semiconductor device in Embodiment 8 of the present invention.
Figure 29:
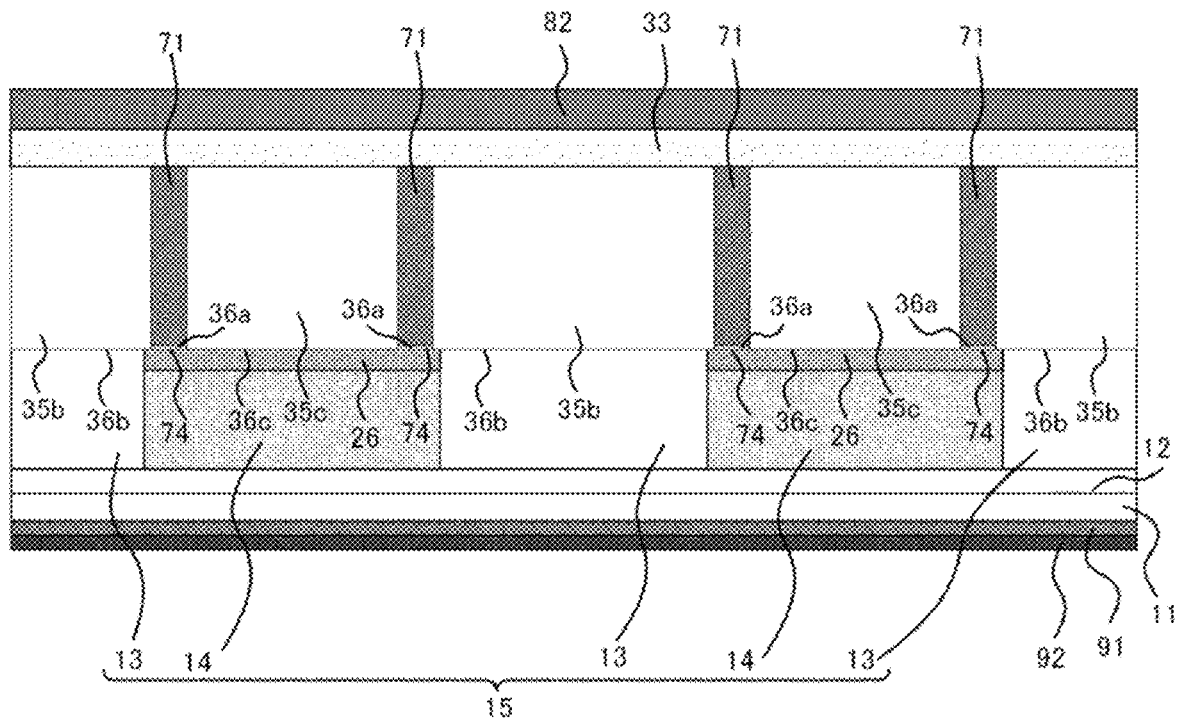
FIG. 29 is a cross-sectional view along the line I-I' of the semiconductor device in Embodiment 8 of the present invention.

FIGS. 28 and 29 are cross-sectional views of the semiconductor device in the present embodiment along an auxiliary line I-I' of FIG. 27. FIG. 28 is a cross-sectional view along the line I-I' as viewed from the top of the page of FIG. 27. FIG. 29 is a cross-sectional view along the line I-I' as viewed from the bottom of the page of FIG. 27. According to FIGS. 28 and 29, the third gate electrode 71c is located to face the second well layer 26 through the third side surface dielectric layer 35c and a third bottom surface dielectric layer 36c.

According to FIGS. 28 and 29, in the on state of the semiconductor device, a portion of the second well layer 26 being in contact with the first side surface dielectric layer 35 and the third side surface dielectric layer 35c is inverted to form a channel. As a result, a current flows in a direction of an arrow 503 through application of a positive voltage to the drain electrode 92 as illustrated in FIG. 28. That is to say, the channel width density can be increased. Thus, in the semiconductor device in the present embodiment, the channel resistance on the side of the second well layer 26 is reduced, and the on-resistance of the semiconductor device is reduced compared with the semiconductor device in Embodiment 7.

A method of manufacturing the semiconductor device in the present embodiment will be described next. The method of manufacturing the semiconductor device in the present embodiment is similar to the method of manufacturing the semiconductor device in Embodiment 7 except that the third trenches 74c are formed. The third trenches 74c can be manufactured by a similar manufacturing method to the first trenches 74 and the second trenches 74b.

As described above, the semiconductor device in the present embodiment has, in addition to the first trenches 74 and the second trenches 74b, the third trenches 74c formed within the p-type pillar layers 14 in the direction perpendicular to the first trenches 74. Due to the presence of the third trenches 74c, the channel width density is higher than that of the semiconductor device in Embodiment 7. As a result, the effect of reducing the channel resistance of the semiconductor device is further produced.

The third gate electrode 71c may not directly be connected to the first gate electrode 71 and the second gate electrode 71b. The third gate electrode 71c is only required to be electrically connected to the first gate electrode 71 and the second gate electrode 71b. A similar effect is produced in this case.

The semiconductor device in the present embodiment may not have the second trenches 74b. Also in this case, the channel width density is higher than that of the semiconductor device in Embodiment 5 due to the presence of the third trenches 74c. As a result, the effect of reducing the channel resistance of the semiconductor device is further produced.

Embodiment 9

Figure 31:
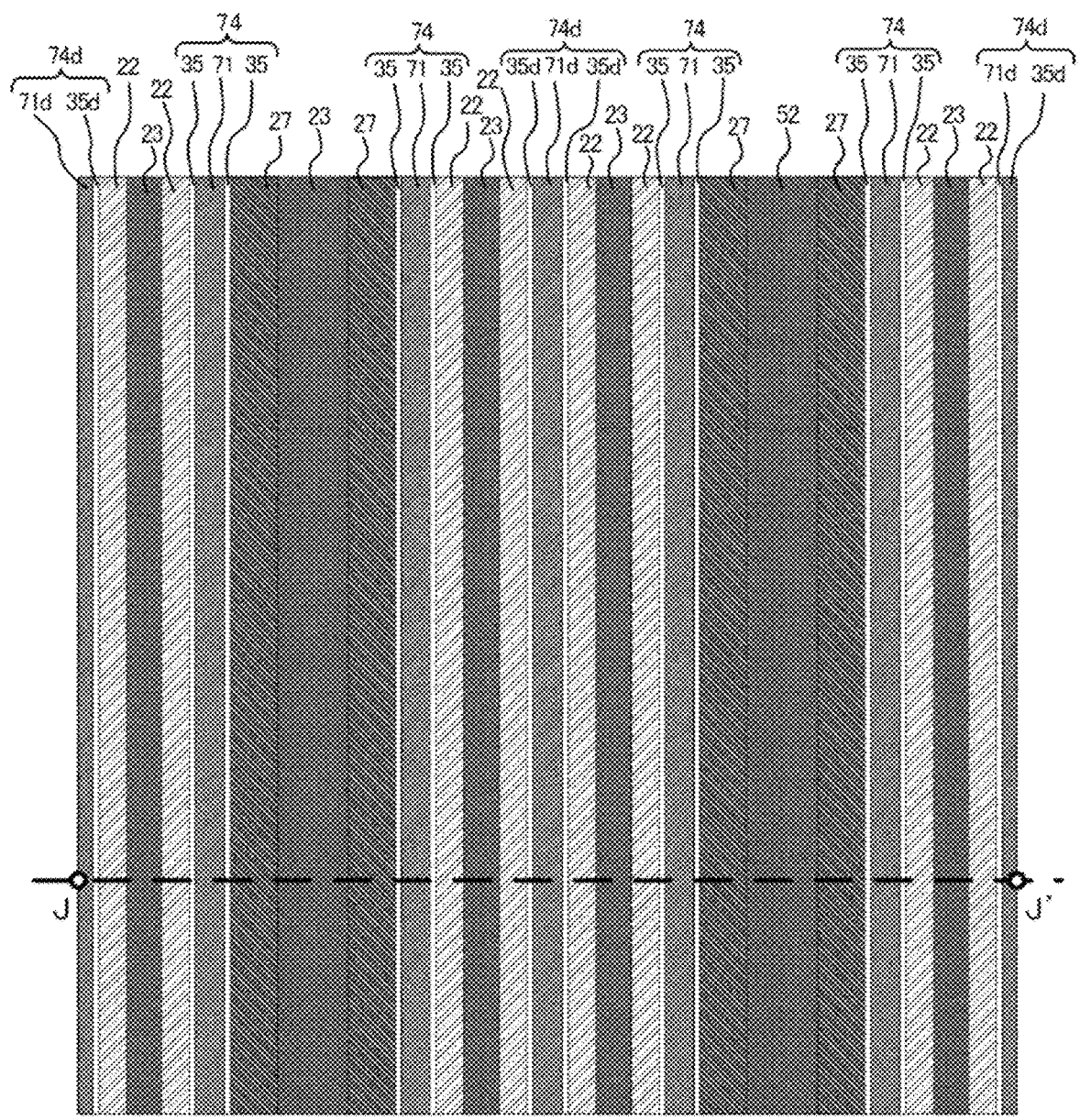
FIG. 31 is a plan view illustrating a top surface of a semiconductor region of the semiconductor device in Embodiment 9 of the present invention.

A configuration in the present embodiment will be described below with use of FIGS. 30 and 31. FIG. 30 is a cross-sectional view of a semiconductor device in the present embodiment along an auxiliary line J-J' of FIG. 31. FIG. 31 is a plan view illustrating a top surface of a semiconductor region of the semiconductor device in the present embodiment. The semiconductor device in the present embodiment has much in common with the semiconductor device in Embodiment 5, and only a difference from the semiconductor device in Embodiment 5 will be described.

As illustrated in FIG. 30, the semiconductor device in the present embodiment has, in addition to the first trenches 74, second trenches 74d located within the n-type pillar layers 13. As illustrated in FIG. 31, the second trenches 74d are located parallel to the first trenches 74. A second side surface dielectric layer 35d is located on a side surface in each of the second trenches 74d. A second bottom surface dielectric layer 36d is located on a bottom surface of each of the second trenches 74d. A second gate electrode 71d is located in each of the second trenches to face the first well layer 21 and the first source layer 22 through the second side surface dielectric layer 35d.

A method of manufacturing the semiconductor device in the present embodiment will be described next. The method of manufacturing the semiconductor device in the present embodiment is similar to the method of manufacturing the semiconductor device in Embodiment 5 except that the second trenches 74d are formed. The second trenches 74d can be manufactured by a similar manufacturing method to the first trenches 74.

As described above, the semiconductor device in the present embodiment has, in addition to the first trenches 74, the second trenches 74d located within the n-type pillar layers 13 in a direction parallel to the first trenches 74. Due to the presence of the second trenches 74d, the channel width density is higher than that of the semiconductor device in Embodiment 5. As a result, the effect of reducing the channel resistance of the semiconductor device is further produced.

Embodiment 10

Figure 32:
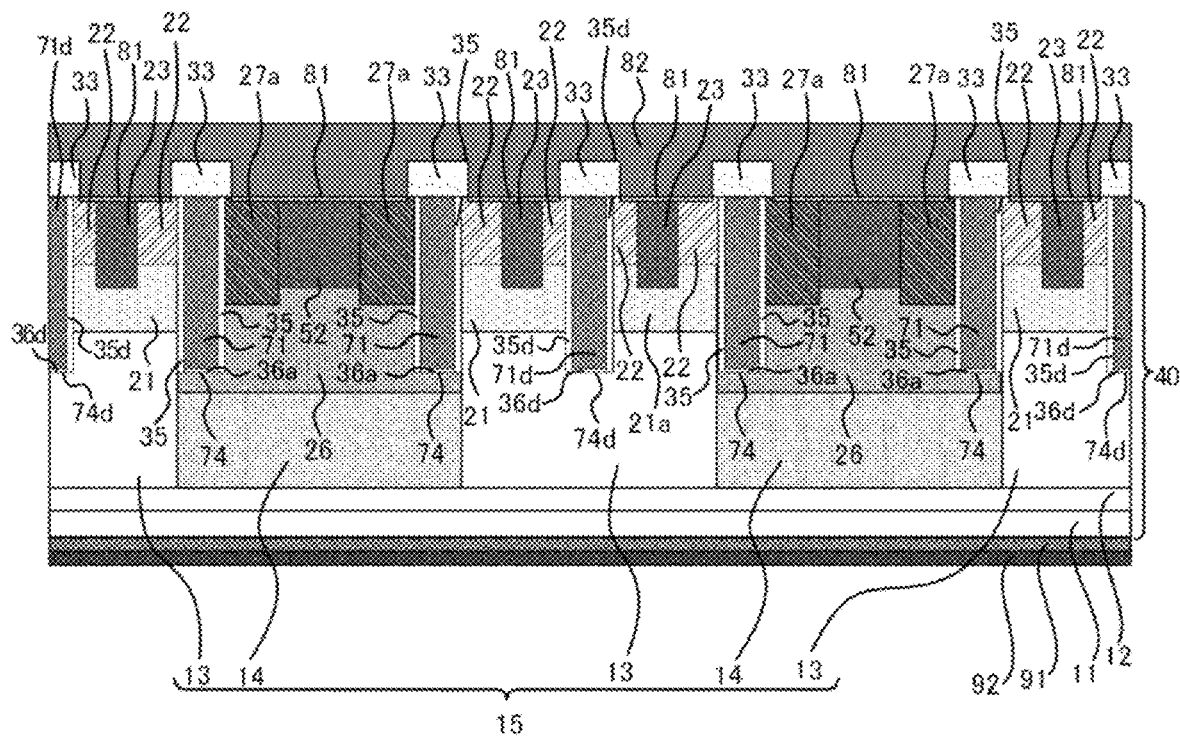
FIG. 32 is a cross-sectional view along the line K-K' of a semiconductor device in Embodiment 10 of the present invention.
Figure 33:
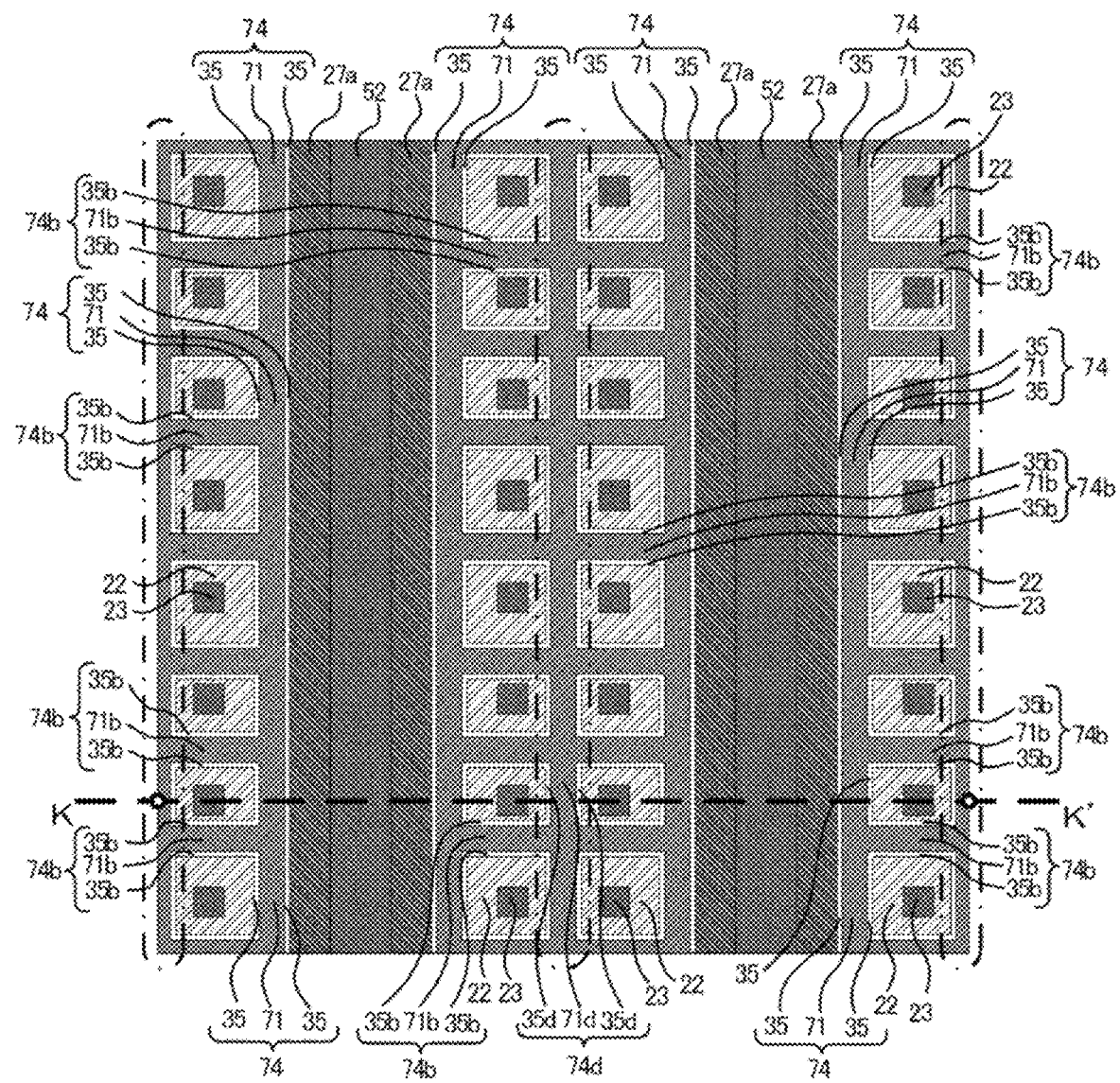
FIG. 33 is a plan view illustrating a top surface of a semiconductor region of the semiconductor device in Embodiment 10 of the present invention.

A configuration in the present embodiment will be described below with use of FIGS. 32 and 33. FIG. 32 is a cross-sectional view of a semiconductor device in the present embodiment along an auxiliary line K-K' of FIG. 33. FIG. 33 is a plan view illustrating a top surface of a semiconductor region of the semiconductor device in the present embodiment. The cross-sectional view of the semiconductor device in the present embodiment along the line K-K' illustrated in FIG. 32 has a similar configuration to the cross-sectional view of the semiconductor device in Embodiment 9 along the line J-J' illustrated in FIG. 30. The semiconductor device in the present embodiment has much in common with the semiconductor device in Embodiment 9, and only a difference from the semiconductor device in Embodiment 9 will be described.

As illustrated in FIG. 33, the semiconductor device in the present embodiment has the second trenches 74b located in the direction, in plan view, perpendicular to the first trenches 74 and the second trenches 74d (portions enclosed by alternate long and short dashed lines in FIG. 33) formed in stripes in plan view. The second trenches 74b are located within the n-type pillar layers 13. The second gate electrode 71b is located in each of the second trenches 74b. The second gate electrode 71b is located to face the first well layer 21 and the first source layer 22 through the second side surface dielectric layer 35b. The second trenches 74b are connected to the first trenches 74 in plan view. The second trenches 74b are connected to the second trenches 74d in plan view.

A method of manufacturing the semiconductor device in the present embodiment will be described next. The method of manufacturing the semiconductor device in the present embodiment is similar to the method of manufacturing the semiconductor device in Embodiment 9 except that the second trenches 74b are formed. The second trenches 74b can be manufactured by a similar manufacturing method to the first trenches 74 and the second trenches 74d.

As described above, the semiconductor device in the present embodiment has the second trenches 74b located in the direction, in plan view, perpendicular to the first trenches 74 and the second trenches 74d formed in stripes in plan view. Due to the presence of the second trenches 74b, the channel width density is higher than that of the semiconductor device in Embodiment 9. As a result, the effect of reducing the channel resistance of the semiconductor device is further produced.

The first gate electrode 71, the second gate electrode 71d, and the second gate electrode 71b may not directly be connected. The first gate electrode 71, the second gate electrode 71d, and the second gate electrode 71b are only required to be electrically connected. A similar effect is produced in this case.

Embodiment 11

Figure 34:
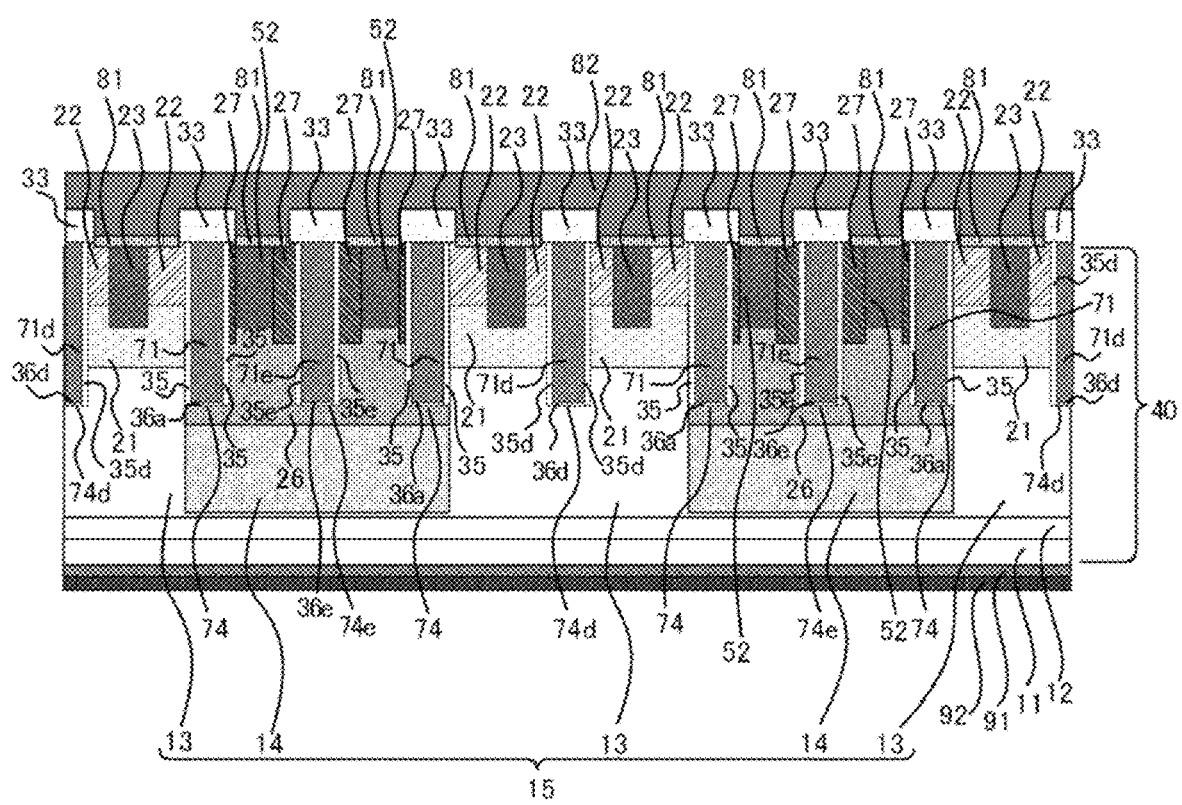
FIG. 34 is a cross-sectional view along the line L-L' of a semiconductor device in Embodiment 11 of the present invention.
Figure 35:
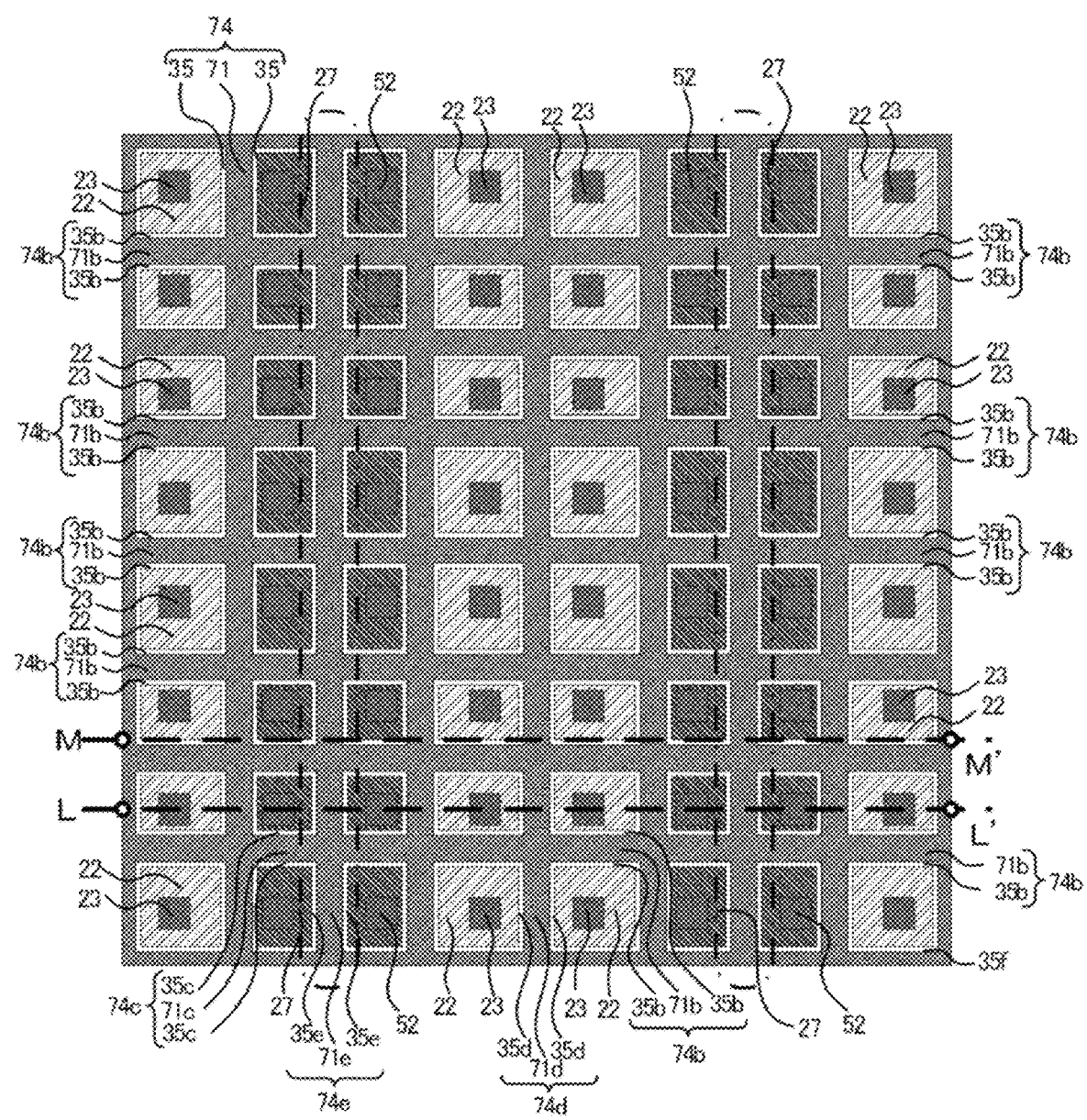
FIG. 35 is a plan view illustrating a top surface of a semiconductor region of the semiconductor device in Embodiment 11 of the present invention.

A configuration in the present embodiment will be described below with use of FIGS. 34 to 37. FIG. 34 is a cross-sectional view of a semiconductor device in the present embodiment along an auxiliary line L-L' of FIG. 35. FIG. 35 is a plan view illustrating a top surface of a semiconductor region of the semiconductor device in the present embodiment. The semiconductor device in the present embodiment has much in common with the semiconductor device in Embodiment 10, and only a difference from the semiconductor device in Embodiment 10 will be described.

As illustrated in FIG. 34, the semiconductor device in the present embodiment has, in addition to the first trenches 74 and the second trenches 74d, fourth trenches 74e (portions enclosed by alternate long and short dashed lines in FIG. 35) located within the p-type pillar layers 14. As illustrated in FIG. 35, the fourth trenches 74e are located parallel to the first trenches 74 and the second trenches 74d in plan view. A fourth gate electrode 71e is located in each of the fourth trenches 74e. A fourth side surface dielectric layer 35e is located on a side surface in each of the fourth trenches 74e. The fourth side surface dielectric layer 35e on opposite side surfaces in the fourth trench 74e is in contact with the second well layer and the second source layer. A fourth bottom surface dielectric layer 36e is located on a bottom surface of each of the fourth trenches 74e. The fourth gate electrode 71e is located in each of the fourth trenches 74e to face the second well layer 26 and the second source layer 27a through the fourth side surface dielectric layer 35e.

As illustrated in FIG. 35, the semiconductor device in the present embodiment has the second trenches 74b located within the n-type pillar layers 13 in the direction, in plan view, perpendicular to the first trenches 74 formed in stripes in plan view as in Embodiment 10. Furthermore, the third trenches 74c are located on the extensions of the second trenches 74b. The third trenches 74c are located within the p-type pillar layers 14. The third gate electrode 71c is located in each of the third trenches 74c.

As illustrated in FIG. 35, the semiconductor device in the present embodiment further has the second trenches 74d located in the direction, in plan view, parallel to the first trenches 74 formed in stripes in plan view as in Embodiment 10. The second trenches 74d are located within the n-type pillar layers 13. The fourth trenches 74e are located in the direction, in plan view, parallel to the first trenches 74 formed in stripes in plan view. The fourth trenches 74e are located within the p-type pillar layers 14.

Figure 36:
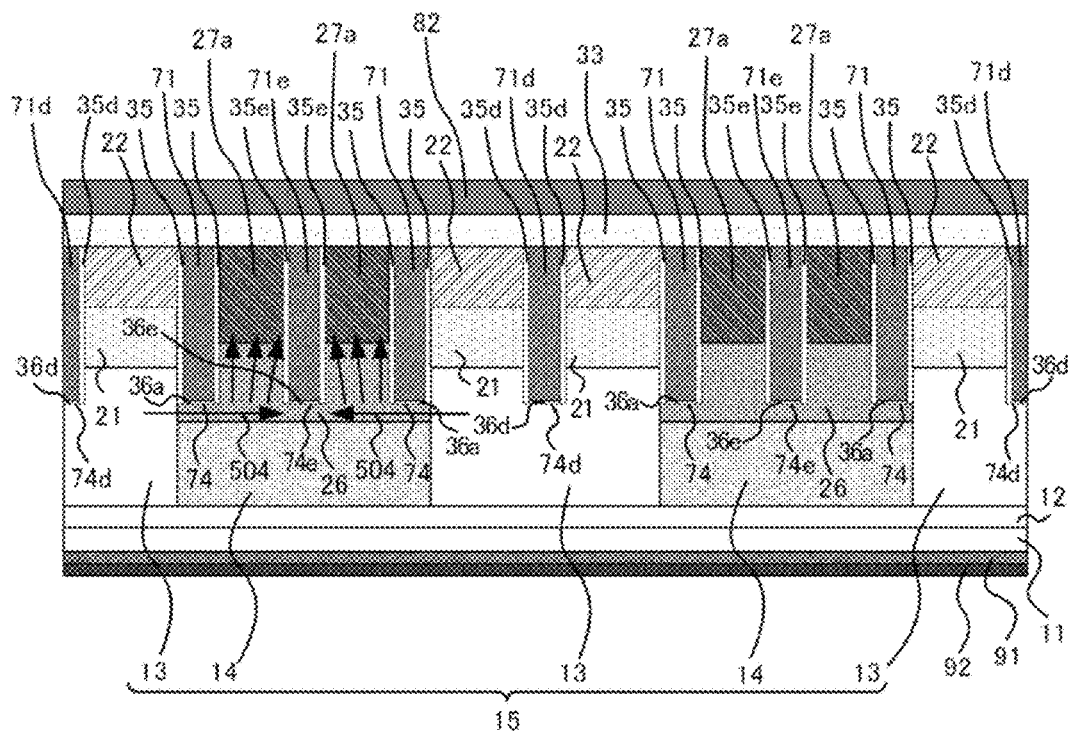
FIG. 36 is a cross-sectional view along the line M-M' of the semiconductor device in Embodiment 11 of the present invention.
Figure 37:
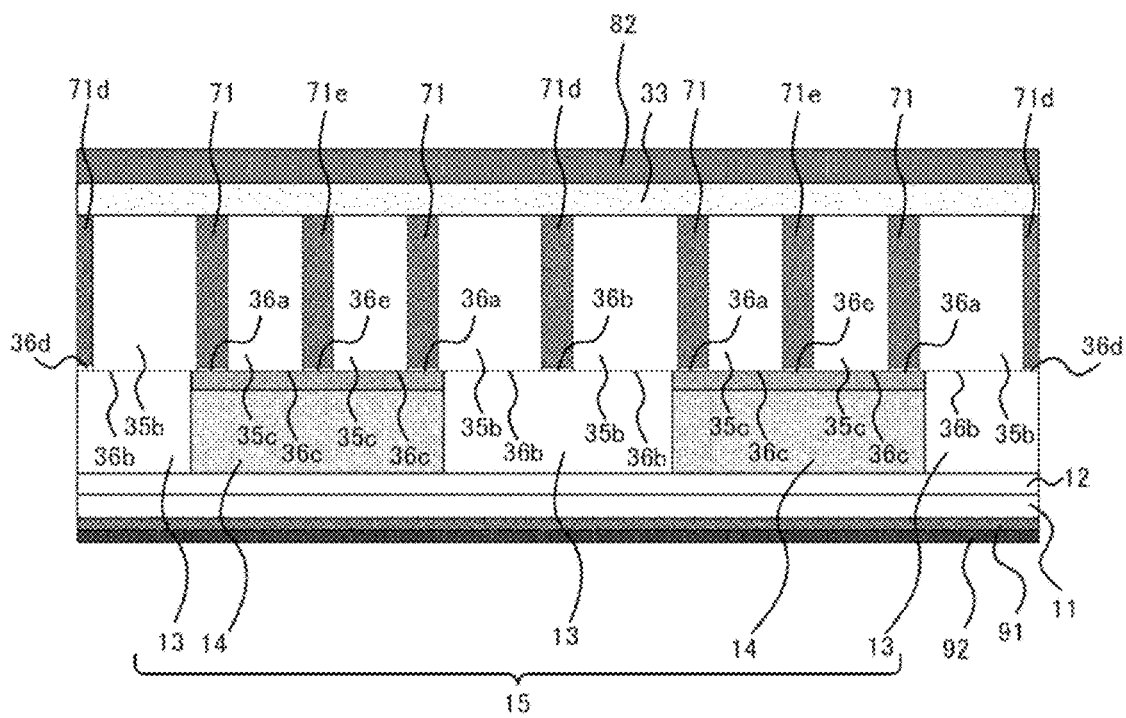
FIG. 37 is a cross-sectional view along the line M-M' of the semiconductor device in Embodiment 11 of the present invention.

FIGS. 36 and 37 are cross-sectional views of the semiconductor device in the present embodiment along an auxiliary line M-M' of FIG. 35. FIG. 36 is a cross-sectional view along the line M-M' as viewed from the top of the page of FIG. 35. FIG. 37 is a cross-sectional view along the line M-M' as viewed from the bottom of the page of FIG. 35. According to FIGS. 37 and 38, the third gate electrode 71c is located to face the second well layer 26 through the third side surface dielectric layer 35c and the third bottom surface dielectric layer 36c.

According to FIGS. 36 and 37, in the on state of the semiconductor device, a portion of the second well layer 26 being in contact with the first side surface dielectric layer 35, the third side surface dielectric layer 35c, and the fourth side surface dielectric layer 35e is inverted to form a channel. As a result, a current flows in a direction of arrows 504 through application of a positive voltage to the drain electrode 92 as illustrated in FIG. 36. That is to say, the channel width density can be increased. In the semiconductor device in the present embodiment, the channel resistance on the side of the second well layer 26 is reduced, and the on-resistance of the semiconductor device is reduced compared with the semiconductor device in Embodiment 10.

A method of manufacturing the semiconductor device in the present embodiment will be described next. The method of manufacturing the semiconductor device in the present embodiment is similar to the method of manufacturing the semiconductor device in Embodiment 10 except that the third trenches 74c and the fourth trenches 74e are formed. The third trenches 74c and the fourth trenches 74e can be manufactured by a similar manufacturing method to the first trenches 74, the second trenches 74b, and the second trenches 74d.

As described above, the semiconductor device in the present embodiment has, in addition to the first trenches 74 and the second trenches 74b, the third trenches 74c formed on the extensions of the second trenches 74b in plan view. Furthermore, the fourth trenches 74e are formed in the direction, in plan view, parallel to the first trenches 74 formed in stripes in plan view. Due to the presence of the third trenches 74c and the fourth trenches 74e, the channel width density is higher than that of the semiconductor device in Embodiment 10. As a result, the effect of reducing the channel resistance of the semiconductor device is further produced.

The third gate electrode 71c and the fourth gate electrode 71e may not directly be connected to the first gate electrode 71, the second gate electrode 71b, and the second gate electrode 71d. The third gate electrode 71c and the fourth gate electrode 71e are only required to be electrically connected to the first gate electrode 71, the second gate electrode 71b, and the second gate electrode 71d. A similar effect is produced in this case.

The semiconductor device in the present embodiment may not have the second trenches 74b and the second trenches 74d. Also in this case, the channel width density is higher than that of the semiconductor device in Embodiment 5 due to the presence of the third trenches 74c and the fourth trenches 74e. As a result, the effect of reducing the channel resistance of the semiconductor device is further produced.

Embodiment 12

Figure 39:
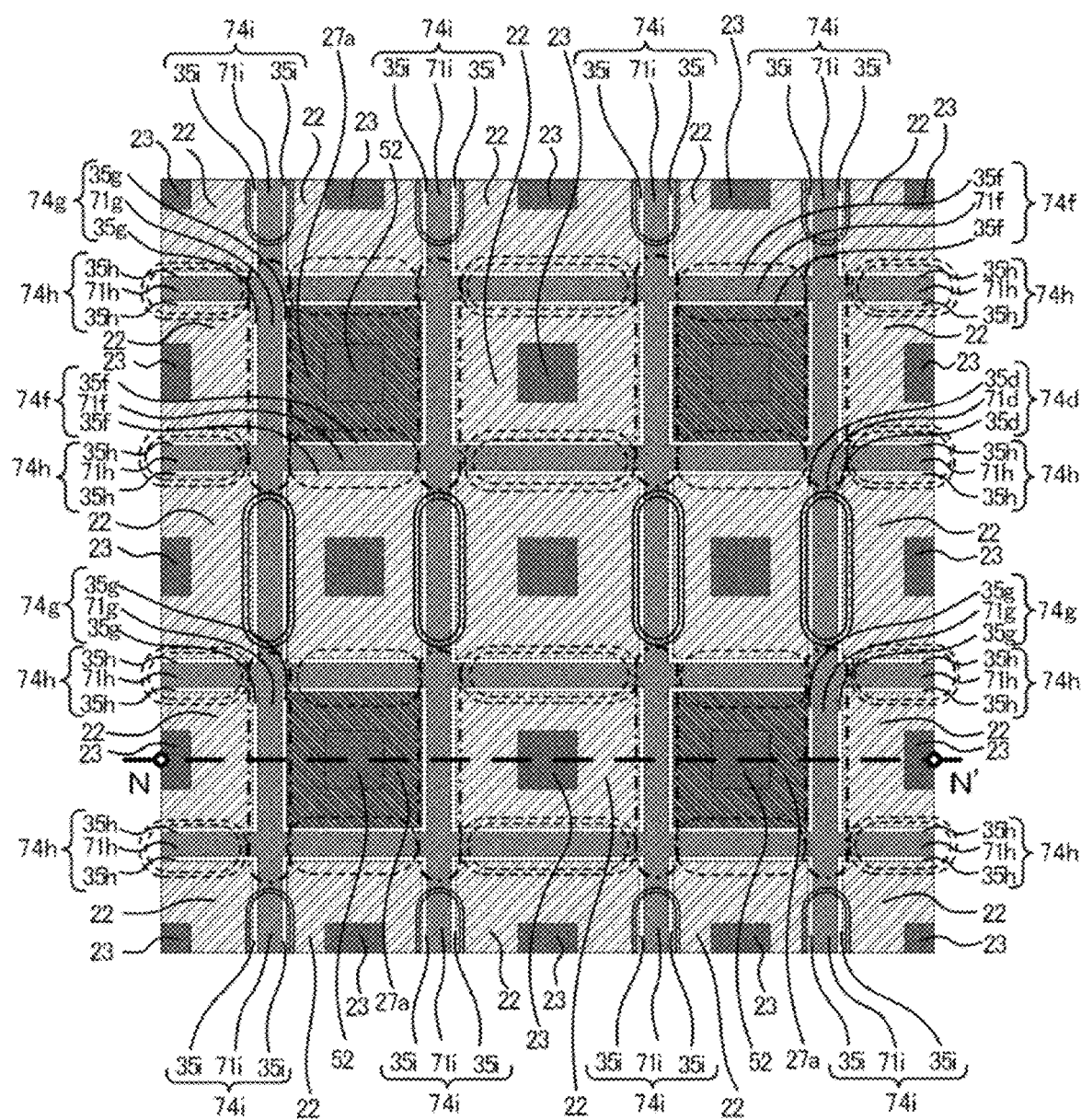
FIG. 39 is a plan view illustrating a top surface of a semiconductor region of the semiconductor device in Embodiment 12 of the present invention.

A configuration in the present embodiment will be described below with use of FIGS. 38 and 39. FIG. 38 is a cross-sectional view of a semiconductor device in the present embodiment along an auxiliary line N-N' of FIG. 39. FIG. 39 is a plan view illustrating a top surface of a semiconductor region of the semiconductor device in the present embodiment. The cross-sectional view of the semiconductor device in the present embodiment along the line N-N' illustrated in FIG. 38 has a similar configuration to the cross-sectional view of the semiconductor device in Embodiment 5 along the line E-E' illustrated in FIG. 20. The semiconductor device in the present embodiment has much in common with the semiconductor device in Embodiment 7, and only a difference from the semiconductor device in Embodiment 7 will be described.

As illustrated in FIG. 38, the semiconductor device in the present embodiment includes a super junction layer 15a in place of the super junction layer 15. The super junction layer 15a includes n-type pillar layers 13a in place of the n-type pillar layers 13. The super junction layer 15a includes p-type pillar layers 14a in place of the p-type pillar layers 14. The n-type pillar layers 13a are arranged in a grid in plan view. The p-type pillar layers 14a are formed in dots in regions separated by the n-type pillar layers 13a arranged in a grid in plan view.

The first trenches 74 are located at boundaries between the n-type pillar layers 13a and the p-type pillar layers 14a. The first trenches 74 as a whole are within the p-type pillar layers 14a. As illustrated in FIG. 39, the first trenches 74 include first trenches 74f and first trenches 74g.

As illustrated in FIG. 39, the first trenches 74f (portions enclosed by dotted lines in FIG. 39) are located at the boundaries between the n-type pillar layers 13a and the p-type pillar layers 14a. The first trenches 74f as a whole are within the p-type pillar layers 14a. Each of the first trenches 74f has a side surface and a bottom surface. The bottom surface of the first trench 74f is at a deeper location than the first well layer 21.

A first side surface dielectric layer 35f made of silicon dioxide is formed on the side surface of the first trench 74f as a whole. A first bottom surface dielectric layer, which is not illustrated, made of silicon dioxide is formed on the bottom surface of first trench 74f as a whole. The first side surface dielectric layer 35f is located to be in contact with the first well layer 21 and the first source layer 22. The first bottom surface dielectric layer, which is not illustrated, is located to be in contact with the p-type pillar layer 14a. First gate electrodes 71f are located in the first trenches 74f. Each of the first gate electrodes 71f faces the first well layer 21 and the first source layer 22 through the first side surface dielectric layer 35f. The first gate electrode 71f faces the p-type pillar layer 14a through the first bottom surface dielectric layer, which is not illustrated. Doped polysilicon is used as a material for the first gate electrodes 71f, for example.

As illustrated in FIG. 39, the first trenches 74g (portions enclosed by alternate long and short dashed lines in FIG. 39) are located at the boundaries between the n-type pillar layers 13a and the p-type pillar layers 14a. The first trenches 74g as a whole are within the p-type pillar layers 14a. Each of the first trenches 74g has a side surface and a bottom surface. The bottom surface of the first trench 74g is at a deeper location than the first well layer 21. As illustrated in FIG. 39, the first trenches 74g are located in a direction perpendicular to the first trenches 74f in plan view. The first trenches 74f and the first trenches 74g are connected to each other, and are located to surround outer peripheries of the p-type pillar layers 14a formed in dots in plan view.

A first side surface dielectric layer 35g made of silicon dioxide is formed on the side surface of each of the first trenches 74g as a whole. A first bottom surface dielectric layer 36g made of silicon dioxide is formed on the bottom surface of the first trench 74g as a whole. The first side surface dielectric layer 35g is located to be in contact with the first well layer 21 and the first source layer 22. The first bottom surface dielectric layer 36g is located to be in contact with the p-type pillar layer 14a. First gate electrodes 71g are located in the first trenches 74g. Each of the first gate electrodes 71g faces the first well layer 21 and the first source layer 22 through the first side surface dielectric layer 35g. The first gate electrode 71g faces the p-type pillar layer 14a through the first bottom surface dielectric layer 36g. Doped polysilicon is used as a material for the first gate electrodes 71g, for example.

As illustrated in FIG. 39, second trenches 74h (portions enclosed by double dotted lines in FIG. 39) are located within the n-type pillar layers 13a. The second trenches 74h are located on extensions of the first trenches 74f in plan view. The second trenches 74h are located in a direction perpendicular to the first trenches 74g in plan view. A second side surface dielectric layer 35h is located on a side surface in each of the second trenches 74h. A second bottom surface dielectric layer, which is not illustrated, is located on a bottom surface of each of the second trenches 74h. A second gate electrode 71h is located in each of the second trenches 74h to face the first well layer 21 and the first source layer 22 through the second side surface dielectric layer 35h. As illustrated in FIG. 39, the second trenches 74h are connected to the first trenches 74g in plan view.

As illustrated in FIG. 39, second trenches 74i (portions enclosed by double solid lines in FIG. 39) are located within the n-type pillar layers 13a. The second trenches 74i are located on extensions of the first trenches 74g in plan view. The second trenches 74i are located in the direction perpendicular to the first trenches 74f in plan view. A second side surface dielectric layer 35i is located on a side surface in each of the second trenches 74i. A second bottom surface dielectric layer, which is not illustrated, is located on a bottom surface of each of the second trenches 74i. A second gate electrode 71i is located in each of the second trenches 74i to face the first well layer 21 and the first source layer 22 through the second side surface dielectric layer 35i. As illustrated in FIG. 39, the second trenches 74i are connected to the first trenches 74g in plan view. The first trenches 74f, the first trenches 74g, the second trenches 74h, and the second trenches 74i are formed in a grid in plan view.

A method of manufacturing the semiconductor device in the present embodiment will be described next. In the method of manufacturing the semiconductor device in the present embodiment, the n-type pillar layers 13a are formed in a grid, and the p-type pillar layers 14a are formed in dots in regions closed by the n-type pillar layers 13a in the manufacturing method in Embodiment 7. The first trenches 74f and the first trenches 74g are formed along the peripheries of the p-type pillar layers 14a formed in dots, and the first trenches 74f, the first trenches 74g, the second trenches 74h, and the second trenches 74i are only required to be formed in a grid in plan view.

As described above, the semiconductor device in the present embodiment includes the first bottom surface dielectric layer, which is not illustrated, located on the bottom surface of each of the first trenches 74f and the first gate electrode 71f located in the first trench 74f, facing the first well layer 21 and the first source layer 22 through the first side surface dielectric layer 35f, and facing the p-type pillar layer 14a formed in a dot through the first bottom surface dielectric layer, which is not illustrated. As a result, an electric field applied to the first bottom surface dielectric layer 36f by the p-type pillar layer 14a depleted in the off state of the semiconductor device in the present embodiment is reduced as in the semiconductor device in Embodiment 1. As a result, the effect of yielding a highly reliable semiconductor device is produced.

The semiconductor device in the present embodiment also includes the first bottom surface dielectric layer 36g located on the bottom surface of each of the first trenches 74g and the first gate electrode 71g located in the first trench 74g, facing the first well layer 21 and the first source layer 22 through the first side surface dielectric layer 35g, and facing the p-type pillar layer 14a formed in a dot through the first bottom surface dielectric layer 36g. As a result, an electric field applied to the first bottom surface dielectric layer 36g by the p-type pillar layer 14a depleted in the off state of the semiconductor device in the present embodiment is reduced as in the semiconductor device in Embodiment 1. As a result, the effect of yielding a highly reliable semiconductor device is produced.

The semiconductor device in the present embodiment has, in addition to the first trenches 74g, the second trenches 74h, and the second trenches 74i, the first trenches 74f located at the boundaries between the n-type pillar layers 13a and the p-type pillar layers 14a. The first trenches 74f are located in the direction perpendicular to the first trenches 74g in plan view. The first trenches 74f as a whole are within the p-type pillar layers 14a. Due to the presence of the first trenches 74f, the channel width density is higher than that of the semiconductor device in Embodiment 7. As a result, the effect of reducing the channel resistance of the semiconductor device is further produced.

The second gate electrode 71h and the second gate electrode 71i may not directly be connected to the first gate electrode 71g. The second gate electrode 71h and the second gate electrode 71i are only required to be electrically connected to the first gate electrode 71g. A similar effect is produced in this case.

The semiconductor device in the present embodiment may not have the second trenches 74h and the second trenches 74i. Also in this case, an electric field applied to the first bottom surface dielectric layer 36g and the first bottom surface dielectric layer, which is not illustrated, in each of the first trenches 74f by the p-type pillar layer 14a depleted in the off state of the semiconductor device in the present embodiment is reduced as in Embodiment 1. As a result, the effect of yielding a highly reliable semiconductor device is produced.

The second well layer 26 and the second source layer 27 may not be located within the p-type pillar layer 14a in the present embodiment. In this case, addition of the process such as the process of forming the p-type semiconductor layer for electric field reduction is not necessary in the existing semiconductor device having the super junction structure as in Embodiment 1.

Embodiment 13

Figure 40:
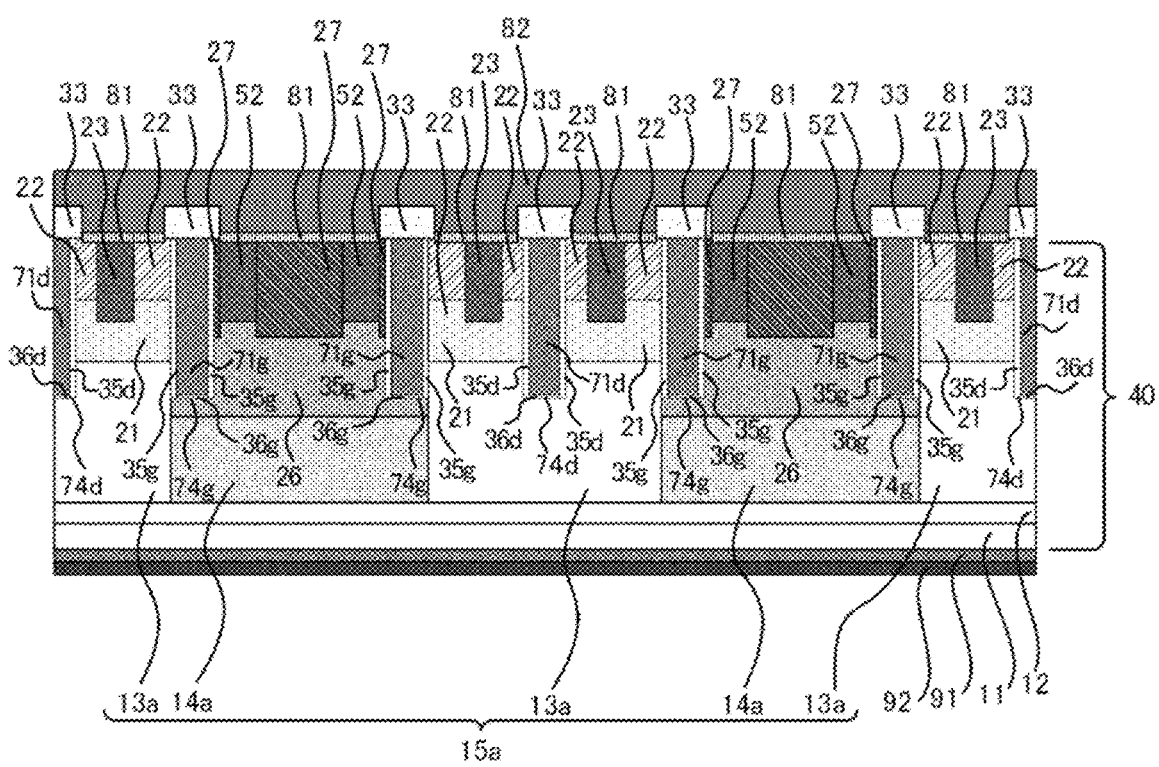
FIG. 40 is a cross-sectional view along the line O-O' of a semiconductor device in Embodiment 13 of the present invention.
Figure 41:
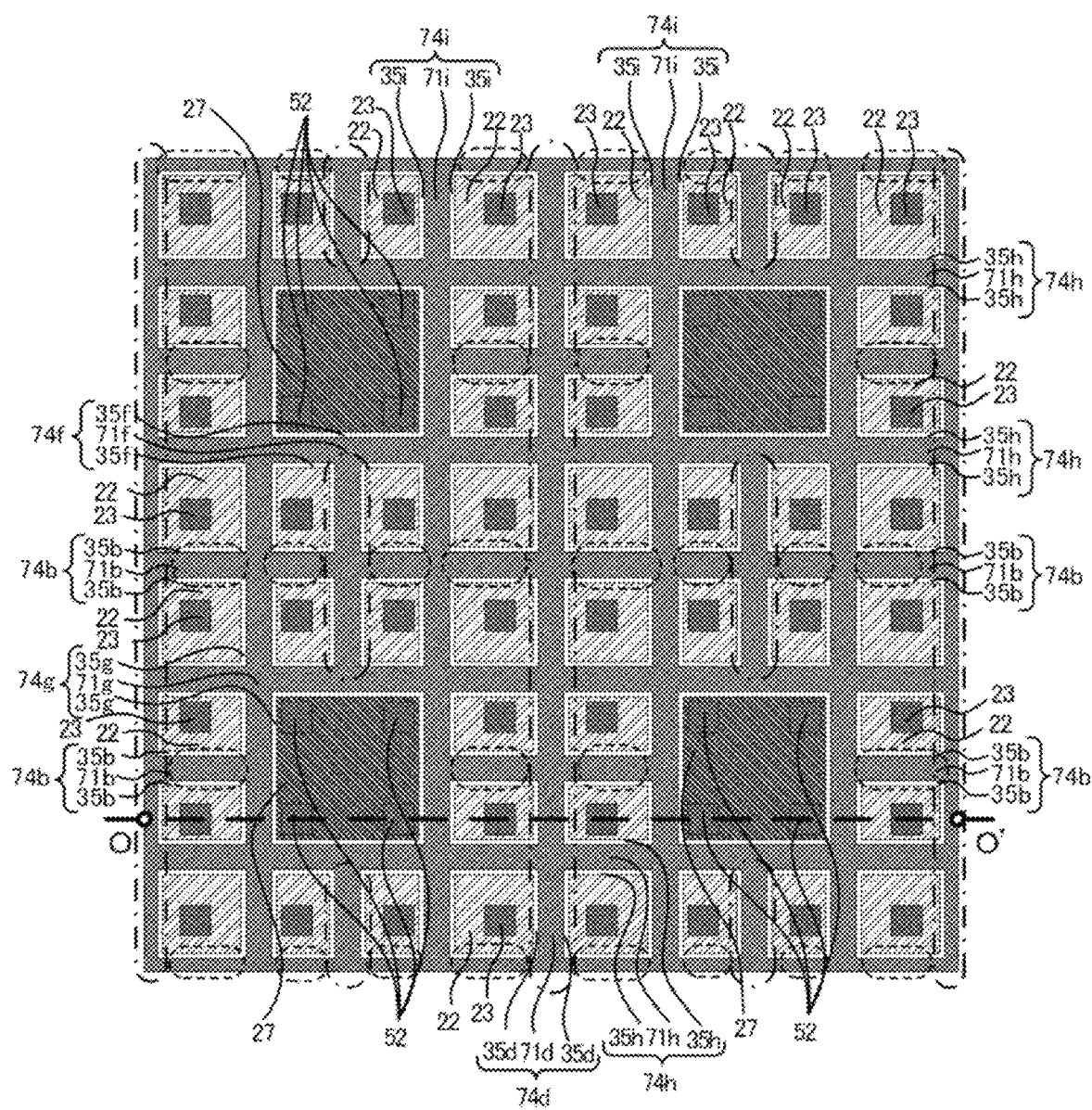
FIG. 41 is a plan view illustrating a top surface of a semiconductor region of the semiconductor device in Embodiment 13 of the present invention.

A configuration in the present embodiment will be described below with use of FIGS. 40 and 41. FIG. 40 is a cross-sectional view of a semiconductor device in the present embodiment along an auxiliary line O-O' of FIG. 41. FIG. 41 is a plan view illustrating a top surface of a semiconductor region of the semiconductor device in the present embodiment. The semiconductor device in the present embodiment has much in common with the semiconductor device in Embodiment 12, and only a difference from the semiconductor device in Embodiment 12 will be described.

As illustrated in FIG. 40, in the semiconductor device in the present embodiment, the second trenches 74d are located within the n-type pillar layers 13 in addition to the first trenches 74 in the semiconductor device in Embodiment 12.

As illustrated in FIG. 41, in the semiconductor device in the present embodiment, the second trenches 74d (portions enclosed by alternate long and short dashed lines in FIG. 41) are located between the first trenches 74g and between the second trenches 74i in plan view in the semiconductor device in Embodiment 12. The second trenches 74d are located parallel to the first trenches 74g in plan view. The second trenches 74d are located parallel to the second trenches 74i in plan view. The number of second trenches 74d located between the first trenches 74g and between the second trenches 74i in plan view is one in FIG. 41, but may be two or more.

As illustrated in FIG. 41, the second trenches 74b (portions enclosed by dotted lines in FIG. 41) are further located between the first trenches 74f and between the second trenches 74h in plan view. The second trenches 74b are located parallel to the first trenches 74f in plan view. The second trenches 74b are located parallel to the second trenches 74h in plan view. The number of second trenches 74b located between the first trenches 74f and between the second trenches 74h in plan view is one in FIG. 41, but may be two or more. As illustrated in FIG. 41, the second trenches 74*b* are connected to the second trenches 74*d* in plan view. The second trenches 74*b* are also connected to the first trenches 74*g* or the second trenches 74*i* in plan view.

As illustrated in FIGS. 40 and 41, four second p+-type layers 52 are located within the second well layer 26 to be in contact with the front surface ohmic electrode 81. The number of second p+-type layers 52 are described to be four above, but may be any number.

A method of manufacturing the semiconductor device in the present embodiment will be described next. In the method of manufacturing the semiconductor device in the present embodiment, the second trenches 74*d* are only required to be located between the first trenches 74*g* and between the second trenches 74*i* in plan view in the manufacturing method in Embodiment 12. The second trenches 74*b* are also only required to be located between the first trenches 74*f* and between the second trenches 74*h* in plan view.

As described above, in the semiconductor device in the present embodiment, the second trenches 74*d* are located between the first trenches 74*g* and between the second trenches 74*i* in plan view in the semiconductor device in Embodiment 12. The second trenches 74*d* located between the above-mentioned first trenches 74 are located parallel to the first trenches 74 in plan view. The second trenches 74*b* are also located between the first trenches 74*f* and between the second trenches 74*h* in plan view. As a result, the channel width density is higher than that of the semiconductor device in Embodiment 12. As a result, the effect of reducing the channel resistance of the semiconductor device is further produced.

The second gate electrode 71*b* may not directly be connected to the second gate electrode 71*d*, the first gate electrode 71*g*, and the second gate electrode 71*i*. The second gate electrode 71*b* is only required to be electrically connected to the second gate electrode 71*d*, the first gate electrode 71*g*, and the second gate electrode 71*i*. A similar effect is produced in this case.

Embodiment 14

Figure 42:
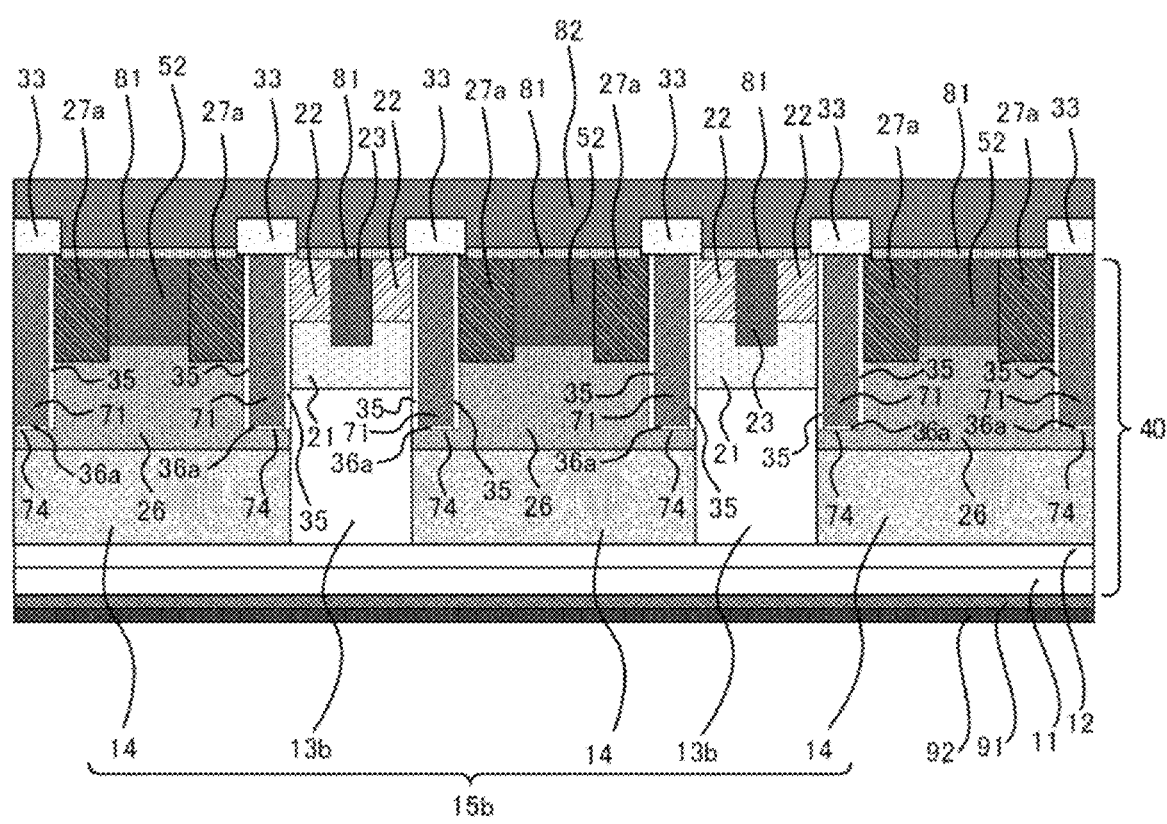
FIG. 42 is a cross-sectional view along the line P-P' of a semiconductor device in Embodiment 14 of the present invention.
Figure 43:
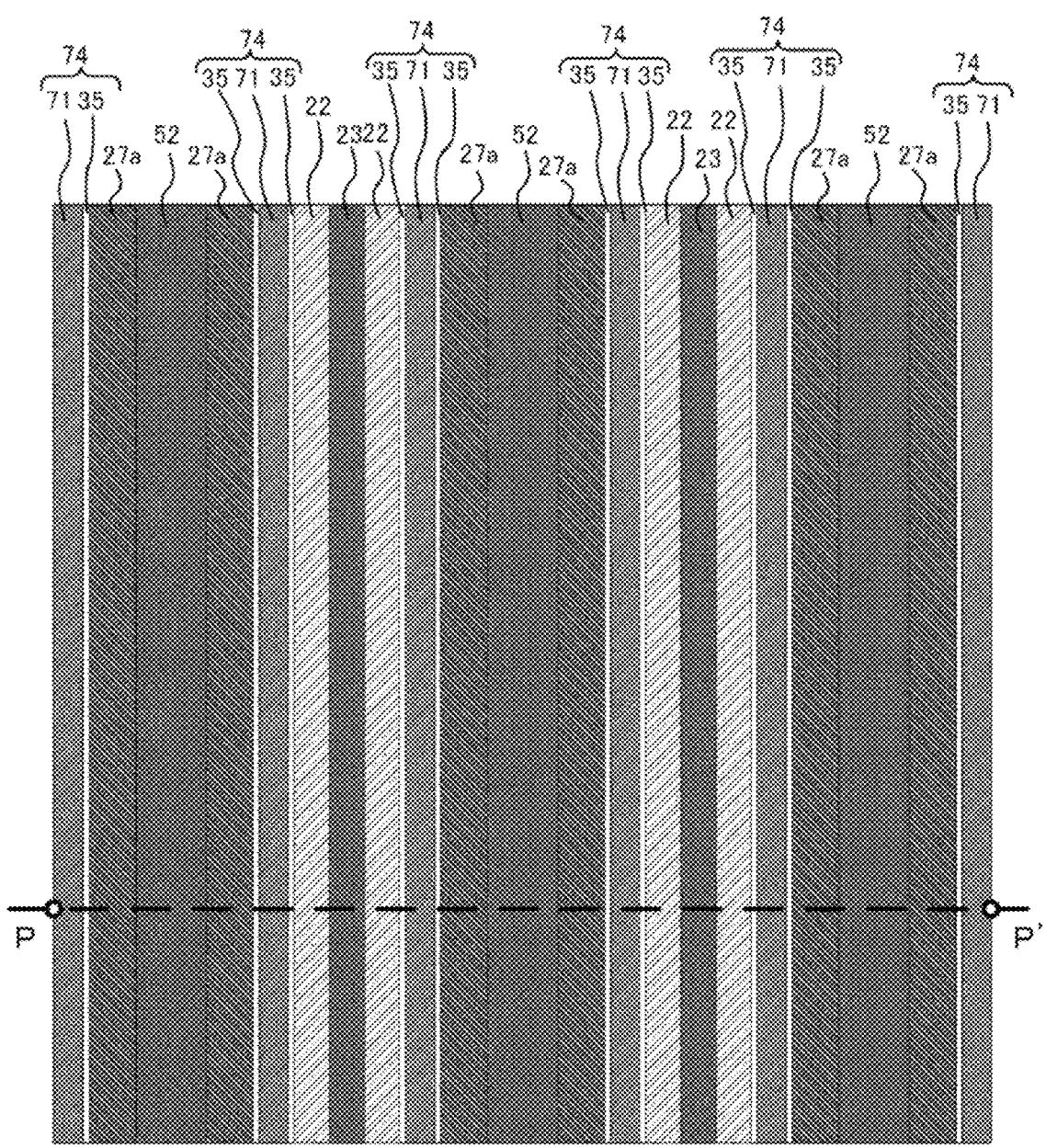
FIG. 43 is a plan view illustrating a top surface of a semiconductor region of the semiconductor device in Embodiment 14 of the present invention.

A configuration in the present embodiment will be described below with use of FIGS. 42 and 43. FIG. 42 is a cross-sectional view of a semiconductor device in the present embodiment along an auxiliary line P-P' of FIG. 43. FIG. 43 is a plan view illustrating a top surface of a semiconductor region of the semiconductor device in the present embodiment. The semiconductor device in the present embodiment has much in common with the semiconductor device in Embodiment 5, and only a difference from the semiconductor device in Embodiment 5 will be described.

As illustrated in FIG. 42, the semiconductor device in the present embodiment includes a super junction layer 15*b* in place of the super junction layer 15. The super junction layer 15*b* includes n-type pillar layers 13*b* in place of the n-type pillar layers 13. Each of the n-type pillar layers 13*b* has a smaller width than each of the p-type pillar layers 14. That is to say, spacing between the p-type pillar layers 14 is smaller than spacing between the n-type pillar layers.

A method of manufacturing the semiconductor device in the present embodiment will be described next. The method of manufacturing the semiconductor device in the present embodiment is similar to the method of manufacturing the semiconductor device in Embodiment 5 except that each of the n-type pillar layers 13*b* is formed to have a smaller width than each of the p-type pillar layers 14.

As described above, in the semiconductor device in the present embodiment, each of the n-type pillar layers 13*b* has a smaller width than each of the p-type pillar layers 14. That is to say, spacing between the p-type pillar layers 14 is smaller than spacing between the n-type pillar layers. Due to the smaller width of each of the n-type pillar layers 13*b*, the channel width density of the semiconductor device is higher. As a result, the effect of reducing the channel resistance of the semiconductor device is further produced.

In the semiconductor device in the present embodiment, the n-type pillar layers 13*b* may be formed in a grid in plan view, and the p-type pillar layers 14 may be formed in dots in regions closed by the n-type pillar layers 13*b* formed in a grid in plan view as in Embodiment 12 and Embodiment 13. Also in this case, the channel width density of the semiconductor device is higher due to the smaller width of each of the n-type pillar layers 13*b*. As a result, the effect of reducing the channel resistance of the semiconductor device similar to the effect produced in the present embodiment is produced.

Embodiment 15

A power converter in the present embodiment is a power converter to which the semiconductor device in any of Embodiments 1 to 14 described above has been applied. As for the power converter in the present embodiment, a case where the present invention has been applied to a three-phase inverter will be described.

Figure 44:
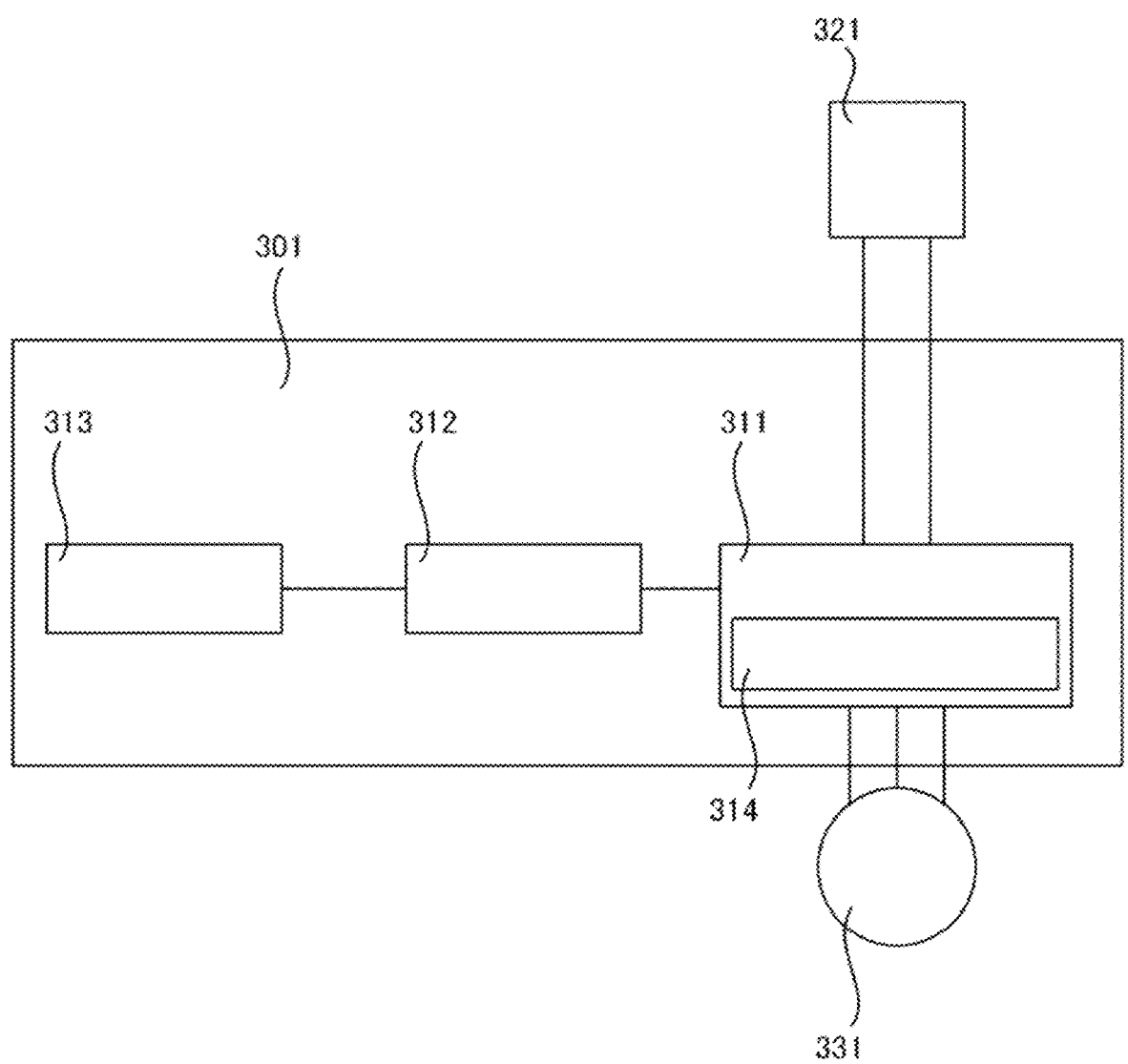
FIG. 44 is a functional block diagram of a power converter in Embodiment 15 of the present invention.

FIG. 44 is a functional block diagram showing a configuration of a power converter 301 to which the power converter in the present embodiment has been applied. A power supply 321 and a load 331 are connected to the power converter 301 shown in FIG. 44. The power supply 321 is, for example, a power supply converting a commercial AC power supply into a direct current using an AC/DC converter, and supplies DC power to the power converter 301.

The power converter 301 is a three-phase inverter connected between the power supply 321 and the load 331. The power converter 301 converts the DC power supplied from the power supply 321 into AC power, and supplies the AC power to the load 331. As shown in FIG. 44, the power converter 301 includes a main converter 311 to convert the DC power into the AC power, and output the AC power, a drive 312 to output drive signals for driving switching elements included in the main converter 311, and a controller 313 to output, to the drive 312, a control signal for controlling the drive 312. The load 331 is a three-phase motor driven by the AC power supplied from the power converter 301.

The main converter 311 receives the DC power supplied from the power supply 321 as input power. The main converter 311 includes the switching elements and freewheeling diodes. The main converter 311 converts the input power into the AC power through switching of the switching elements, and supplies the AC power to the load 331. There are various specific circuit configurations of the main converter 311. For example, the main converter 311 in the present embodiment is a two-level three-phase full-bridge circuit. The main converter 311 in the present embodiment can include six switching elements and six freewheeling diodes connected in anti-parallel to the respective switching elements.

Each of the switching elements of the main converter 311 is a semiconductor device 314 described in any of Embodiments 1 to 14. Every two series-connected switching elements of the six switching elements forms upper and lower arms, and respective upper and lower arms form a U phase, a V phase, and a W phase of the full-bridge circuit. Output terminals of the respective upper and lower arms, that is, three output terminals of the main converter 311 are connected to the load 331.

The drive 312 generates the drive signals for driving the switching elements of the main converter 311, and outputs the drive signals to control electrodes of the switching elements of the main converter 311. Specifically, the drive 312 outputs a drive signal for switching each of the switching elements to the on state and a drive signal for switching the switching element to the off state to a control electrode of the switching element in accordance with the control signal output from the controller 313.

The controller 313 controls the switching elements of the main converter 311 so that desired power is supplied to the load 331. Specifically, in a case where the main converter 311 is operated by pulse width modulation (PWM) control, for example, the controller 313 calculates a switching chart of the switching elements based on power to be supplied to the load 331, and outputs the control signal to achieve the switching chart to the drive 312. The drive 312 outputs an on signal or an off signal as the drive signal to the control electrode of each of the switching elements in accordance with the control signal.

The power converter in the present embodiment includes the semiconductor device in any of Embodiments 1 to 14 as each of the switching elements included in the main converter 311, so that an effect of achieving a power converter having low loss and allowing for fast switching operation is produced.

The power supply is described as the power supply converting the commercial AC power supply into the direct current using the AC/DC converter in the present embodiment, but may be a power supply of any other type. The power supply may be a commercial DC power supply, a solar cell, a storage battery, a rectifier circuit connected to an AC power supply, an output of the AC/DC converter, or an output of a DC/DC converter, for example.

The semiconductor substrate is described as the silicon carbide substrate 11 in the semiconductor device in each of Embodiments 1 to 14, but may not necessarily be a silicon carbide substrate, and may be made of silicon, diamond, and other wide bandgap semiconductors, compound semiconductors, and oxide semiconductors.

The first main surface of the silicon carbide substrate 11 is described to be inclined at 4° with respect to the (0001) plane in the [11-20] direction in the semiconductor device in each of Embodiments 1 to 14, but another crystalline plane, such as a (000-1) plane may be used, and another angle, such as an angle of 0° to 8°, may be used as the inclination angle. The polytype of silicon carbide is described as 4H, but may be another polytype, such as 3C and 6H.

The first conductivity type and the second conductivity type are respectively described as the n-type and the p-type in the semiconductor device in each of Embodiments 1 to 14, but the first conductivity type and the second conductivity type may respectively be the p-type and the n-type.

Al is taken as an example of the p-type impurity in the semiconductor device in each of Embodiments 1 to 14, but the p-type impurity may be other group III elements, such as boron (B) and gallium (Ga). N is taken as an example of the n-type impurity, but the n-type impurity may be other group V elements, such as phosphorus (P) and arsenic (As).

Ion implantation is used when the first well layer 21 is formed in the semiconductor device in each of Embodiments 1 to 14, but the first well layer 21 may be formed by a method of, after epitaxially growing the p-type semiconductor layer, implanting ions of the n-type impurity in a semiconductor region to be an n-type region other than the first well layer 21, for example. Any other semiconductor regions formed by ion implantation may be formed using epitaxial growth as long as it is accomplished as a manufacturing process.

Silicon dioxide is used as a material for the first side surface dielectric layer 35, the first bottom surface dielectric layer 36, the first bottom surface dielectric layer 36a, the second side surface dielectric layer 35b, the second bottom surface dielectric layer 36b, the third side surface dielectric layer 35c, the third bottom surface dielectric layer 36c, the second side surface dielectric layer 35d, the second bottom surface dielectric layer 36d, the fourth side surface dielectric layer 35e, the fourth bottom surface dielectric layer 36e, the first side surface dielectric layer 35f, the first bottom surface dielectric layer, which is not illustrated, in each of the first trenches 74f, the first side surface dielectric layer 35g, the first bottom surface dielectric layer 36g, the second side surface dielectric layer 35h, and the second bottom surface dielectric layer, which is not illustrated, in each of the second trenches 74i in the semiconductor device in each of Embodiments 1 to 14, but they may be thermal oxide films formed by thermal oxidation or may be deposited films formed by CVD. Dielectric layers made of a material other than silicon dioxide, such as silicon nitride dielectric layers, aluminum oxide dielectric layers, and high-dielectric constant dielectric layers, may be used.

Doped polysilicon is used as a material for the first gate electrode 71, the second gate electrode 71b, the third gate electrode 71c, the second gate electrode 71d, the fourth gate electrode 71e, the first gate electrode 71f, the first gate electrode 71g, the second gate electrode 71h, and the second gate electrode 71i in the semiconductor device in each of Embodiments 1 to 14, but a conductivity type thereof may be either the n-type or the p-type, and aluminum, an aluminum alloy, any other metals, metal silicide films, or a stack thereof may be used in place of doped polysilicon.

The source electrode 82 is made of aluminum in the semiconductor device in each of Embodiments 1 to 14, but may be made of other metals, alloys, or a stack thereof.

The first p+-type layers 23 and the second p+-type layers 52 are described to be formed in stripes in a case where the n-type pillar layers 13 and the p-type pillar layers 14 are formed in stripes in the semiconductor device in each of Embodiments 1 to 14, but may be formed in dots. At least any one portion of each of the first p+-type layers 23 and any one portion of each of the second p+-type layers 52 are only required to overlap the p-type semiconductor regions below them in plan view. In a case where portions being in contact with the p-type semiconductor regions below them are small, however, a problem such as an increase in switching loss and deterioration in reliability can occur.

The n-type pillar layers 13 or the n-type pillar layers 13b and the p-type pillar layers 14 are arranged in stripes in plan view in the semiconductor device in each of Embodiments 1 to 11 and 14. The n-type pillar layers 13 or the n-type pillar layers 13b and the p-type pillar layers 14, however, are required to be arranged in stripes in plan view only in the active region. In the termination region, the n-type pillar layers 13 or the n-type pillar layers 13b and the p-type pillar layers 14 are not required to be arranged in stripes in plan view.

The n-type pillar layers 13a are arranged in a grid in plan view, and the p-type pillar layers 14a are arranged in dots separated by the n-type pillar layers 13a in plan view in the semiconductor device in each of Embodiments 12 and 13. The n-type pillar layers 13*a* are required to be arranged in a grid in plan view, and the p-type pillar layers 14*a* are required to be arranged in dots separated by the n-type pillar layers 13*a* in plan view only in the active region. In the termination region, the n-type pillar layers 13*a* are not required to be arranged in a grid in plan view, and the p-type pillar layers 14*a* are not required to be arranged in dots separated by the n-type pillar layers 13*a* in plan view.

Dimensions, formation methods, heat treatment conditions, and the like of components of the semiconductor device in each of Embodiments 1 to 14 are described using specific examples, but are not limited to those presented, and can be changed as appropriate.

As long as a semiconductor device has the configuration of the semiconductor device in each of Embodiments 1 to 14, the effect of the present invention does not depend on the manufacturing method thereof, and a similar effect can be obtained in a case where the semiconductor device is manufactured by another manufacturing method.

A second-conductivity type region within each of the p-type pillar layers 14 and the p-type pillar layers 14*a* includes the second well layer 26 in the semiconductor device in each of Embodiments 2 to 14. The second well layer 26 may have the same concentration of the impurity of the second conductivity type as a region, other than the second well layer 26, of the second-conductivity type region within each of the p-type pillar layers 14 and the p-type pillar layers 14*a*. That is to say, the second well layer 26 may not be formed.

The present invention is not limited to Embodiments 1 to 15. Partial change, omission, and the like of the present invention can be made within the scope and spirit of the present invention.

INDUSTRIAL APPLICABILITY

The present invention is applicable to a power semiconductor device having a super junction structure.

The invention claimed is:

1. A semiconductor device including a semiconductor region having a first main surface and a second main surface opposite the first main surface, wherein
the semiconductor region includes:
alternating first pillar layers of a first conductivity type and second pillar layers of a second conductivity type along the first main surface;
a first well layer of the second conductivity type located within each of the first pillar layers at a top surface of the first pillar layer;
a first source layer of the first conductivity type located within the first well layer at a top surface of the first well layer;
a first side surface dielectric layer located on a side surface in a first trench located at each of boundaries between the first pillar layers and the second pillar layers, the first side surface dielectric layer being in contact with the first well layer and the first source layer;
a first bottom surface dielectric layer located on a bottom surface in the first trench, the first bottom surface dielectric layer being at least partially in contact with one of the second pillar layers; and
a first gate electrode located in the first trench, facing the first well layer and the first source layer through the first side surface dielectric layer, and facing the second pillar layer through the first bottom surface dielectric layer,
each of the second pillar layers includes a second source layer of the first conductivity type located within the second pillar layer at a top surface of the second pillar layer,
the first side surface dielectric layer is located on opposite side surfaces in the first trench, and is in contact with a second-conductivity type region within the second pillar layer and the second source layer,
the first bottom surface dielectric layer is in contact with the second-conductivity type region within the second pillar layer, and
a bottom surface of the second source layer is closer to the second main surface than a bottom surface of the first source layer is.

2. The semiconductor device according to claim 1, wherein
each of the second pillar layers includes a second well layer of the second conductivity type located within the second pillar layer at a top surface of the second pillar layer, and
the second source layer is located within the second well layer at a top surface of the second well layer.

3. The semiconductor device according to claim 1, wherein
the first bottom surface dielectric layer has a smaller thickness than the first side surface dielectric layer.

4. The semiconductor device according to claim 1, wherein
the first bottom surface dielectric layer is in contact with the second pillar layer and one of the first pillar layers.

5. The semiconductor device according to claim 1, further comprising:
a third side surface dielectric layer located on a side surface in a third trench located within each of the second pillar layers in a direction perpendicular to the first trench in plan view;
a third bottom surface dielectric layer located on a bottom surface of the third trench; and
a third gate electrode located in the third trench, and facing the second-conductivity type region within the second pillar layer and the second source layer through the third side surface dielectric layer.

6. The semiconductor device according to claim 5, wherein
the third gate electrode is connected to the first gate electrode.

7. The semiconductor device according to claim 1, further comprising:
a fourth side surface dielectric layer located on a side surface in a fourth trench located within each of the second pillar layers in a direction parallel to the first trench in plan view, opposite side surfaces of the fourth side surface dielectric layer being in contact with the second-conductivity type region within the second pillar layer and the second source layer;
a fourth bottom surface dielectric layer located on a bottom surface of the fourth trench; and
a fourth gate electrode located in the fourth trench, and facing the second-conductivity type region within the second pillar layer and the second source layer through the fourth side surface dielectric layer.

8. The semiconductor device according to claim 1, further comprising:

a second side surface dielectric layer located on a side surface in a second trench located within each of the first pillar layers;

a second bottom surface dielectric layer located on a bottom surface in the second trench; and a second gate electrode located in the second trench, and facing the first well layer and the first source layer through the second side surface dielectric layer.

9. The semiconductor device according to claim 8, wherein the second trench is located in a direction parallel to the first trench in plan view.

10. The semiconductor device according to claim 8, wherein the second gate electrode is connected to the first gate electrode.

11. The semiconductor device according to claim 9, wherein the second gate electrode is connected to the first gate electrode.

12. The semiconductor device according to claim 1, wherein in an active region, the first pillar layers and the second pillar layers are arranged in stripes in plan view.

13. The semiconductor device according to claim 1, wherein in an active region, the first pillar layers are arranged in a grid in plan view, and the second pillar layers are arranged in dots separated by the first pillar layers in plan view.

14. The semiconductor device according to claim 12, wherein spacing between the second pillar layers is smaller than spacing between the first pillar layers.

15. The semiconductor device according to claim 13, wherein spacing between the second pillar layers is smaller than spacing between the first pillar layers.

16. The semiconductor device according to claim 12, wherein spacing between the first pillar layers is constant, and spacing between the second pillar layers is constant.

17. The semiconductor device according to claim 13, wherein spacing between the first pillar layers is constant, and spacing between the second pillar layers is constant.

18. The semiconductor device according to claim 1, wherein the semiconductor region is made of silicon carbide.

19. A power converter comprising:

a main converter to convert input power using the semiconductor device according to claim 1 as a switching element;

a drive to output, to the semiconductor device, a drive signal for driving the semiconductor device; and a controller to output, to the drive, a control signal for controlling the drive.

* * * * *